(12) United States Patent
Hatakeyama et al.

(10) Patent No.: US 9,104,105 B2
(45) Date of Patent: Aug. 11, 2015

(54) PATTERNING PROCESS AND RESIST COMPOSITION

(71) Applicant: SHIN-ETSU CHEMICAL CO., LTD., Tokyo (JP)

(72) Inventors: Jun Hatakeyama, Joetsu (JP); Tomohiro Kobayashi, Joetsu (JP); Koji Hasegawa, Joetsu (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 0 days.

(21) Appl. No.: 14/268,428

(22) Filed: May 2, 2014

(65) Prior Publication Data

US 2014/0242518 A1  Aug. 28, 2014

Related U.S. Application Data

(62) Division of application No. 13/530,896, filed on Jun. 22, 2012, now Pat. No. 8,753,805.

(30) Foreign Application Priority Data

Jun. 22, 2011 (JP) .................. 2011-138344

(51) Int. Cl.
*G03F 7/038* (2006.01)
*G03F 1/32* (2012.01)
*G03F 7/004* (2006.01)
(Continued)

(52) U.S. Cl.
CPC ........ *G03F 7/038* (2013.01); *G03F 1/32* (2013.01); *G03F 7/0046* (2013.01); *G03F 7/0395* (2013.01); *G03F 7/0397* (2013.01); *G03F 7/11* (2013.01); *G03F 7/203* (2013.01);
(Continued)

(58) Field of Classification Search
CPC ........ G03F 7/0397; G03F 7/325; G03F 7/038
USPC ................ 430/270.1, 285.1, 281.1
See application file for complete search history.

(56) References Cited

U.S. PATENT DOCUMENTS

6,235,447 B1   5/2001  Lee et al.
7,537,880 B2   5/2009  Harada et al.
(Continued)

FOREIGN PATENT DOCUMENTS

JP   2002-351078 A   12/2002
JP       3790649 B2    6/2006
(Continued)

OTHER PUBLICATIONS

Nakao,Shuji et al., "0.12 μm Hole Pattern Formation by KrF Lithography for Giga Bit DRAM", IEEE, 1996, pp. 3.2.1-3.2.4.
(Continued)

*Primary Examiner* — Brittany Raymond
(74) *Attorney, Agent, or Firm* — Westerman, Hattori, Daniels & Adrian, LLP

(57) ABSTRACT

A negative pattern is formed by applying a resist composition onto a substrate, prebaking, exposing to high-energy radiation, baking (PEB), and developing the exposed resist film in an organic solvent developer to dissolve the unexposed region of resist film. The resist composition comprising a polymer comprising recurring units of cycloolefin having a hydroxyl group substituted with an acid labile group, an acid generator, and an organic solvent displays a high dissolution contrast and high etch resistance.

5 Claims, 13 Drawing Sheets

EXAMPLE 1-1

(51) Int. Cl.
    *G03F 7/039* (2006.01)
    *G03F 7/11* (2006.01)
    *G03F 7/20* (2006.01)
    *G03F 7/32* (2006.01)

(52) U.S. Cl.
    CPC .......... *G03F 7/2041* (2013.01); *G03F 7/325* (2013.01); *G03F 7/70466* (2013.01)

(56) References Cited

U.S. PATENT DOCUMENTS

| | | |
|---|---|---|
| 7,759,047 B2 | 7/2010 | Hatakeyama et al. |
| 7,771,913 B2 | 8/2010 | Kaneko et al. |
| 8,017,298 B2 | 9/2011 | Tsubaki |
| 8,071,272 B2 | 12/2011 | Tsubaki |
| 2002/0128408 A1 | 9/2002 | Goodall et al. |
| 2002/0177067 A1 | 11/2002 | Kim |
| 2005/0186501 A1* | 8/2005 | Kishimura et al. ........ 430/270.1 |
| 2006/0147836 A1* | 7/2006 | Hatakeyama et al. ..... 430/270.1 |
| 2007/0003867 A1 | 1/2007 | Hatakeyama et al. |
| 2008/0090172 A1 | 4/2008 | Hatakeyama et al. |
| 2008/0153030 A1 | 6/2008 | Kobayashi et al. |
| 2012/0058436 A1 | 3/2012 | Tsubaki et al. |

FOREIGN PATENT DOCUMENTS

| | | |
|---|---|---|
| JP | 2007-025634 A | 2/2007 |
| JP | 2007-297590 A | 11/2007 |
| JP | 2007-316448 A | 12/2007 |
| JP | 2008-003569 A | 1/2008 |
| JP | 2008-111103 A | 5/2008 |
| JP | 2008-122932 A | 5/2008 |
| JP | 2008-158339 A | 7/2008 |
| JP | 2008-241869 A | 10/2008 |
| JP | 2008-309878 A | 12/2008 |
| JP | 2008-309879 A | 12/2008 |
| JP | 2009-258586 A | 11/2009 |
| JP | 4554665 B2 | 9/2010 |
| JP | 2012-137698 A | 7/2012 |

OTHER PUBLICATIONS

Nakamura, Hiroko et al., "Contact Hole Formation by Multiple Exposure Technique in Ultra-low k1 Lithography", Proc. of SPIE, 2004, pp. 255-263, vol. 5377.

Owe-Yang, D.C. et al., "Double exposure for the contact layer of the 65-nm mode", Proc. of SPIE, 2005, pp. 171-180, vol. 5753.

Truffert, V. et al., "Ultimate contact hole resolution using immersion lithography with line/space imaging", Proc. of SPIE, 2009, pp. 72740N-1-72740N12, vol. 7274.

Taiwanese Office Action dated Dec. 30, 2013, issued in Taiwanese Patent Application No. 101121160 (10 pages).

Japanese Office Action dated Mar. 31, 2015, issued in corresponding JP Patent Application No. 2012-134378 (3 pages).

* cited by examiner

EXAMPLE 1-1

COMPARATIVE EXAMPLE 1-1

PATTERNING PROCESS AND RESIST COMPOSITION

CROSS-REFERENCE TO RELATED APPLICATION

This is a divisional application of U.S. patent application Ser. No. 13/530,896, filed on Jun. 22, 2012, which claims the benefit of priority from priority under 35 U.S.C. §119(a) on Patent Application No. 2011-138344 filed in Japan on Jun. 22, 2011, the entire contents of which are hereby incorporated by reference.

TECHNICAL FIELD

This invention relates to a pattern forming process involving exposure of resist film, deprotection reaction with the aid of acid and heat, and development in an organic solvent to form a negative tone pattern in which the unexposed region is dissolved and the exposed region is not dissolved. It also relates to a resist composition used therein.

BACKGROUND ART

In the recent drive for higher integration and operating speeds in LSI devices, the pattern rule is made drastically finer. The photolithography which is currently on widespread use in the art is approaching the essential limit of resolution determined by the wavelength of a light source. As the light source used in the lithography for resist pattern formation, g-line (436 nm) or i-line (365 nm) from a mercury lamp was widely used in 1980's. Reducing the wavelength of exposure light was believed effective as the means for further reducing the feature size. For the mass production process of 64 MB dynamic random access memories (DRAM, processing feature size 0.25 µm or less) in 1990's and later ones, the exposure light source of i-line (365 nm) was replaced by a KrF excimer laser having a shorter wavelength of 248 nm. However, for the fabrication of DRAM with a degree of integration of 256 MB and 1 GB or more requiring a finer patterning technology (processing feature size 0.2 µm or less), a shorter wavelength light source was required. Over a decade, photolithography using ArF excimer laser light (193 nm) has been under active investigation. It was expected at the initial that the ArF lithography would be applied to the fabrication of 180-nm node devices. However, the KrF excimer lithography survived to the mass-scale fabrication of 130-nm node devices. So, the full application of ArF lithography started from the 90-nm node. The ArF lithography combined with a lens having an increased numerical aperture (NA) of 0.9 is considered to comply with 65-nm node devices. For the next 45-nm node devices which required an advancement to reduce the wavelength of exposure light, the $F_2$ lithography of 157 nm wavelength became a candidate. However, for the reasons that the projection lens uses a large amount of expensive $CaF_2$ single crystal, the scanner thus becomes expensive, hard pellicles are introduced due to the extremely low durability of soft pellicles, the optical system must be accordingly altered, and the etch resistance of resist is low; the development of $F_2$ lithography was stopped and instead, the ArF immersion lithography was introduced.

In the ArF immersion lithography, the space between the projection lens and the wafer is filled with water having a refractive index of 1.44. The partial fill system is compliant with high-speed scanning and when combined with a lens having a NA of 1.3, enables mass production of 45-nm node devices.

One candidate for the 32-nm node lithography is lithography using extreme ultraviolet (EUV) radiation with wavelength 13.5 nm. The EUV lithography has many accumulative problems to be overcome, including increased laser output, increased sensitivity, increased resolution and minimized edge roughness of resist film, defect-free MoSi laminate mask, reduced aberration of reflection mirror, and the like.

Another candidate for the 32-nm node lithography is high refractive index liquid immersion lithography. The development of this technology was stopped because LUAG, a high refractive index lens candidate had a low transmittance and the refractive index of liquid did not reach the goal of 1.8.

The process that now draws attention under the above-discussed circumstances is a double patterning process involving a first set of exposure and development to form a first pattern and a second set of exposure and development to form a pattern between the first pattern features. A number of double patterning processes are proposed. One exemplary process involves a first set of exposure and development to form a photoresist pattern having lines and spaces at intervals of 1:3, processing the underlying layer of hard mask by dry etching, applying another layer of hard mask thereon, a second set of exposure and development of a photoresist film to form a line pattern in the spaces of the first exposure, and processing the hard mask by dry etching, thereby forming a line-and-space pattern at a half pitch of the first pattern. An alternative process involves a first set of exposure and development to form a photoresist pattern having spaces and lines at intervals of 1:3, processing the underlying layer of hard mask by dry etching, applying a photoresist layer thereon, a second set of exposure and development to form a second space pattern on the remaining hard mask portion, and processing the hard mask by dry etching. In either process, the hard mask is processed by two dry etchings.

As compared with the line pattern, the hole pattern is difficult to reduce the feature size. In order for the prior art method to form fine holes, an attempt is made to form fine holes by under-exposure of a positive resist film combined with a hole pattern mask. This, however, results in the exposure margin being extremely narrowed. It is then proposed to form holes of greater size, followed by thermal flow or RELACS® method to shrink the holes as developed. However, there is a problem that control accuracy becomes lower as the pattern size after development and the size after shrinkage differ greater and the quantity of shrinkage is greater. With the hole shrinking method, the hole size can be shrunk, but the pitch cannot be narrowed.

It is then proposed in Non-Patent Document 1 that a pattern of X-direction lines is formed in a positive resist film using dipole illumination, the resist pattern is cured, another resist material is coated thereon, and a pattern of Y-direction lines is formed in the other resist film using dipole illumination, leaving a grid line pattern, spaces of which provide a hole pattern. Although a hole pattern can be formed at a wide margin by combining X and Y lines and using dipole illumination featuring a high contrast, it is difficult to etch vertically staged line patterns at a high dimensional accuracy. It is proposed in Non-Patent Document 2 to form a hole pattern by exposure of a negative resist film through a Levenson phase shift mask of X-direction lines combined with a Levenson phase shift mask of Y-direction lines. However, the crosslinking negative resist film has the drawback that the resolving power is low as compared with the positive resist film, because the maximum resolution of ultrafine holes is determined by the bridge margin.

A hole pattern resulting from a combination of two exposures of X- and Y-direction lines and subsequent image reversal into a negative pattern can be formed using a high-contrast line pattern of light. Thus holes having a narrow pitch and fine size can be opened as compared with the prior art.

Non-Patent Document 3 reports three methods for forming hole patterns via image reversal. The three methods are: method (1) involving subjecting a positive resist composition to two double-dipole exposures of X and Y lines to form a dot pattern, depositing a $SiO_2$ film thereon by LPCVD, and effecting $O_2$-RIE for reversal of dots into holes; method (2) involving forming a dot pattern by the same steps as in (1), but using a resist composition designed to turn alkali-soluble and solvent-insoluble upon heating, coating a phenol-base overcoat film thereon, effecting alkaline development for image reversal to form a hole pattern; and method (3) involving double dipole exposure of a positive resist composition and organic solvent development for image reversal to form holes.

The organic solvent development to form a negative pattern is a traditional technique. A resist composition comprising cyclized rubber is developed using an alkene such as xylene as the developer. An early chemically amplified resist composition comprising poly(tert-butoxycarbonyloxy-styrene) is developed with anisole as the developer to form a negative pattern.

Recently a highlight is put on the organic solvent development again. It would be desirable if a very fine hole pattern, which is not achievable with the positive tone, is resolvable through negative tone exposure. To this end, a positive resist composition featuring a high resolution is subjected to organic solvent development to form a negative pattern. An attempt to double a resolution by combining two developments, alkaline development and organic solvent development is under study.

As the ArF resist composition for negative tone development with organic solvent, positive ArF resist compositions of the prior art design may be used. Such pattern forming processes are described in Patent Documents 1 and 2. The resist pattern resulting from negative tone development has low etch resistance because the cyclic protective group has been deprotected. Particularly in the case of polymethacrylate based resist, which contains most of cyclic portions as the protective group, the resist film left after deprotection of the protective group suffers a serious loss of etch resistance. Patent Document 2 describes a process of forming a negative pattern from a resist film which is based on polynorbornene and adapted to turn alkali soluble under the action of acid, through organic solvent development. In this case, the loss of etch resistance is minimized since the main chain retains the cyclic structure even after the protective group has been deprotected. However, there is still left a problem that the dissolution contrast during negative development is low and hence, the resolution is low, because the solubility of polycycloolefin based resin in organic solvent is low.

Further, Patent Document 3 discloses a process for forming a pattern through organic solvent development in which a protective film is applied onto a resist film. Patent Document 4 discloses a topcoatless process for forming a pattern through organic solvent development in which an additive is added to a resist composition so that the additive may segregate at the resist film surface after spin coating to provide the surface with improved water repellency.

CITATION LIST

Patent Document 1: JP 4554665
Patent Document 2: JP-A 2009-258586
Patent Document 3: JP-A 2008-309878
Patent Document 4: JP-A 2008-309879
Non-Patent Document 1: Proc. SPIE Vol. 5377, p. 255 (2004)
Non-Patent Document 2: IEEE IEDM Tech. Digest 61 (1996)
Non-Patent Document 3: Proc. SPIE Vol. 7274, p. 72740N (2009)

DISCLOSURE OF INVENTION

As compared with the positive resist system which becomes dissolvable in alkaline developer as a result of acidic carboxyl or analogous groups generating through deprotection reaction, the organic solvent development provides a low dissolution contrast. The alkaline developer provides an alkaline dissolution rate that differs by a factor of 1,000 or more between the unexposed and exposed regions whereas the organic solvent development provides a dissolution rate difference of only about 10 times. While Patent Documents 1 and 2 describe conventional photoresist compositions of the alkaline aqueous solution development type, there is a demand for a novel material which can offer a significant dissolution contrast upon organic solvent development.

When holes are formed by negative development, regions surrounding the holes receive light so that excess acid is generated therein. It is then important to control acid diffusion because the holes are not opened if the acid diffuses inside the holes.

If the acid in the exposed region evaporates during PEB and deposits on the unexposed region, the positive pattern following alkaline development suffers from such drawbacks as rounded top of its profile and film thickness loss. An inverse phenomenon occurs on negative development with organic solvent, that is, holes are not opened or the opening size of holes at the top is reduced.

Coverage of a photoresist film with a protective film is effective for preventing evaporation of acid during PEB and for avoiding any hole opening failure following negative development, but still insufficient. The problem of hole opening failure following negative development is serious if a resist film is not covered with a protective film.

A resist based on a polymer of methacrylate units substituted with an acid labile group exhibits a high dissolution contrast during negative development with organic solvent, but suffers from the problem of low etch resistance of the film after development as discussed above. A resist based on a polymer of cycloolefin units having a carboxyl group substituted with an acid labile group exhibits high etch resistance, but suffers from the problem of low dissolution contrast upon organic solvent development.

An object of the invention is to provide a resist composition which has an enhanced dissolution contrast upon organic solvent development and high etch resistance. Another object is to provide a pattern forming process involving exposure and organic solvent development to form a hole pattern.

The inventors have found that by using a polymer comprising recurring units of cycloolefin having a hydroxyl group substituted with an acid labile group, the dissolution contrast during organic solvent development is improved, and a hole pattern resulting from positive/negative reversal is improved in sensitivity, resolution, dimensional uniformity, and etch resistance.

One embodiment of the invention is a pattern forming process comprising the steps of applying a resist composition onto a substrate, the resist composition comprising a polymer comprising recurring units of cycloolefin having a hydroxyl group substituted with an acid labile group, an acid generator, and an organic solvent or comprising a polymer comprising recurring units of cycloolefin having a hydroxyl group substituted with an acid labile group and recurring units having a sulfonium salt, and an organic solvent; prebaking the composition to form a resist film; exposing the resist film to high-energy radiation; baking; and developing the exposed film in an organic solvent-based developer to form a negative pattern wherein the unexposed region of film is dissolved away and the exposed region of film is not dissolved.

In a preferred embodiment, the polymer comprising recurring units of cycloolefin having a hydroxyl group substituted with an acid labile group has recurring units (a1) and/or (a2) represented by the general formula (1).

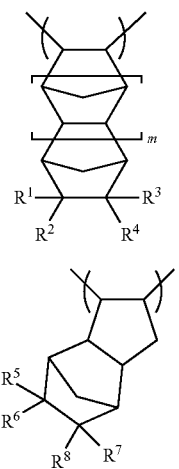

Herein $R^1$ to $R^4$ and $R^5$ to $R^8$ are each independently hydrogen, cyano group, straight, branched or cyclic $C_1$-$C_6$ alkyl group, alkoxycarbonyl group, or ether or lactone ring-bearing group, at least one of $R^1$ to $R^4$ and $R^5$ to $R^8$ has an acid labile group-substituted hydroxyl group, m is 0 or 1, the subscripts a1 and a2 are numbers in the range: $0 \leq a1 < 1.0$, $0 \leq a2 < 1.0$, and $0 < a1+a2 < 1.0$.

In a more preferred embodiment, the polymer comprising recurring units (a1) and/or (a2) further comprises recurring units (b) derived from a monomer having an adhesive group selected from among hydroxyl, cyano, carbonyl, ester, ether, sulfonic acid ester, lactone ring, carboxyl, carboxylic anhydride, carbonate, maleimide, and sulfonamide groups.

In a preferred embodiment, the polymer comprising recurring units (a1) and/or (a2) further comprises recurring units (c1) having a carboxyl group substituted with an acid labile group, represented by the following general formula, and/or recurring units (c2) having a hydroxyl group substituted with an acid labile group, other than the recurring units (a1) and (a2).

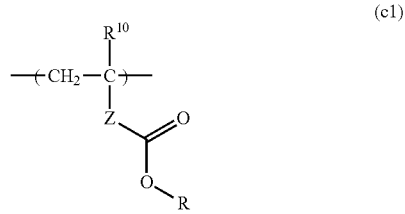

Herein $R^{10}$ is hydrogen or methyl, R is an acid labile group, Z is a single bond or —C(=O)—O—$R^{11}$—, and $R^{11}$ is a straight, branched or cyclic $C_1$-$C_{10}$ alkylene group which may have an ether, ester, lactone ring, or hydroxyl radical, or naphthylene group.

In a preferred embodiment, the acid generator comprises both an acid generator capable of generating a sulfonic acid fluorinated at alpha-position, imide acid or methide acid, and a sulfonate of a sulfonic acid non-fluorinated at alpha-position or an optionally fluorinated carboxylic acid.

Preferably, the developer comprises at least one organic solvent selected from among 2-octanone, 2-nonanone, 2-heptanone, 3-heptanone, 4-heptanone, 2-hexanone, 3-hexanone, diisobutyl ketone, methylcyclohexanone, acetophenone, methylacetophenone, propyl acetate, butyl acetate, isobutyl acetate, amyl acetate, isoamyl acetate, butenyl acetate, phenyl acetate, propyl formate, butyl formate, isobutyl formate, amyl formate, isoamyl formate, methyl valerate, methyl pentenoate, methyl crotonate, ethyl crotonate, methyl lactate, ethyl lactate, propyl lactate, butyl lactate, isobutyl lactate, amyl lactate, isoamyl lactate, methyl 2-hydroxyisobutyrate, ethyl 2-hydroxyisobutyrate, methyl benzoate, ethyl benzoate, benzyl acetate, methyl phenylacetate, benzyl formate, phenylethyl formate, methyl 3-phenylpropionate, benzyl propionate, ethyl phenylacetate, and 2-phenylethyl acetate.

In a preferred embodiment, the step of exposing the resist film to high-energy radiation includes ArF excimer laser lithography of 193 nm wavelength, EUV lithography of 13.5 nm wavelength or EB lithography.

In a preferred embodiment, the ArF lithography of 193 nm wavelength uses a halftone phase shift mask bearing a dot shifter pattern, whereby a pattern of holes is formed at the dots after development. In another preferred embodiment, the exposure step uses halftone phase shift masks and includes two exposures of two intersecting sets of lines, whereby a pattern of holes is formed at the intersections between lines after development. In a further preferred embodiment, the exposure step uses a halftone phase shift mask bearing lattice-like shifter gratings, whereby a pattern of holes is formed at the intersections of gratings after development. Typically, the halftone phase shift mask bearing a dot pattern, intersecting lines or lattice-like pattern has a transmittance of 3 to 15%.

In a preferred embodiment, the phase shift mask used is a phase shift mask including a lattice-like first shifter having a line width equal to or less than a half pitch and a second shifter arrayed on the first shifter and consisting of lines whose on-wafer size is 2 to 30 nm thicker than the line width of the first shifter, whereby a pattern of holes is formed only where the thick shifter is arrayed.

In a preferred embodiment, the phase shift mask used is a phase shift mask including a lattice-like first shifter having a line width equal to or less than a half pitch and a second shifter arrayed on the first shifter and consisting of dots whose on-wafer size is 2 to 100 nm thicker than the line width of the first shifter, whereby a pattern of holes is formed only where the thick shifter is arrayed.

Another embodiment of the invention is a pattern forming process comprising the steps of applying a resist composition onto a substrate, the resist composition comprising a polymer comprising recurring units of cycloolefin having a hydroxyl group substituted with an acid labile group, an acid generator, and an organic solvent or comprising a polymer comprising recurring units of cycloolefin having a hydroxyl group substituted with an acid labile group and recurring units having a sulfonium salt, and an organic solvent; prebaking the composition to form a resist film; forming a protective film on the resist film; exposing the resist film to high-energy radiation; baking; and applying an organic solvent-based developer to dissolve away the protective film and the unexposed region of the resist film for forming a negative pattern wherein the exposed region of film is not dissolved.

In a preferred embodiment, the protective film is formed of a composition comprising a polymer bearing a 1,1,1,3,3,3-hexafluoro-2-propanol residue and an amino group or amine salt-containing compound, or a composition comprising a polymer bearing a 1,1,1,3,3,3-hexafluoro-2-propanol residue and having amino group or amine salt-containing recurring units copolymerized, the composition further comprising an alcohol solvent of at least 4 carbon atoms, an ether solvent of 8 to 12 carbon atoms, or a mixture thereof.

In another aspect, the invention provides a negative pattern-forming resist composition comprising a polymer, an acid generator, and an organic solvent. The polymer comprises recurring units (a1) and/or (a2) having a hydroxyl group substituted with an acid labile group, represented by the general formula (1):

(1)

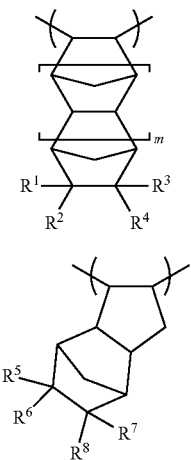

wherein $R^1$ to $R^4$ and $R^5$ to $R^8$ are each independently hydrogen, cyano group, straight, branched or cyclic $C_1$-$C_6$ alkyl group, alkoxycarbonyl group, or ether or lactone ring-bearing group, at least one of $R^1$ to $R^4$ and $R^5$ to $R^8$ has an acid labile group-substituted hydroxyl group, m is 0 or 1, the subscripts a1 and a2 are numbers in the range: $0 \leq a1 < 1.0$, $0 \leq a2 < 1.0$, and $0 < a1+a2 < 1.0$. At the same time, the polymer is dissolvable in a developer selected from among 2-octanone, 2-nonanone, 2-heptanone, 3-heptanone, 4-heptanone, 2-hexanone, 3-hexanone, diisobutyl ketone, methylcyclohexanone, acetophenone, methylacetophenone, propyl acetate, butyl acetate, isobutyl acetate, amyl acetate, isoamyl acetate, butenyl acetate, phenyl acetate, propyl formate, butyl formate, isobutyl formate, amyl formate, isoamyl formate, methyl valerate, methyl pentenoate, methyl crotonate, ethyl crotonate, methyl lactate, ethyl lactate, propyl lactate, butyl lactate, isobutyl lactate, amyl lactate, isoamyl lactate, methyl 2-hydroxyisobutyrate, ethyl 2-hydroxyisobutyrate, methyl benzoate, ethyl benzoate, benzyl acetate, methyl phenylacetate, benzyl formate, phenylethyl formate, methyl 3-phenylpropionate, benzyl propionate, ethyl phenylacetate, and 2-phenylethyl acetate.

In a preferred embodiment, the polymer comprising recurring units (a1) and/or (a2) further comprises recurring units (b) derived from a monomer having an adhesive group selected from the class consisting of hydroxyl, cyano, carbonyl, ester, ether, sulfonic acid ester, lactone ring, carboxyl, carboxylic anhydride, carbonate, maleimide, and sulfonamide groups In a preferred embodiment, the polymer comprising recurring units (a1) and/or (a2) further comprises recurring units (c1) having a carboxyl group substituted with an acid labile group, represented by the following general formula, and/or recurring units (c2) having a hydroxyl group substituted with an acid labile group, other than the recurring units (a1) and (a2).

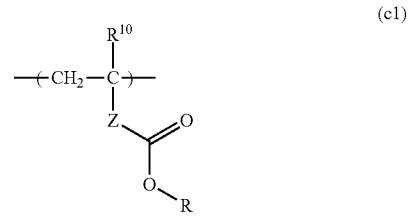

Herein $R^{10}$ is hydrogen or methyl, R is an acid labile group, Z is a single bond or $-C(=O)-O-R^{11}-$, and $R^{11}$ is a straight, branched or cyclic $C_1$-$C_{10}$ alkylene group which may have an ether, ester, lactone ring, or hydroxyl radical, or naphthylene group.

In a preferred embodiment, the acid generator comprises both an acid generator capable of generating a sulfonic acid fluorinated at alpha-position, imide acid or methide acid, and a sulfonate of a sulfonic acid non-fluorinated at alpha-position or an optionally fluorinated carboxylic acid.

ADVANTAGEOUS EFFECTS OF INVENTION

In the process of image formation via positive/negative reversal by organic solvent development, a photoresist film comprising a polymer comprising recurring units of cycloolefin having a hydroxyl group substituted with an acid labile group is characterized by a high dissolution contrast between the unexposed region of promoted dissolution and the exposed region of inhibited dissolution and high etch resistance. By subjecting this photoresist film to exposure through a lattice-like pattern mask and organic solvent development, a fine hole pattern can be formed at a high sensitivity and a high precision of dimensional control.

BRIEF DESCRIPTION OF DRAWINGS

FIG. 1 is a cross-sectional view of a patterning process according one embodiment of the invention.

DESCRIPTION OF EMBODIMENTS

Figure 1A:
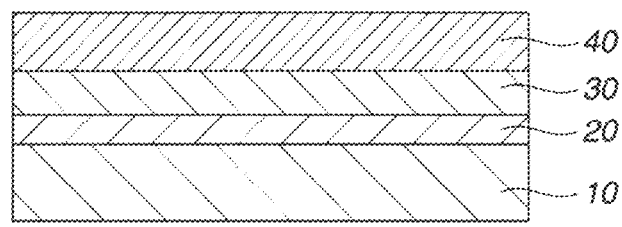
FIG. 1A shows a photoresist film disposed on a substrate.

The terms "a" and "an" herein do not denote a limitation of quantity, but rather denote the presence of at least one of the referenced item. As used herein, the notation ($C_n$-$C_m$) means a group containing from n to m carbon atoms per group. As used herein, the term "film" is used interchangeably with "coating" or "layer." The term "processable layer" is interchangeable with patternable layer and refers to a layer that can be processed such as by etching to form a pattern therein.

The abbreviations and acronyms have the following meaning.

Mw: weight average molecular weight
Mn: number average molecular weight
Mw/Mn: molecular weight distribution or dispersity
GPC: gel permeation chromatography
PEB: post-exposure bake
PAG: photoacid generator Briefly stated, the invention pertains to a pattern forming process utilizing positive/negative reversal and comprising the steps of applying a resist composition based on a polymer comprising recurring units of cycloolefin having a hydroxyl group substituted with an acid labile group onto a substrate, prebaking to remove the unnecessary solvent and form a resist film, exposing the resist film to high-energy radiation, PEB, and developing in an organic solvent developer to form a negative pattern. The invention also pertains to a resist composition.

In general, as compared with carboxyl-containing polymers, hydroxyl-containing polymers are less soluble in organic solvents. As compared with polymers that generate carboxyl groups during acid-aided elimination reaction, polymers that generate hydroxyl groups have a lower solubility in organic solvent after deprotection and thus leave more pattern film. In addition, since the present polymer becomes undissolvable in the developer even after a less extent of deprotection, it provides a higher sensitivity than the polymers having carboxyl groups substituted with acid labile groups. Although no or little studies have been made on the polymers that generate hydroxyl groups upon deprotection because they do not dissolve in alkali, the inventors have found that the hydroxyl group is an optimum umpolung (or polarity-inversion) group in the case of organic solvent development. A polymer obtained from polymerization of cycloolefin is characterized in that it retains high etch resistance even after negative development resulting in a film with the protective group deprotected.

Typically the recurring units of cycloolefin having a hydroxyl group substituted with an acid labile group are recurring units (a1) and/or (a2) represented by the general formula (1).

(1)

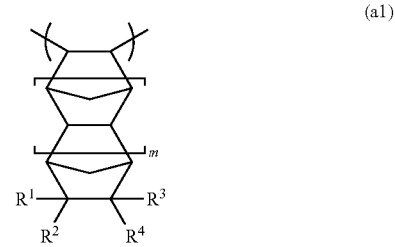
(a1)

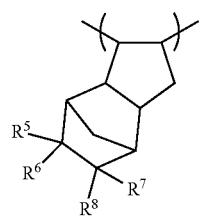
(a2)

Herein $R^1$ to $R^4$ and $R^5$ to $R^8$ are each independently hydrogen, cyano group, straight, branched or cyclic $C_1$-$C_6$ alkyl group, alkoxycarbonyl group, or ether or lactone ring-bearing group, at least one of $R^1$ to $R^4$ and $R^5$ to $R^8$ has an acid labile group-substituted hydroxyl group, m is 0 or 1, the subscripts a1 and a2 are numbers in the range: $0 \leq a1 < 1.0$, $0 \leq a2 < 1.0$, and $0 < a1+a2 < 1.0$.

Examples of recurring units (a1) and (a2) are shown below wherein R is an acid labile group.
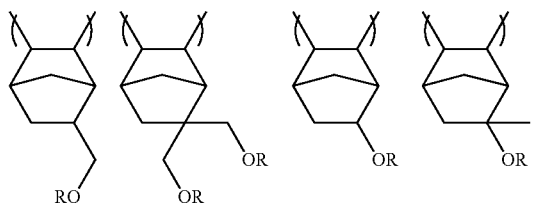
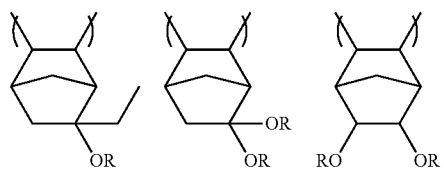
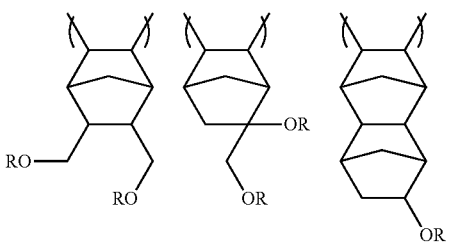
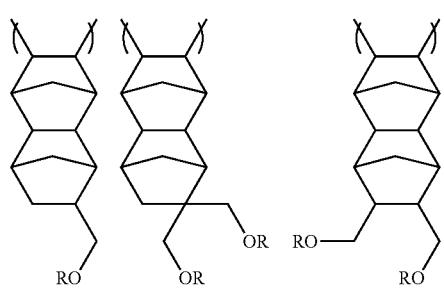
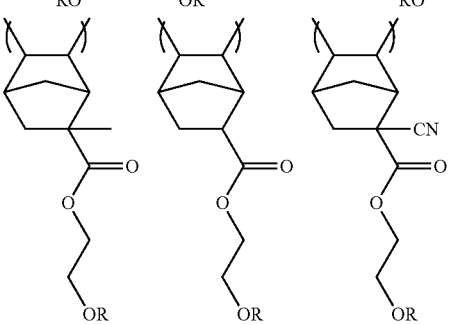
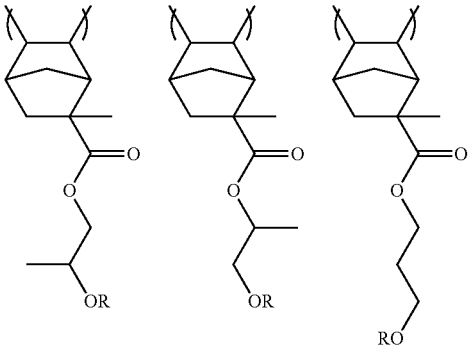
-continued
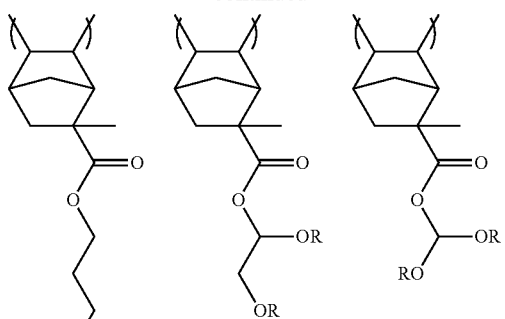
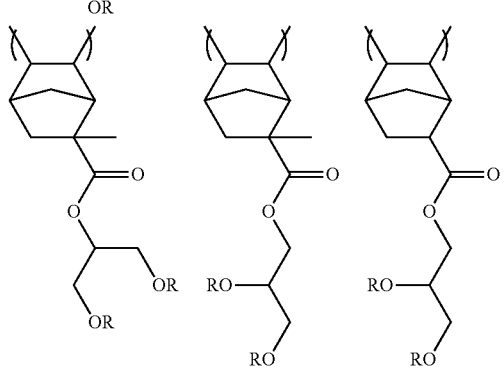
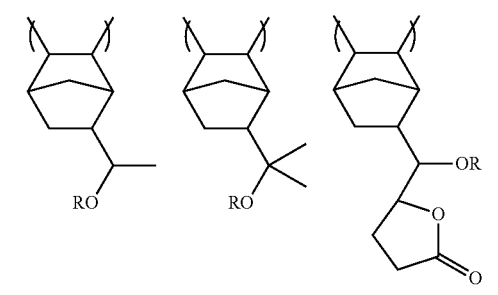
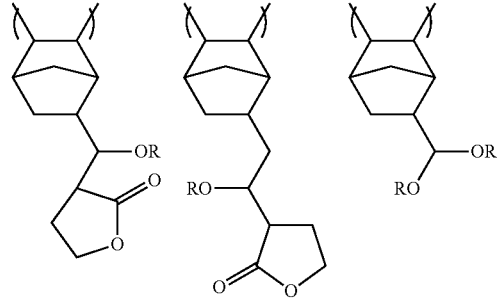
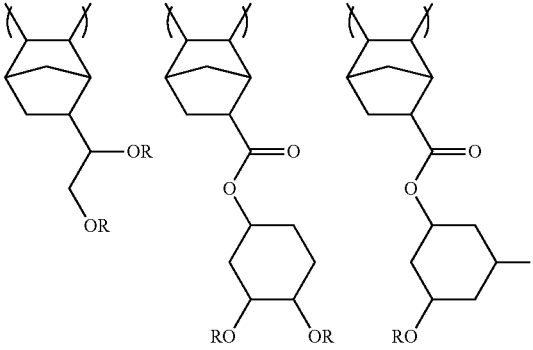

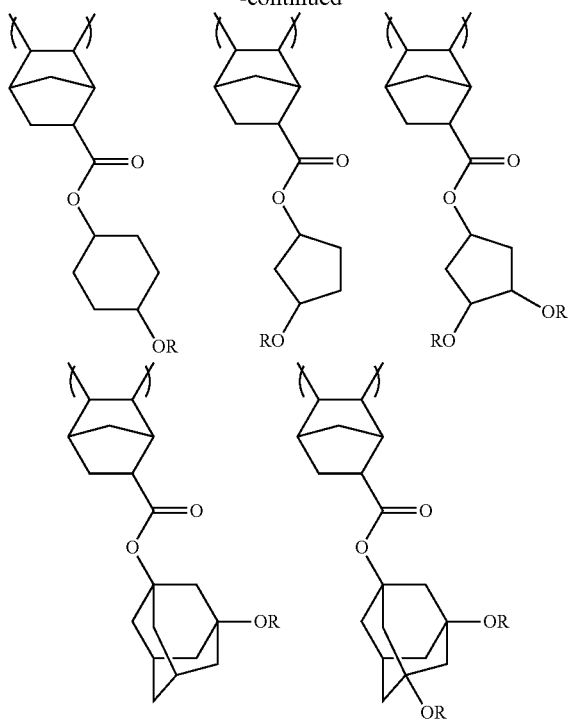
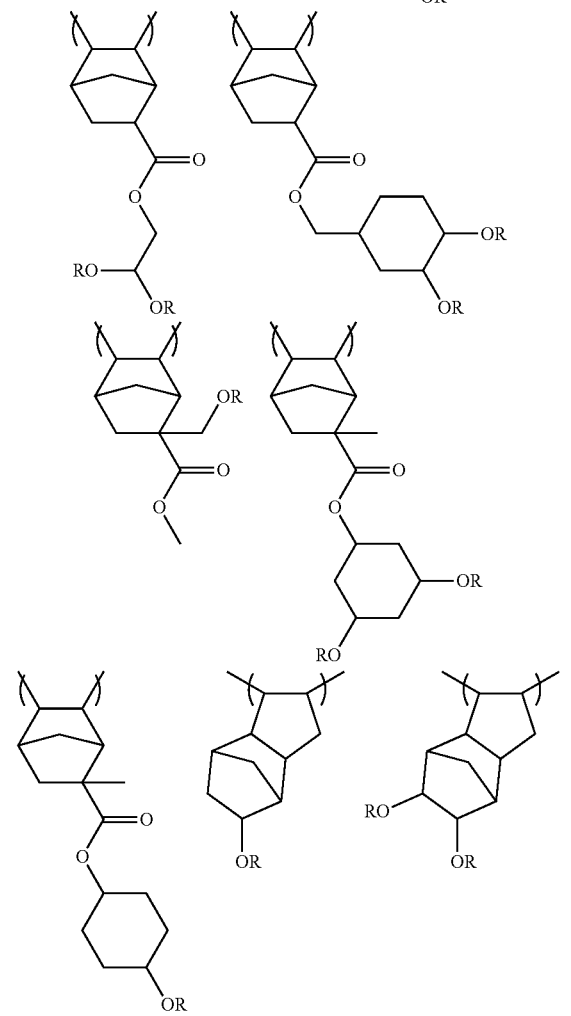

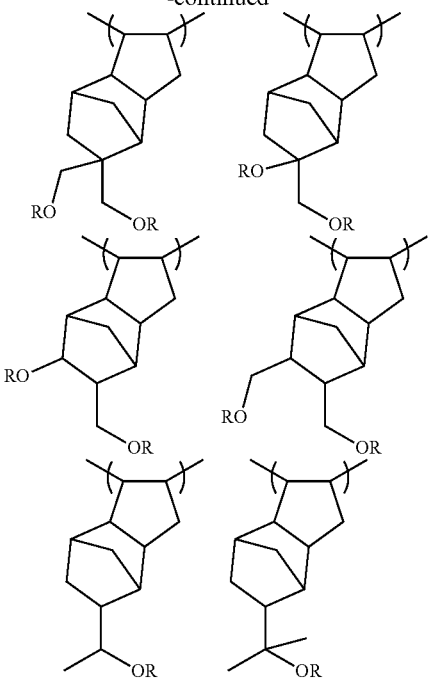

While the polymer should comprise recurring units (a1) and/or (a2) of cycloolefin having a hydroxyl group substituted with an acid labile group, it may further comprise recurring units (b) derived from a monomer having an adhesive group selected from among hydroxyl, cyano, carbonyl, ester, ether, sulfonic acid ester, lactone ring, carboxyl, carboxylic anhydride, carbonate, maleimide, and sulfonamide groups. Examples of recurring units (b) are shown below.

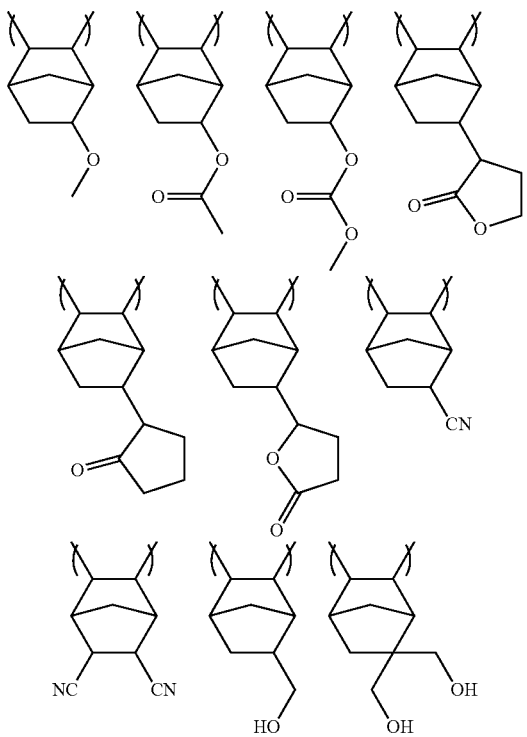

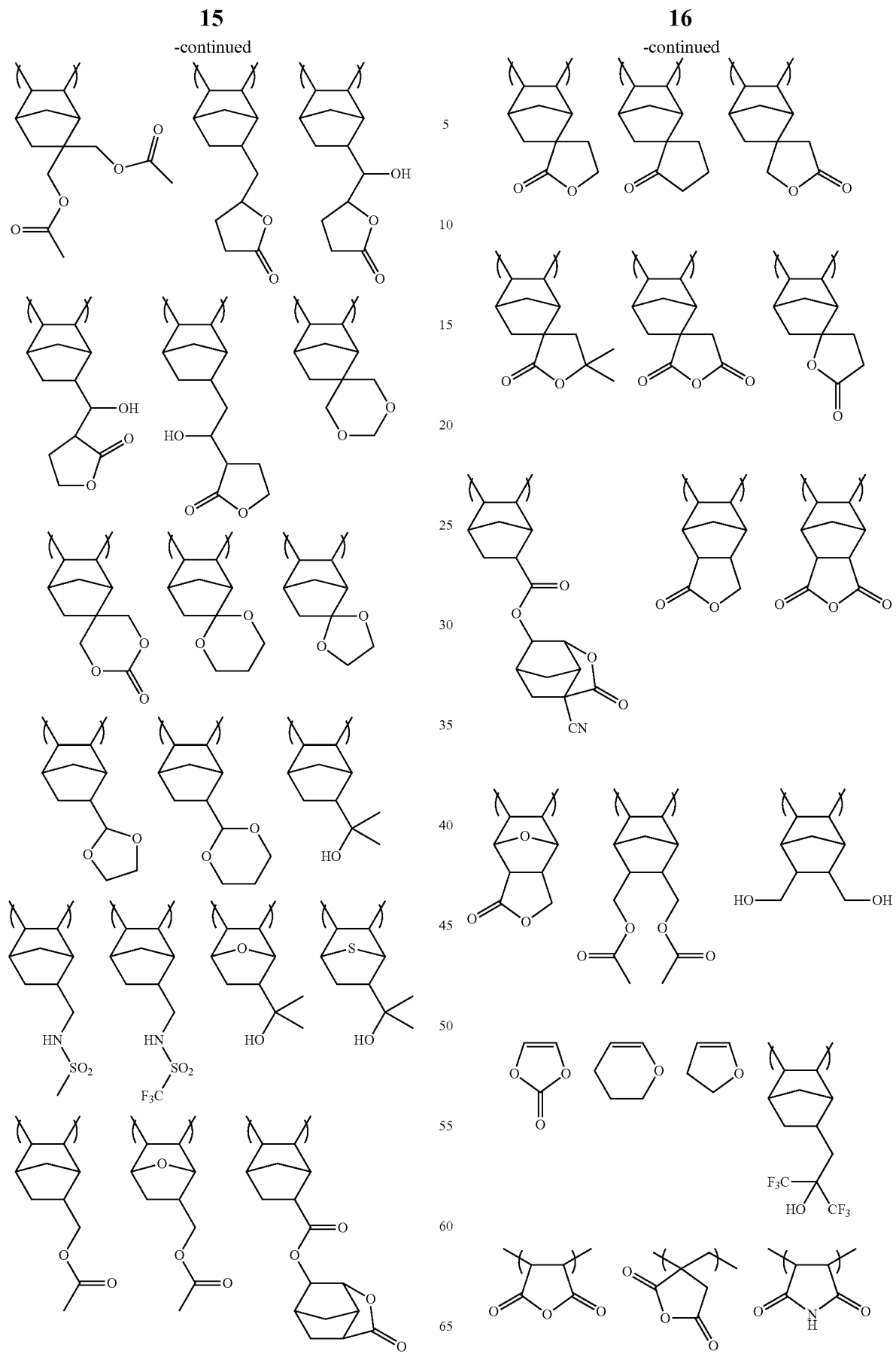

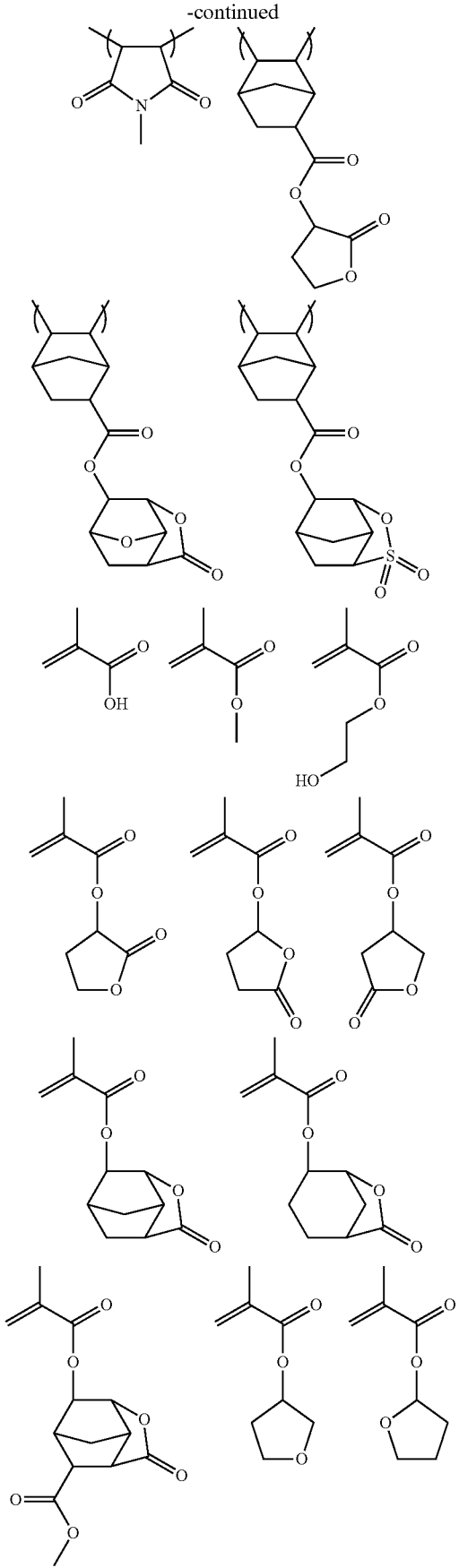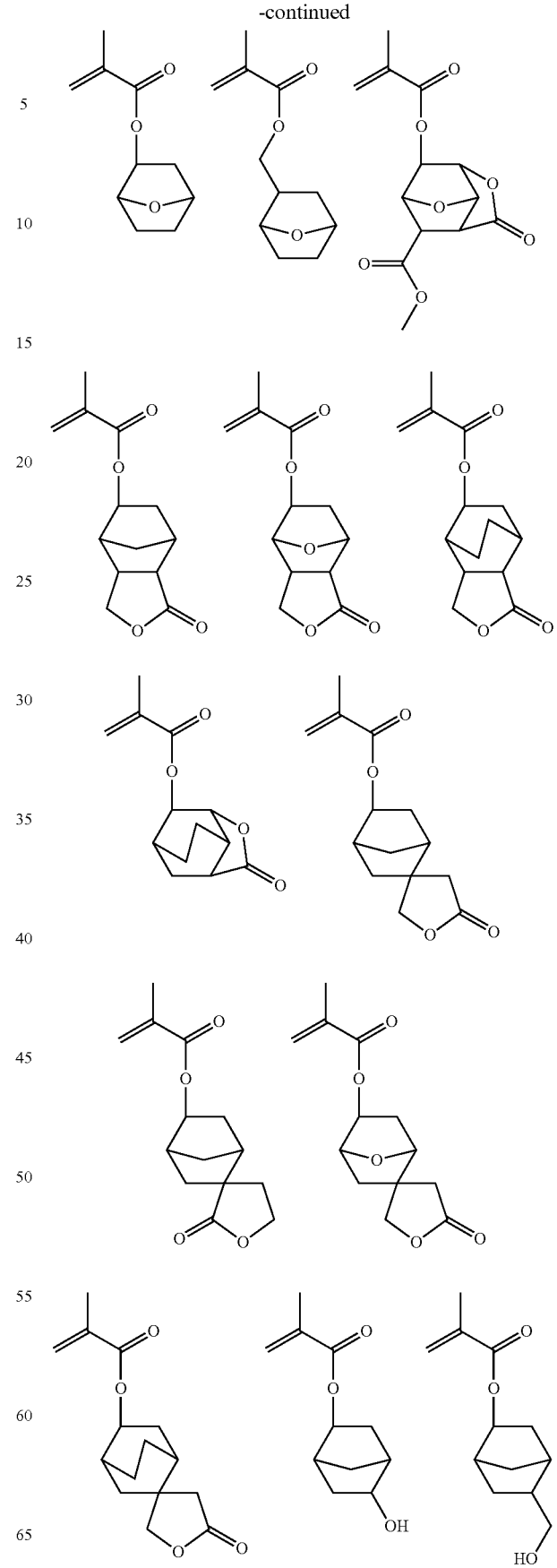

-continued
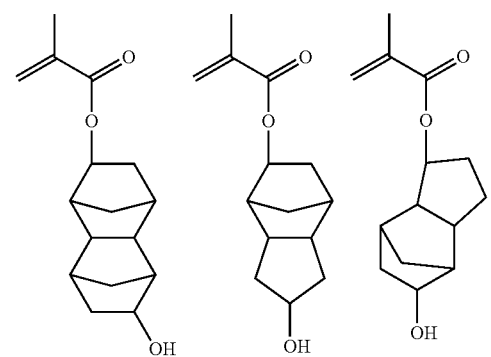
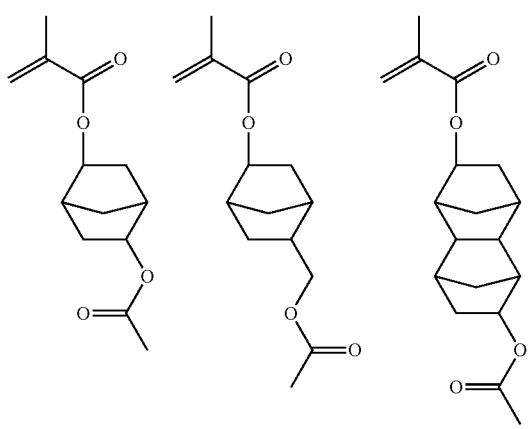
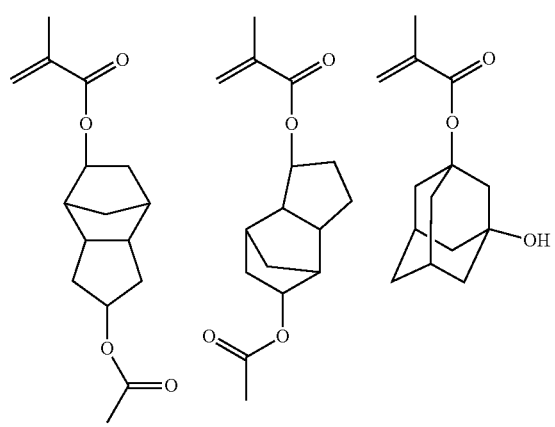
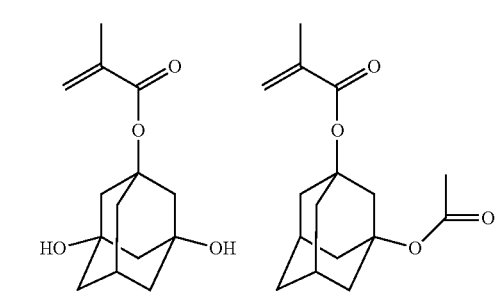
-continued
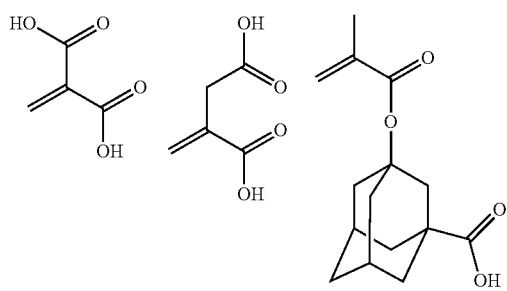
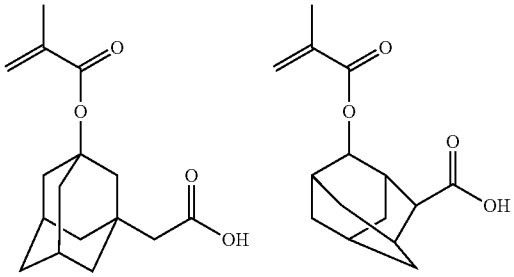
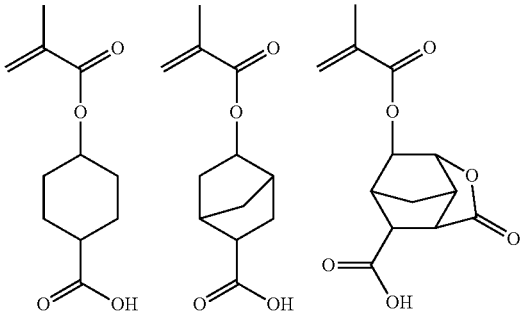
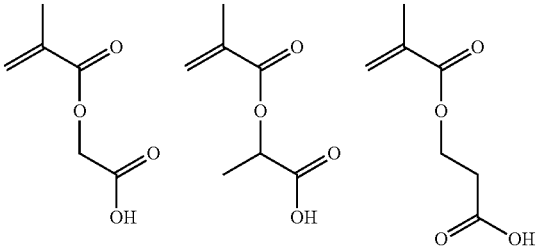
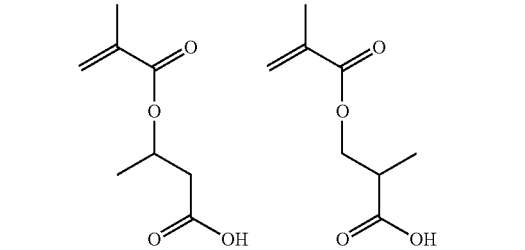
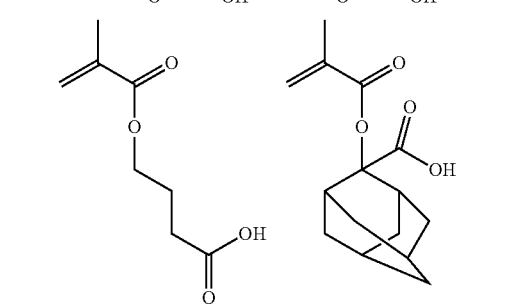

-continued
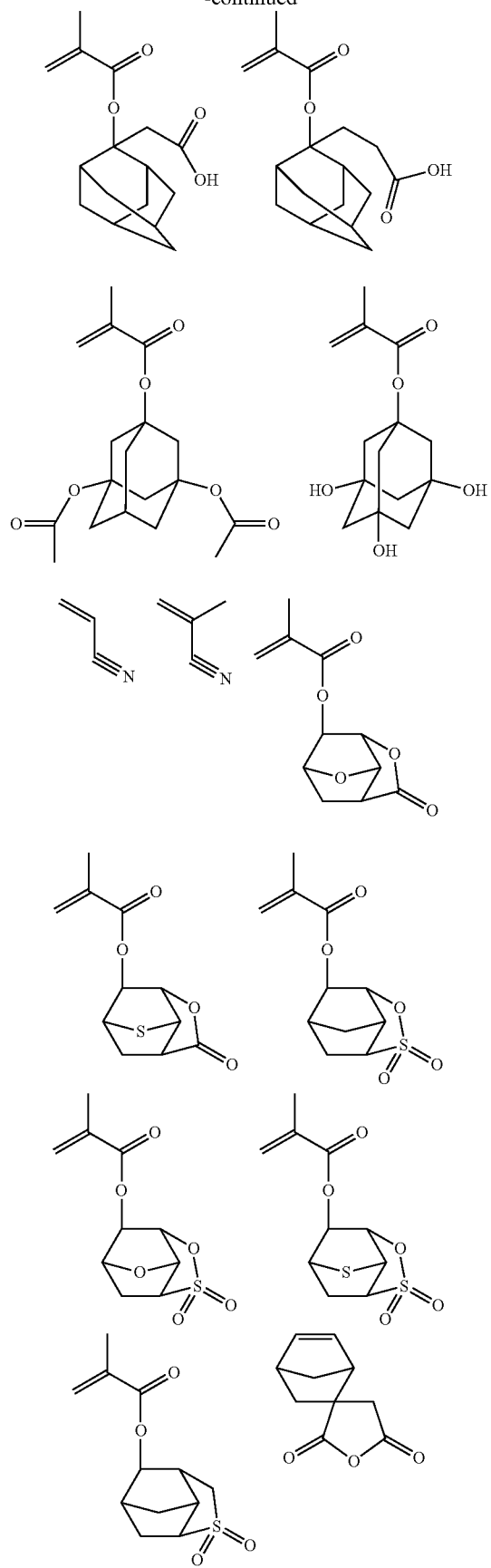
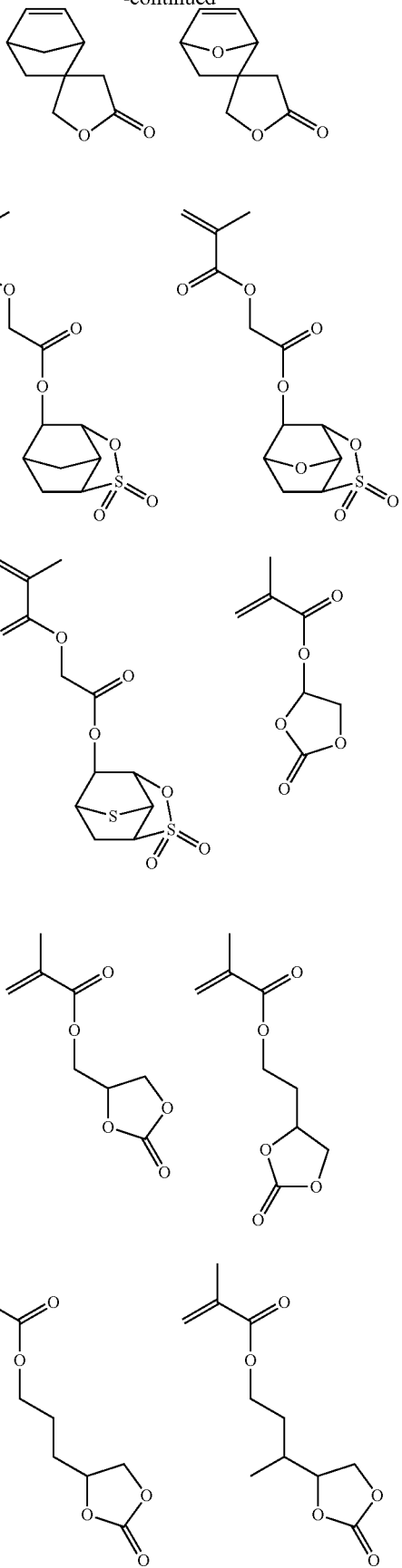

-continued
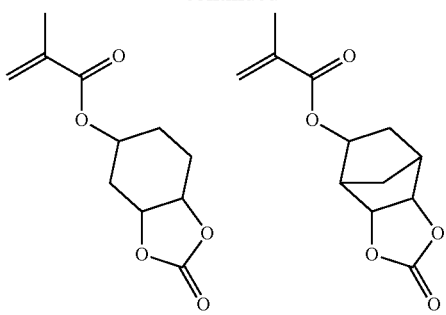
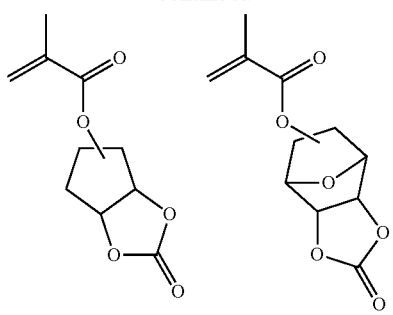
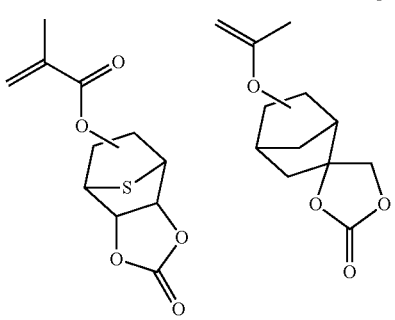
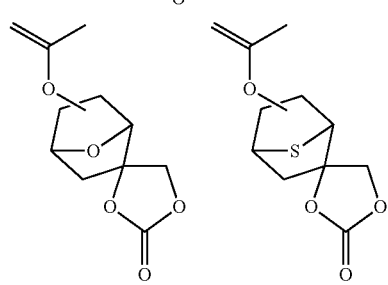
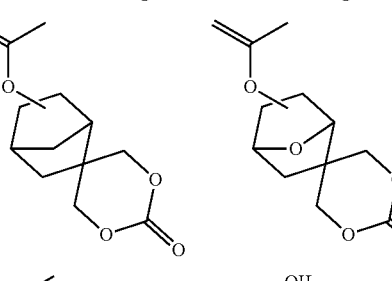
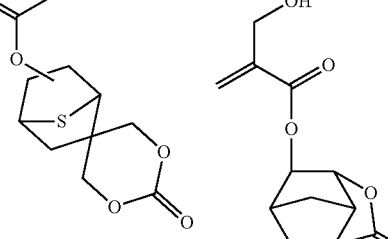
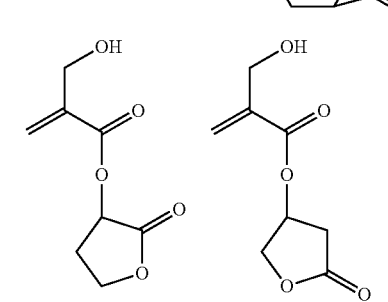

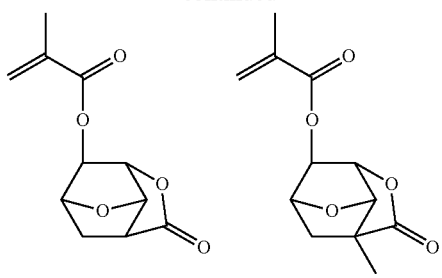
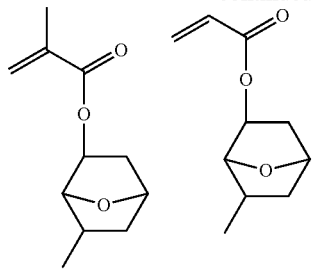
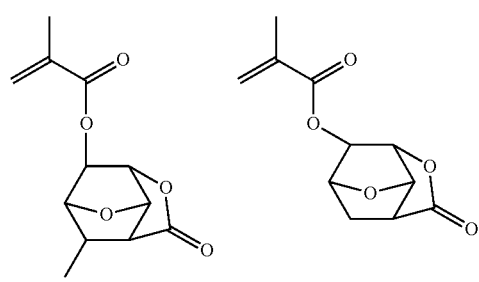
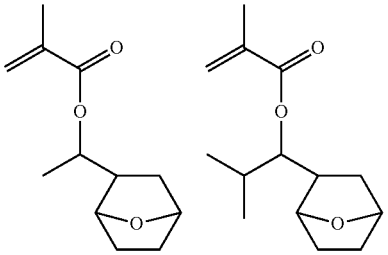
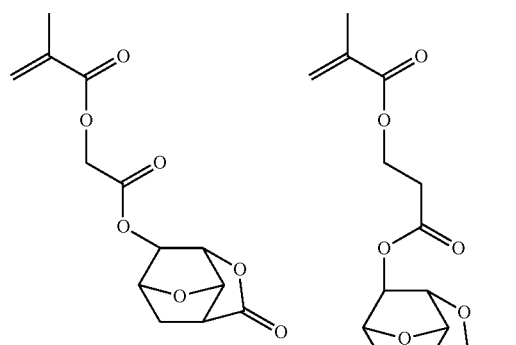
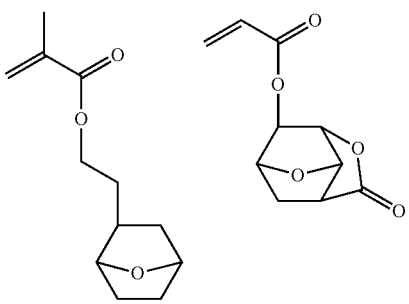
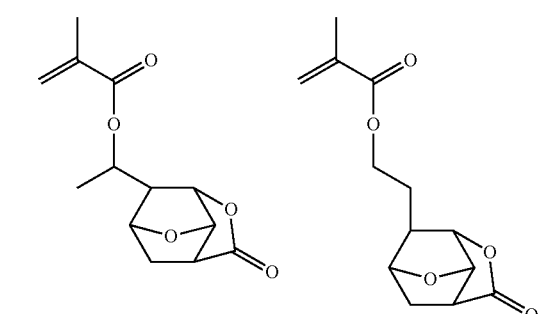
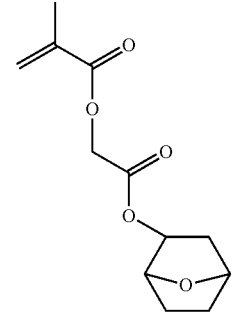
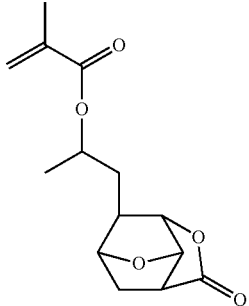
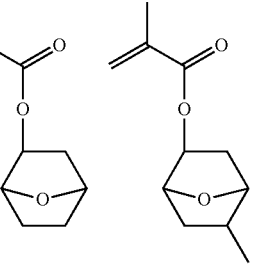
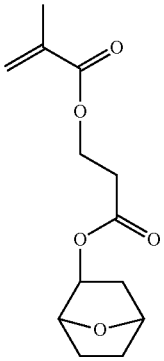
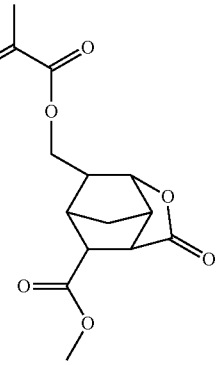

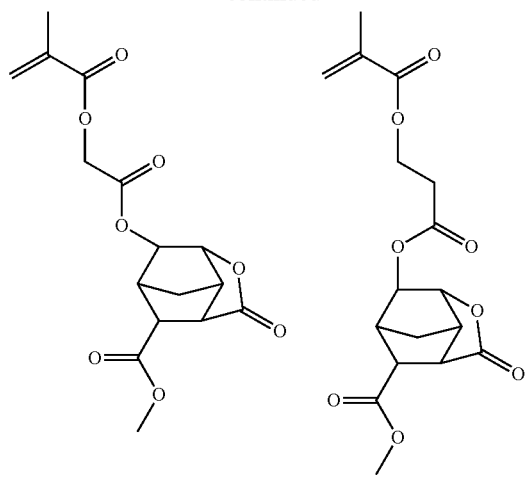
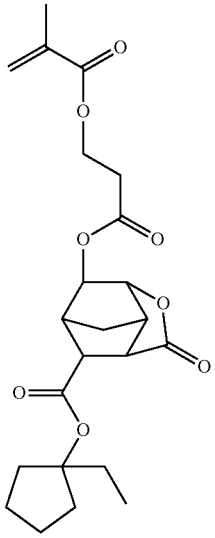
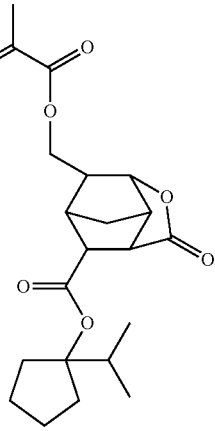
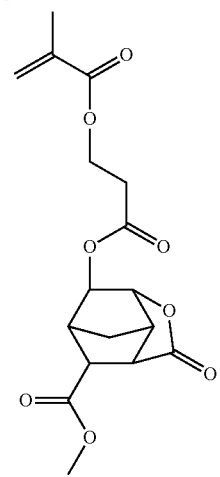
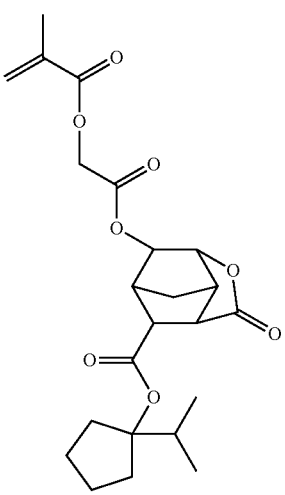
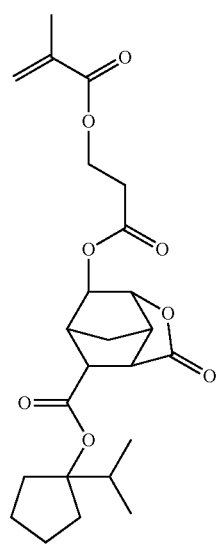
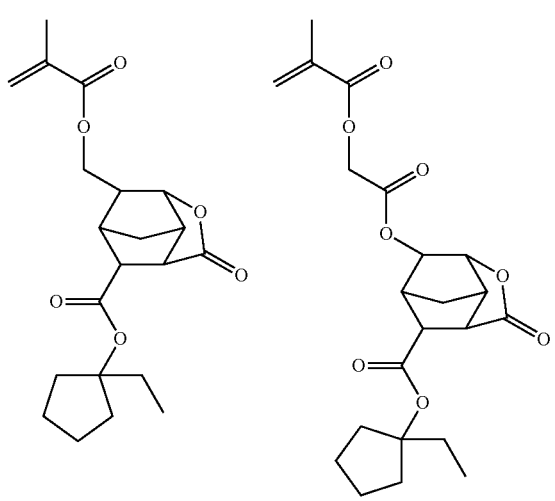
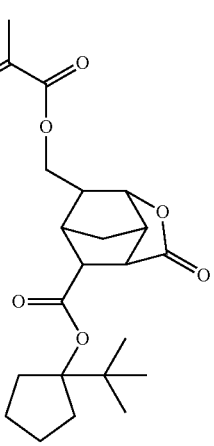
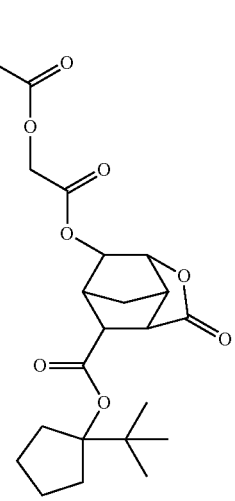

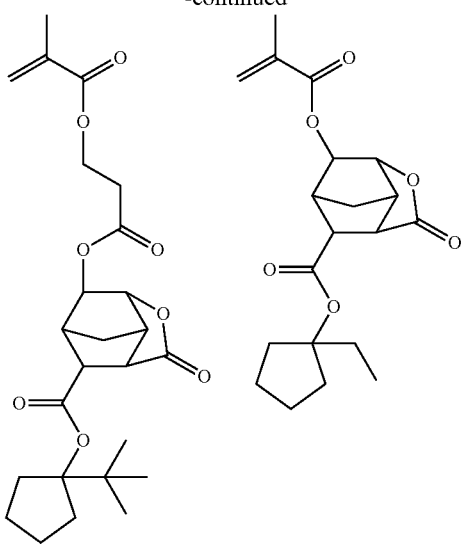
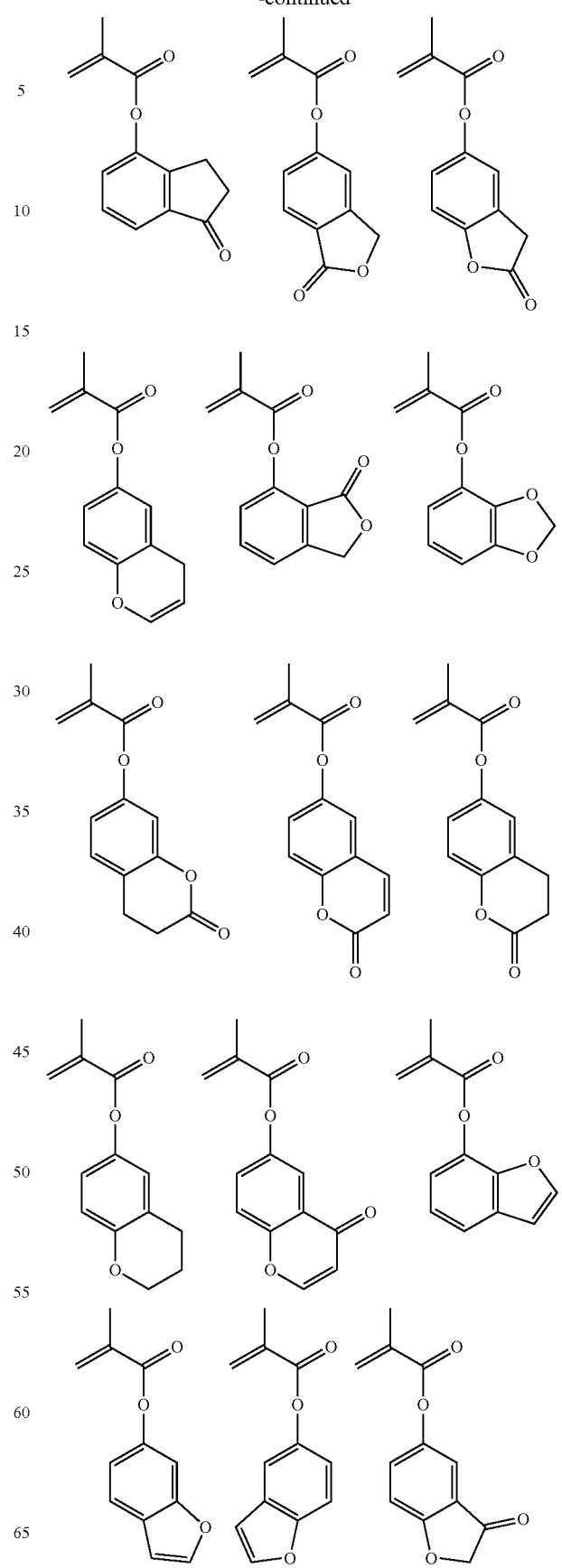

31
-continued
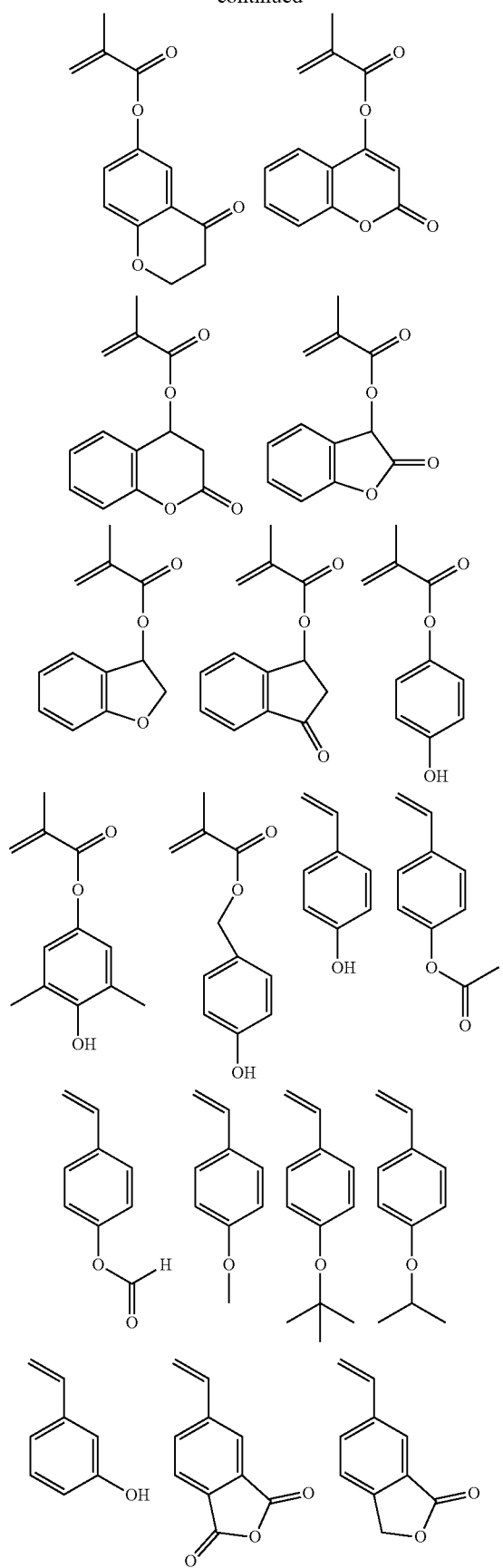
32
-continued
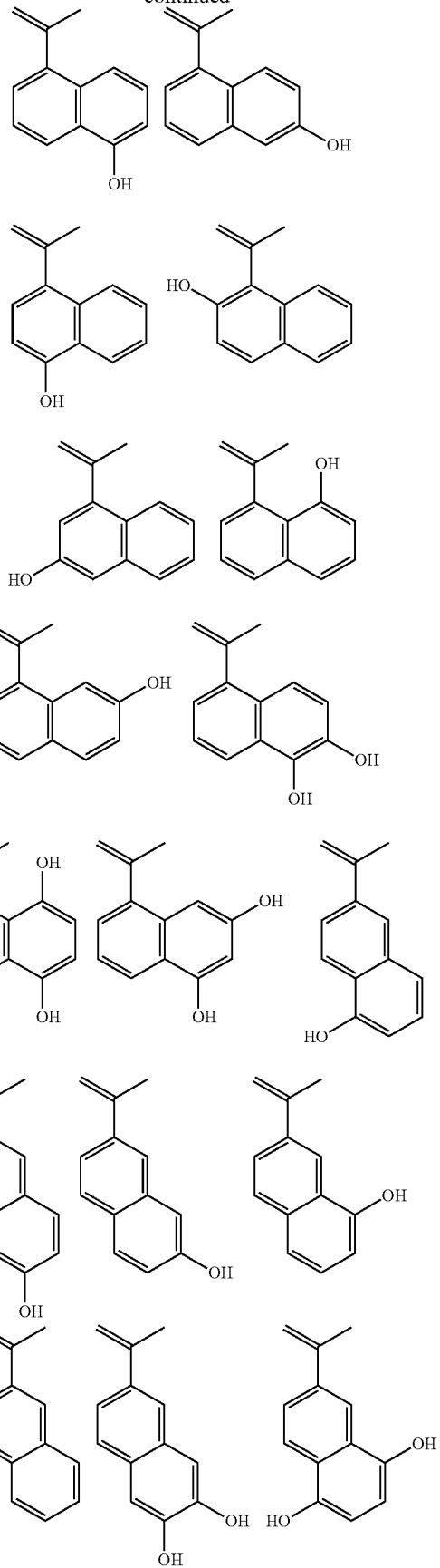

33
-continued
34
-continued
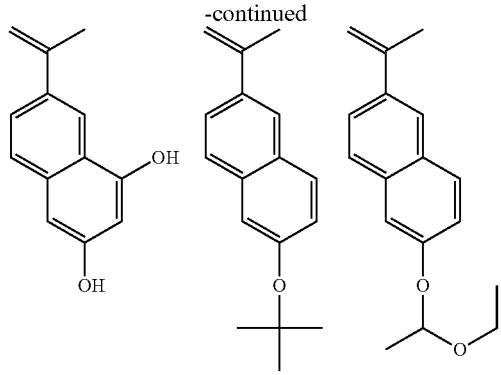
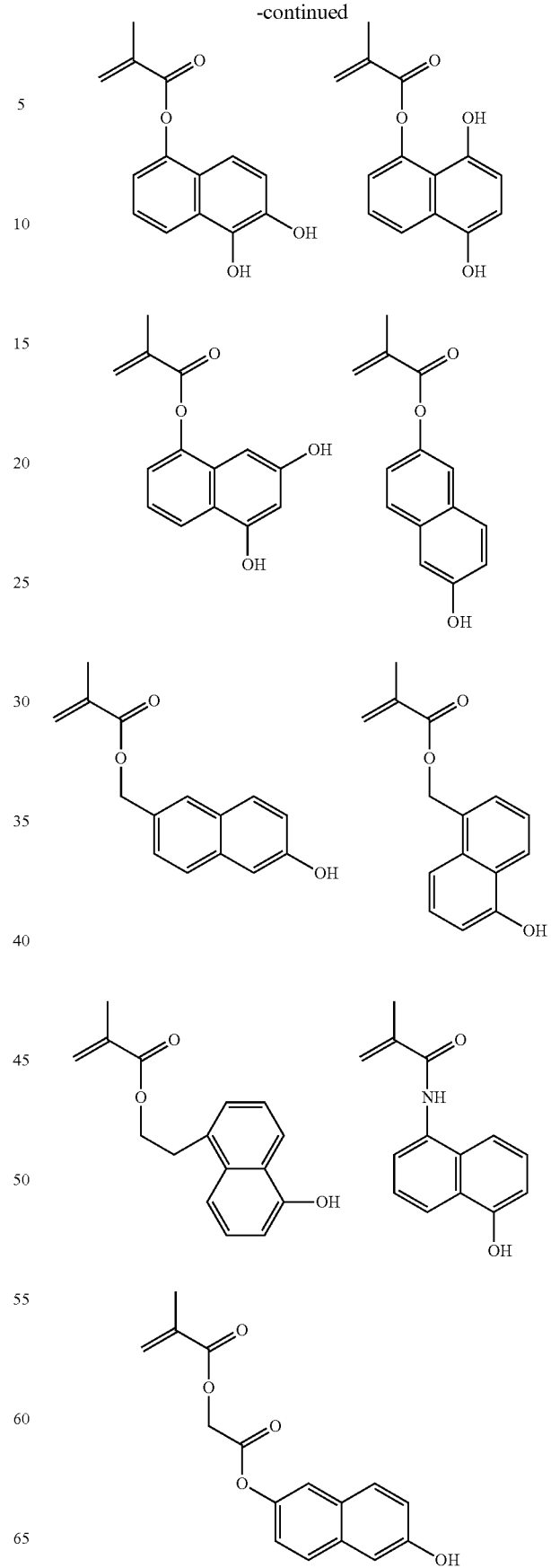

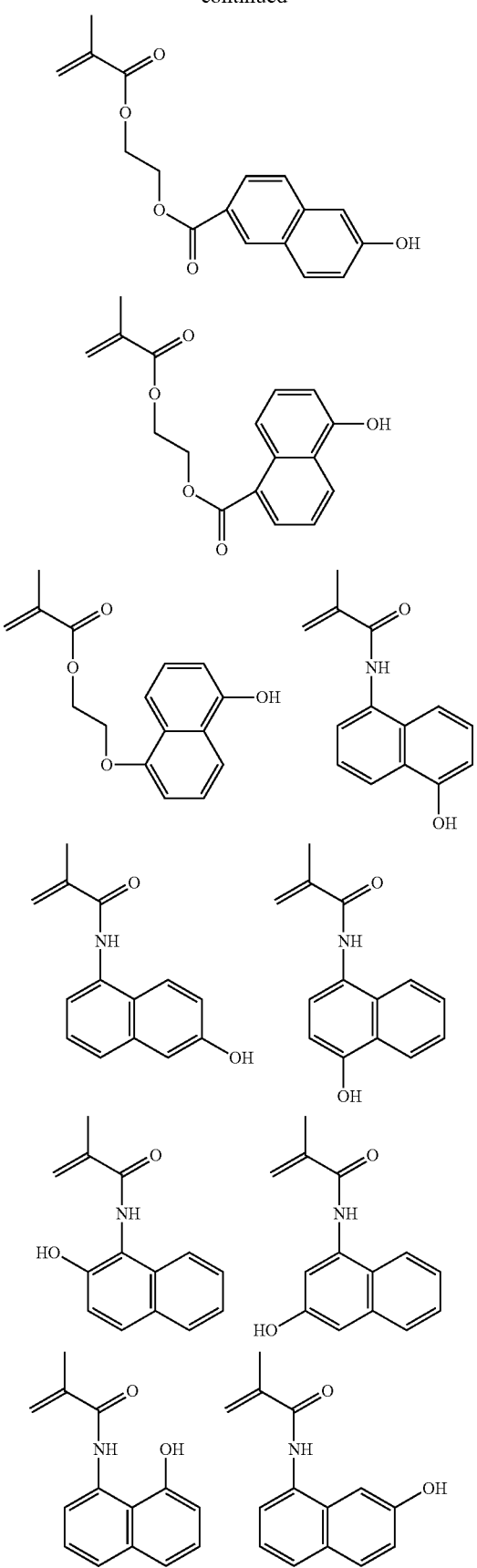
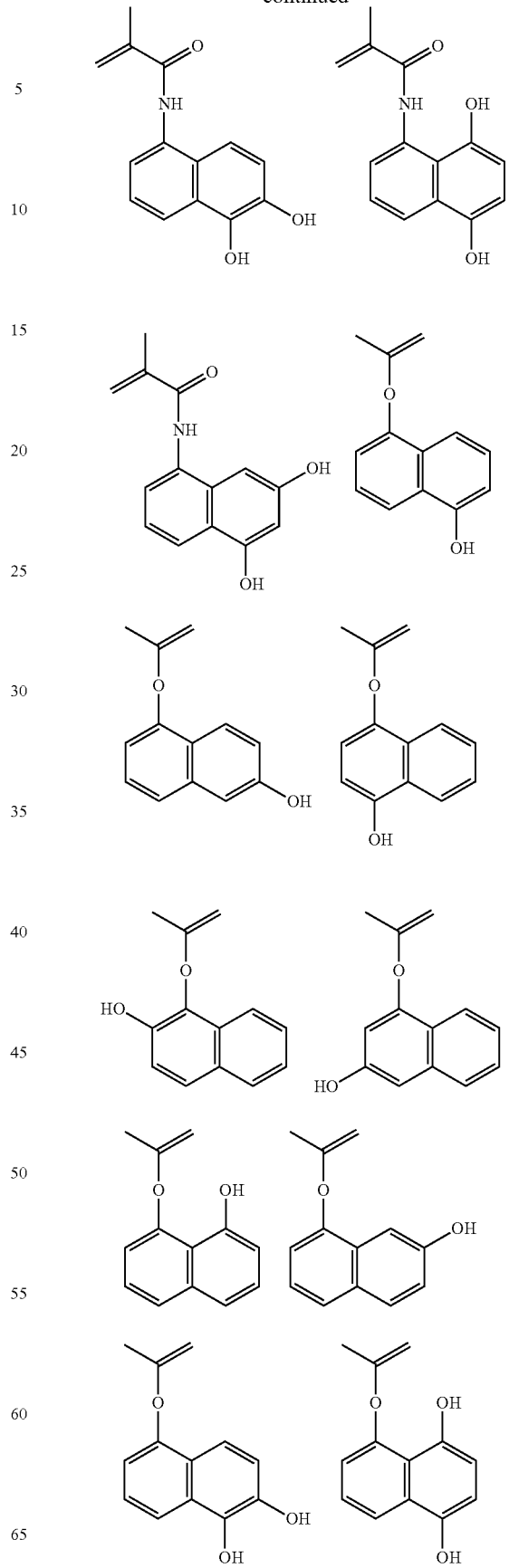

37
-continued
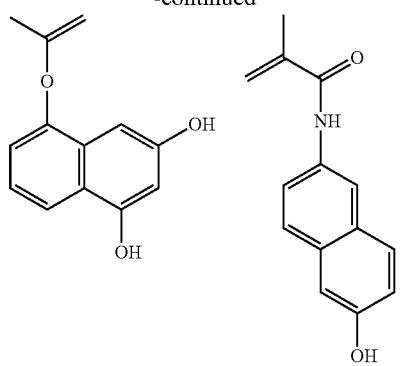
38
-continued
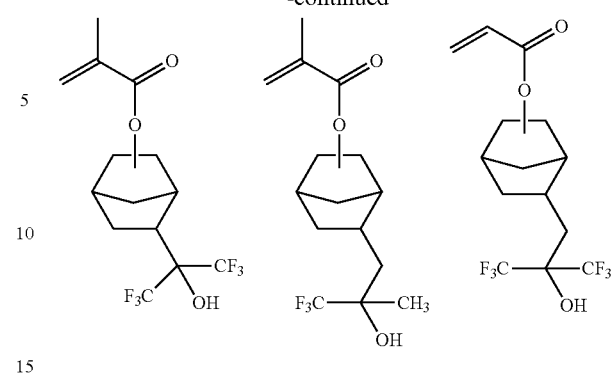
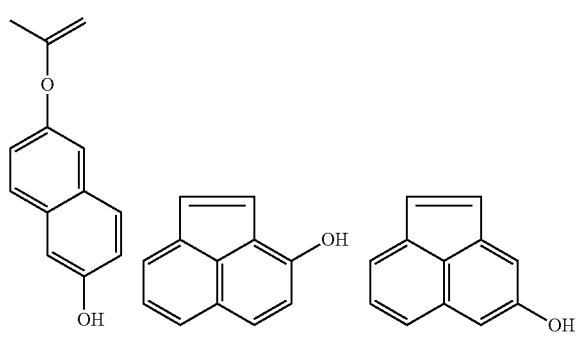
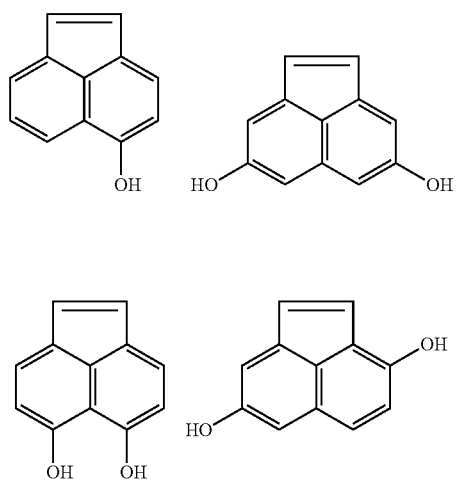
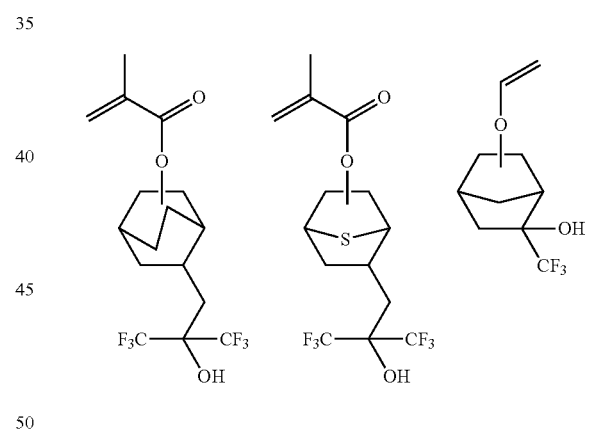
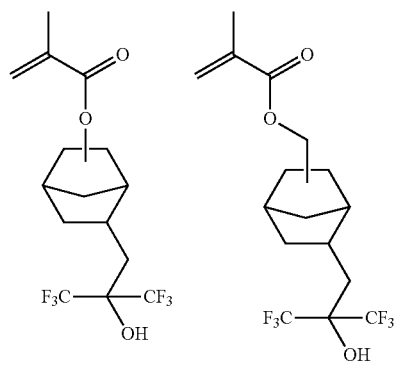
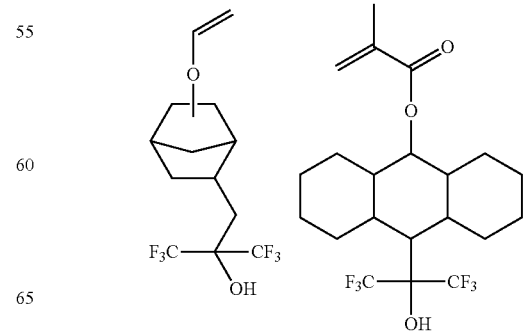

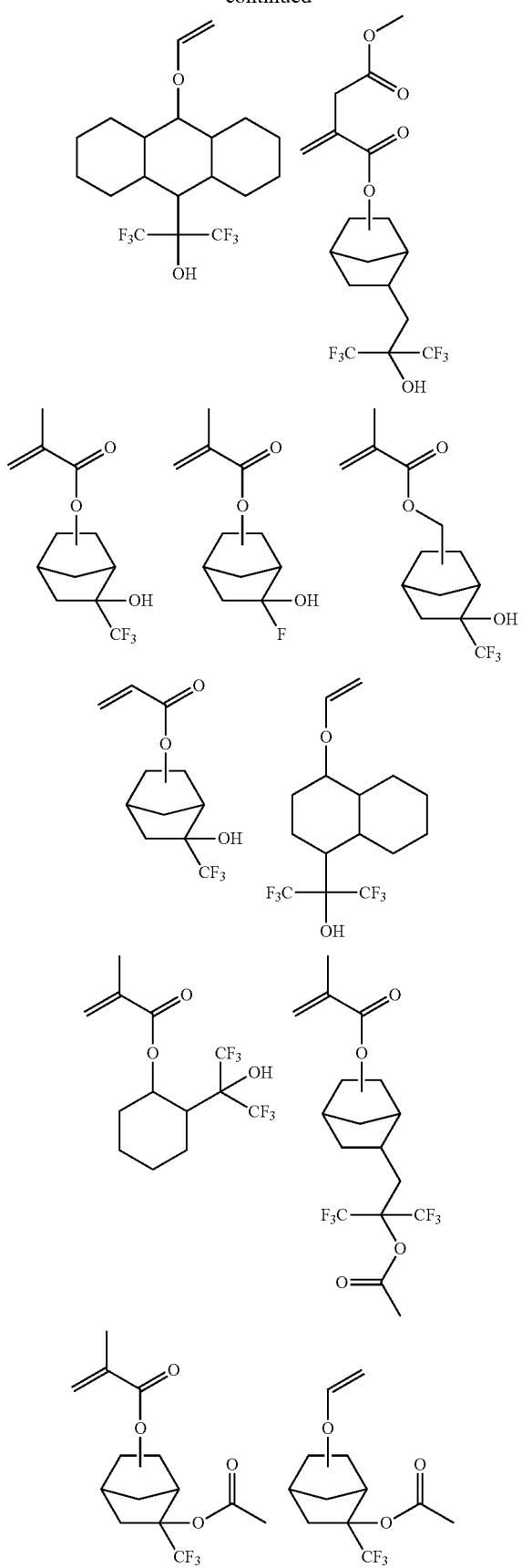
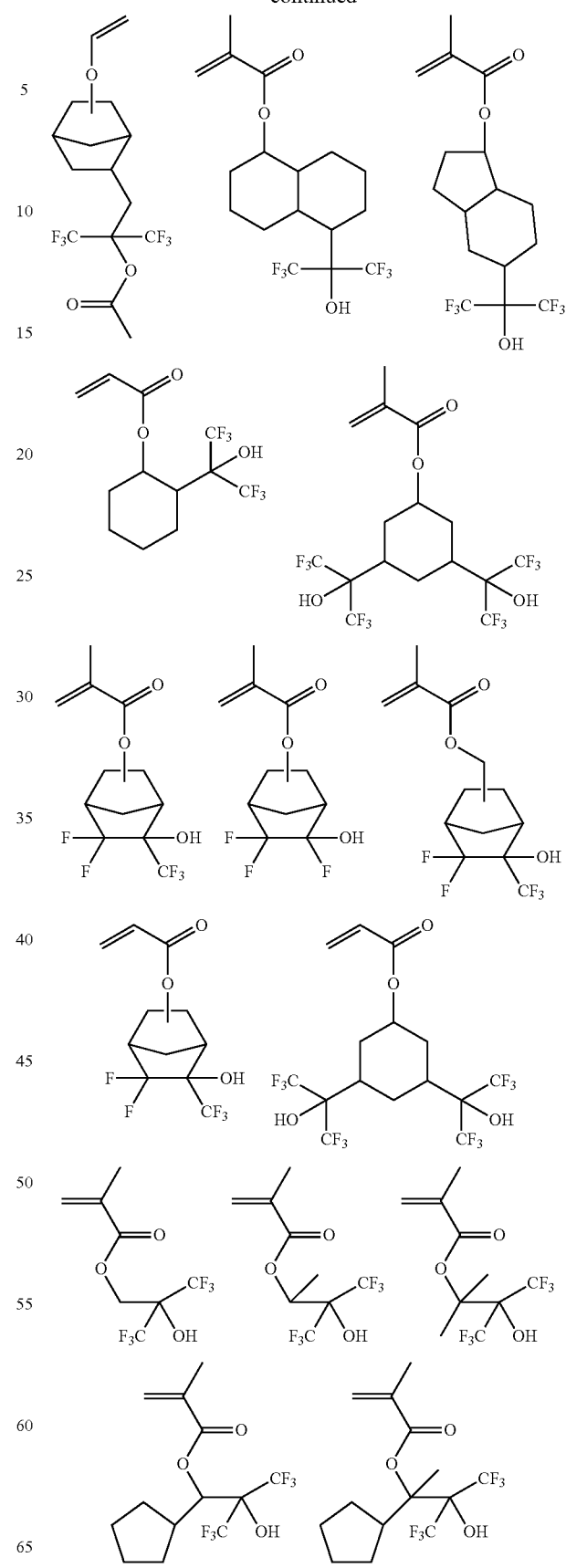

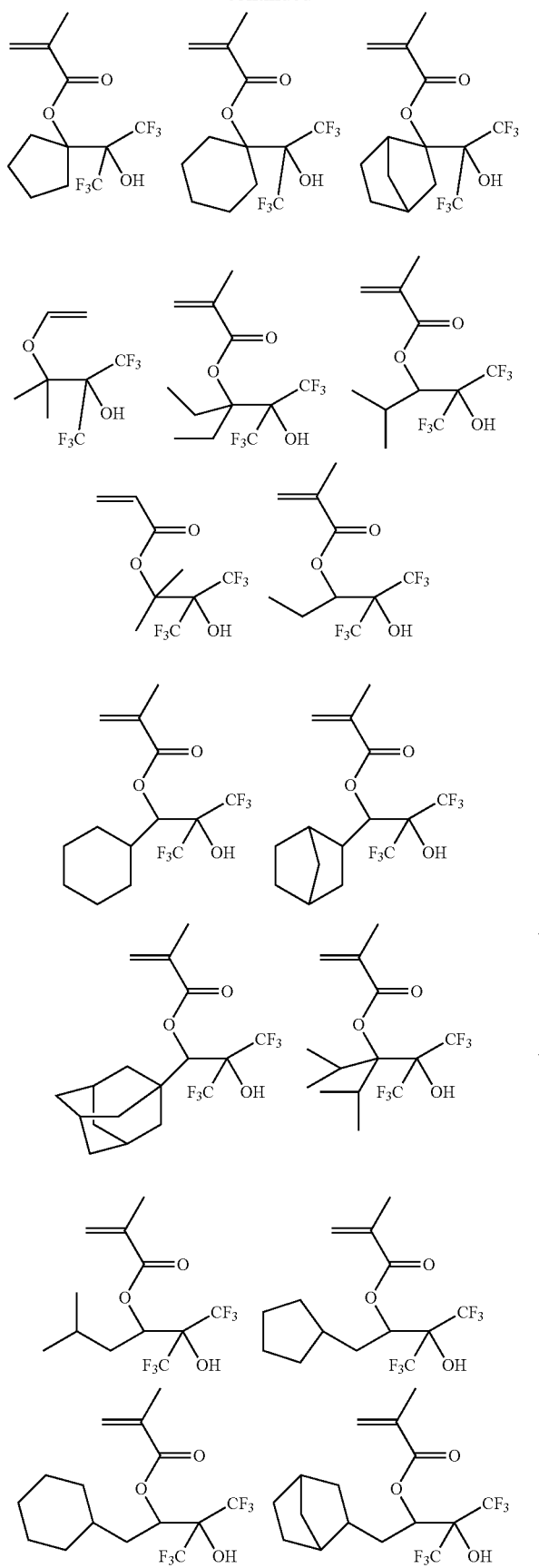
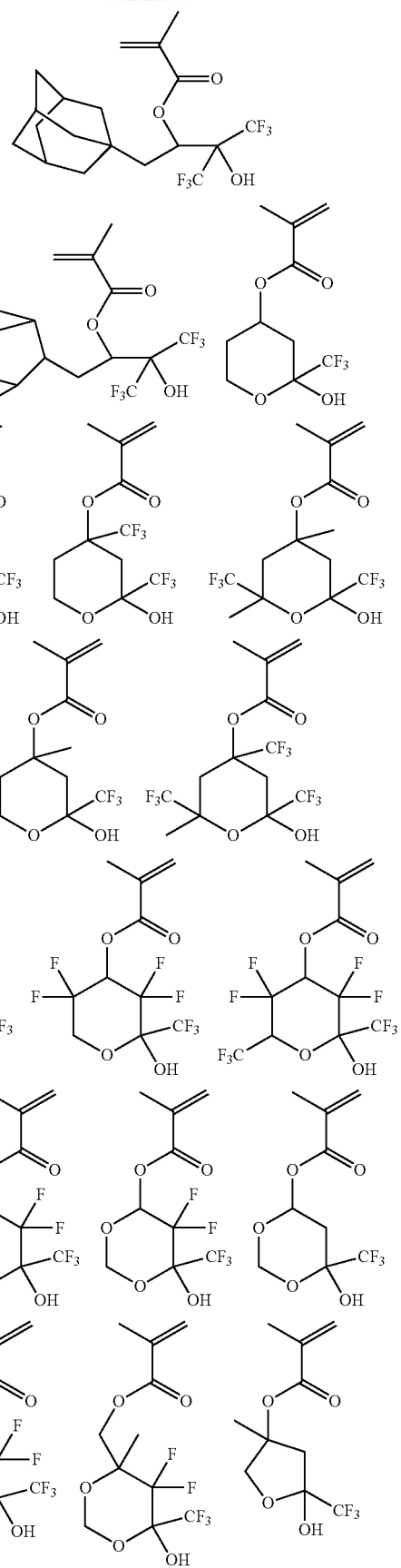

-continued
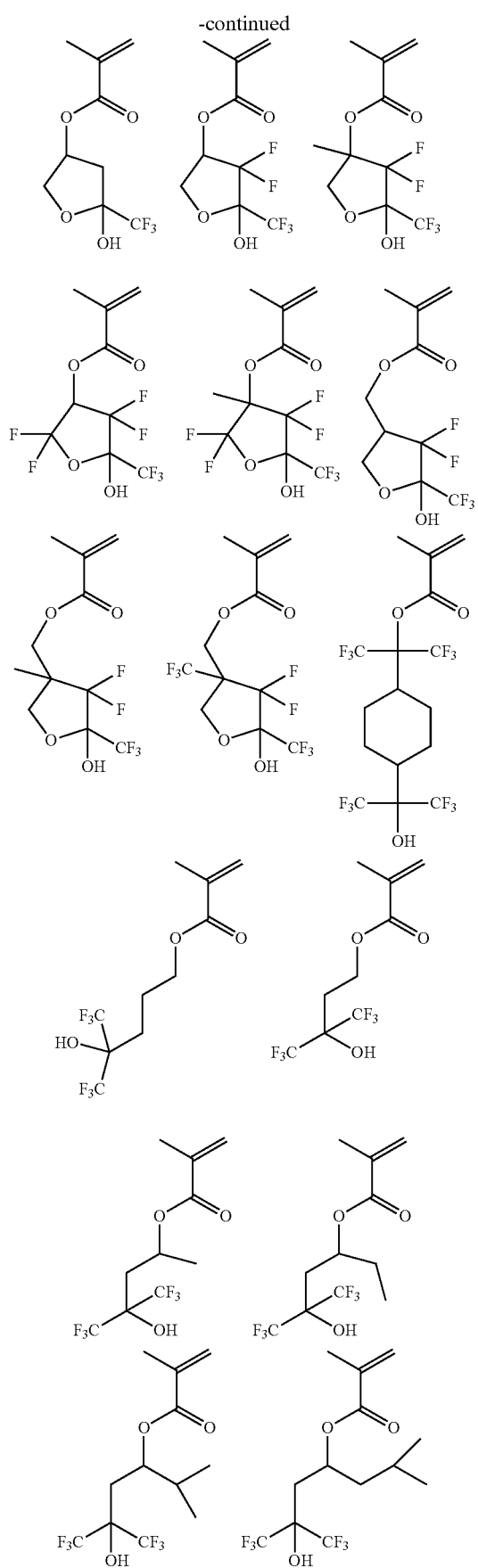
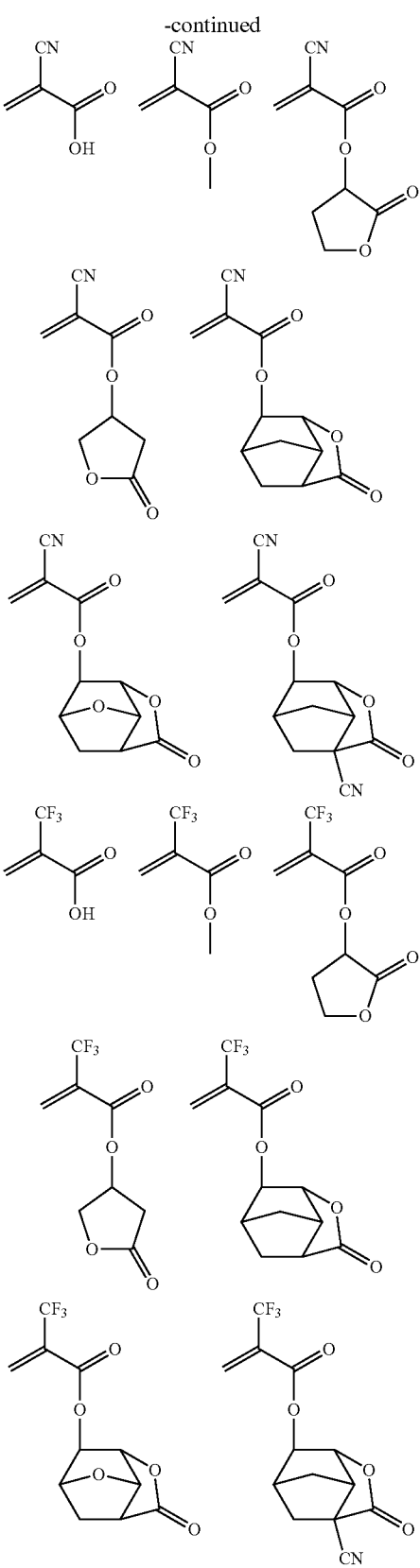
In a pattern forming process utilizing positive/negative reversal, a polymer comprising recurring units (a1) and/or (a2) of cycloolefin having a hydroxyl group substituted with an acid labile group, as represented by formula (1), is used as the base resin in a resist composition which is suited for organic solvent development.

In addition to the recurring units (a1) and (a2), the polymer may have further copolymerized therein recurring units (c1) having a carboxyl group substituted with an acid labile group, represented by the following formula.

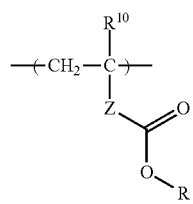
(c1)

The monomer Mc1 from which the recurring unit (c1) is derived has the following formula.

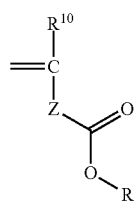
Mc1

Herein $R^{10}$ is hydrogen or methyl, R is an acid labile group, Z is a single bond or —C(=O)—O—$R^{11}$—, and $R^{11}$ is a straight, branched or cyclic $C_1$-$C_{10}$ alkylene group which may have an ether, ester, lactone ring, or hydroxyl radical, or a naphthylene group.

Examples of suitable monomers Mc1 with a variant Z from which the recurring units (c1) are derived are illustrated below. Herein $R^{10}$ is hydrogen or methyl, and R is an acid labile group.

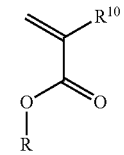 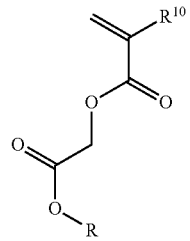

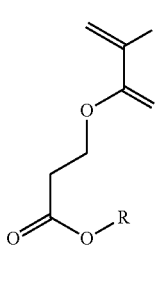 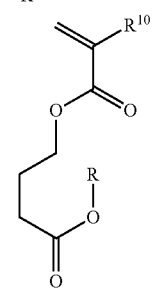

-continued

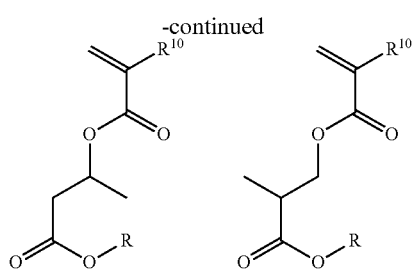

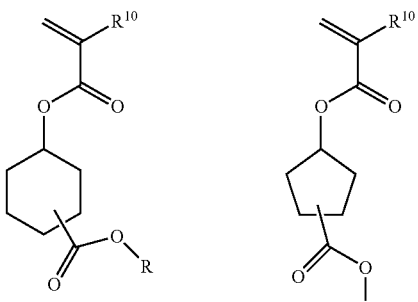

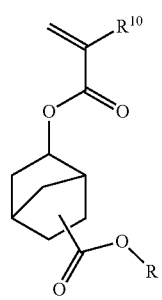 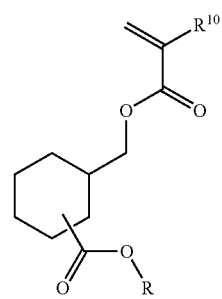

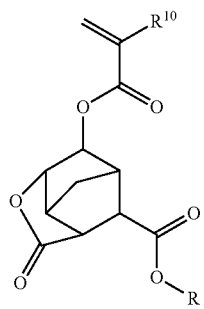 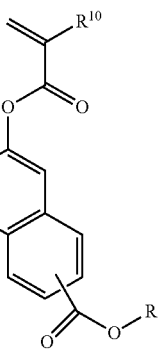

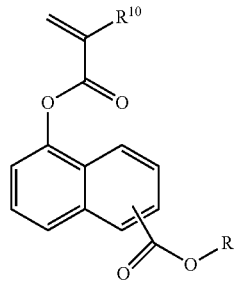 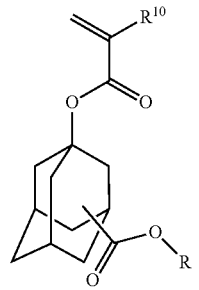

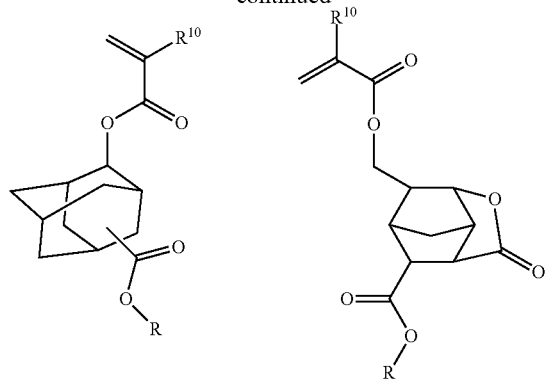
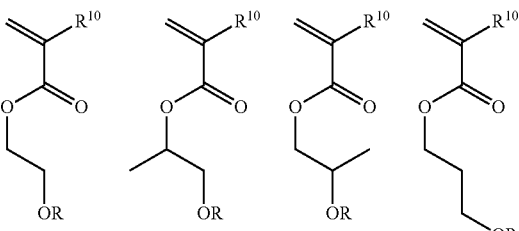
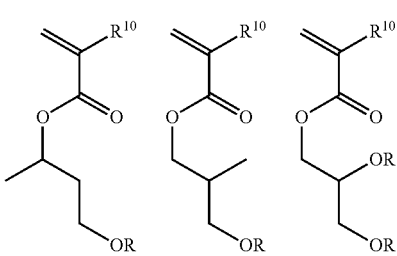
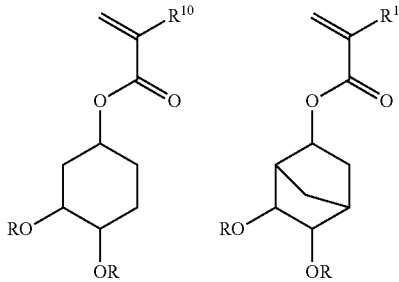
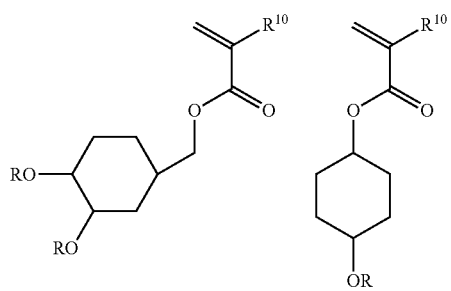
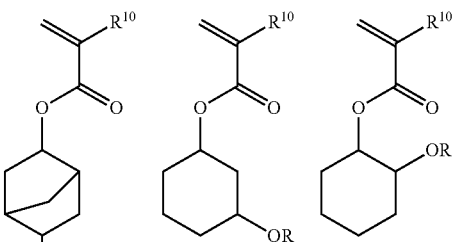
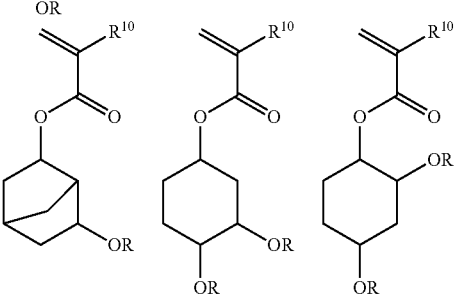

While the polymer should comprise recurring units (a1) and/or (a2) of cycloolefin having a hydroxyl group substituted with an acid labile group, as represented by formula (1), it may further comprise recurring units (c2) having a hydroxyl group substituted with an acid labile group, other than the units (a1) and (a2). Examples of suitable monomers from which the recurring units (c2) are derived are illustrated below. Herein $R^{10}$ is hydrogen or methyl, and R is an acid labile group.

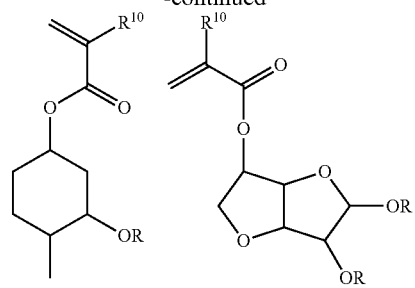
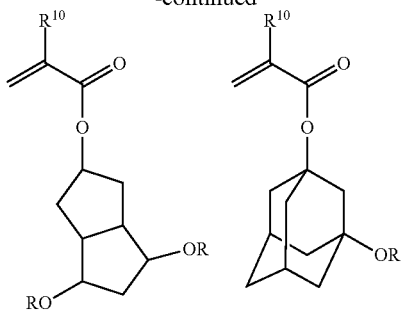
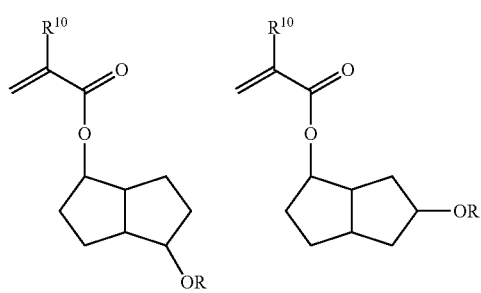
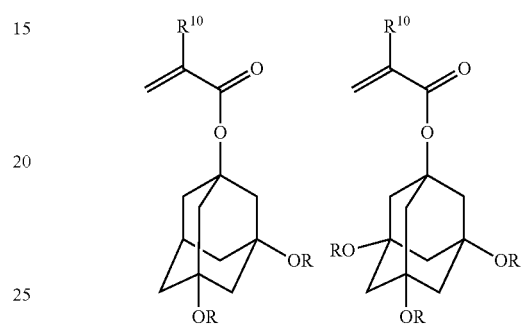
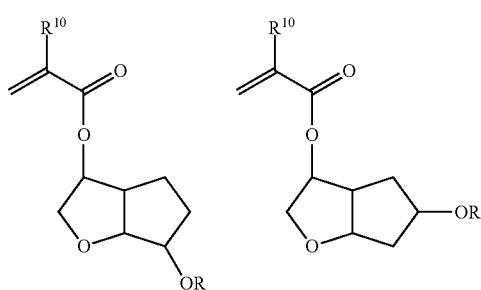
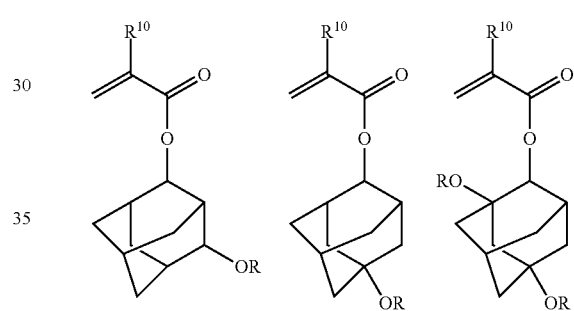
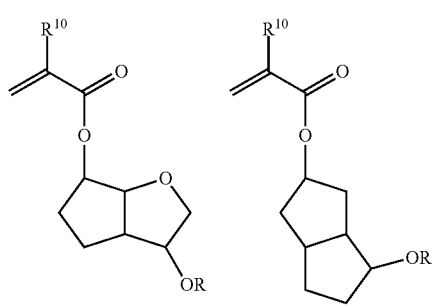
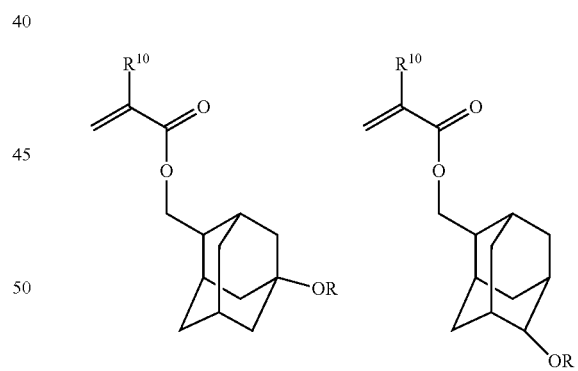
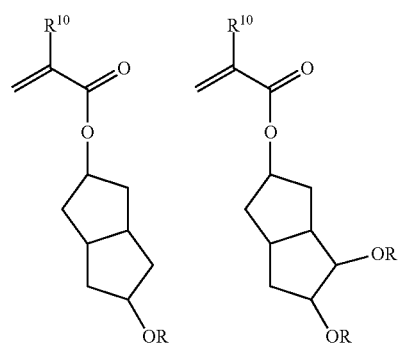
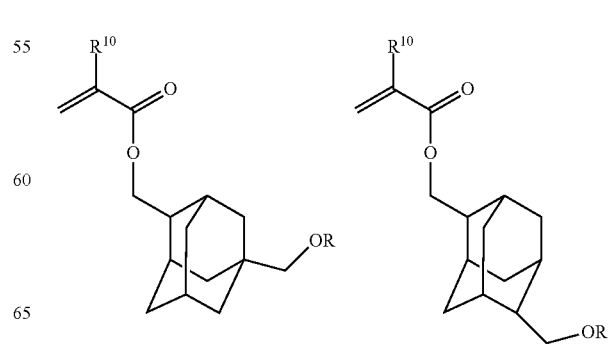

51
-continued
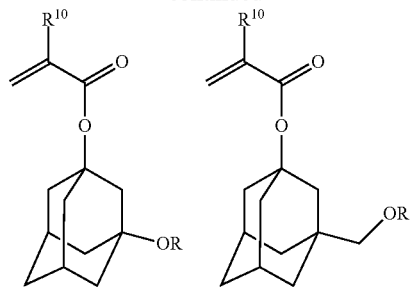
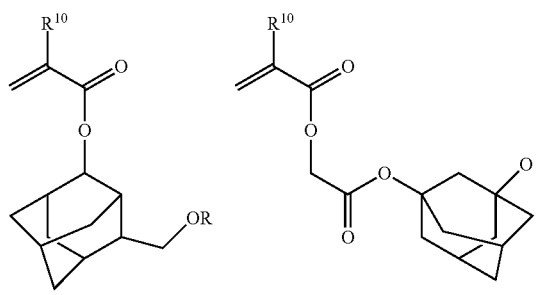
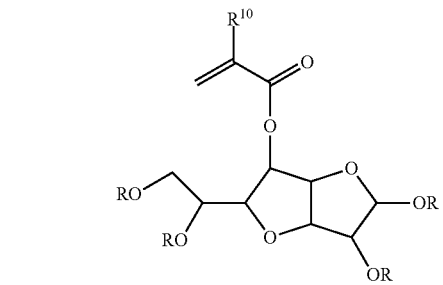
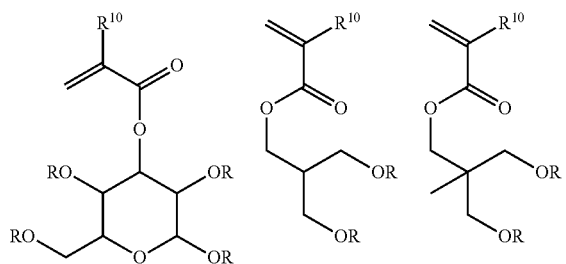
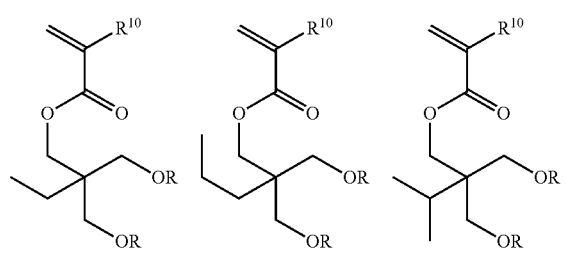
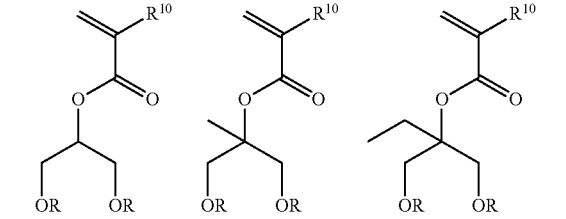
52
-continued
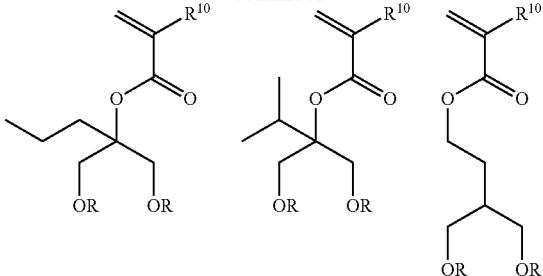
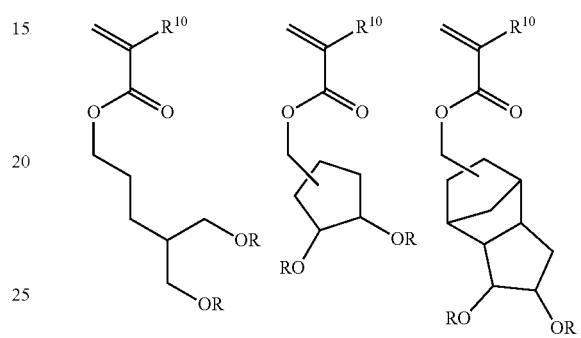
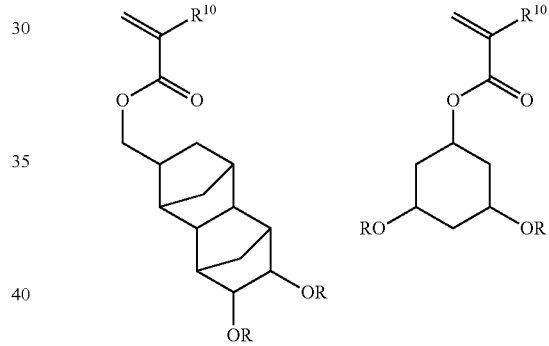
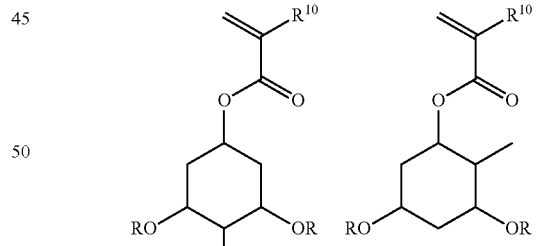
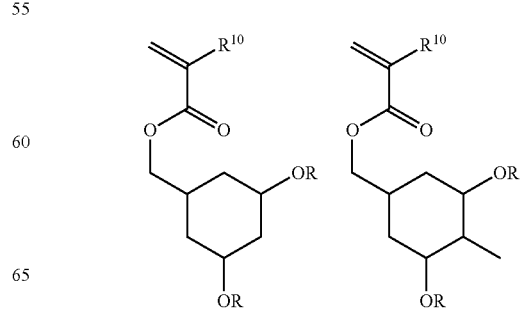

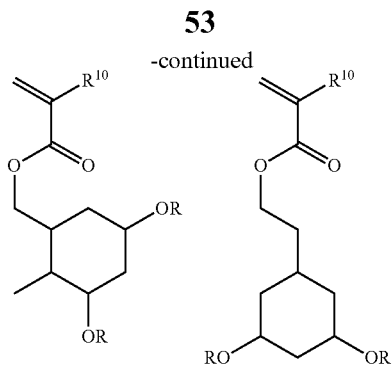

In recurring units (a1) and (a2) in formula (1) and recurring units (c1) and (c2), R is an acid labile group. The acid labile group which may be the same or different may be selected from a variety of such groups, specifically groups of the formula (AL-10), acetal groups of the formula (AL-11), tertiary alkyl groups of the formula (AL-12), and oxoalkyl groups of 4 to 20 carbon atoms, but not limited thereto.

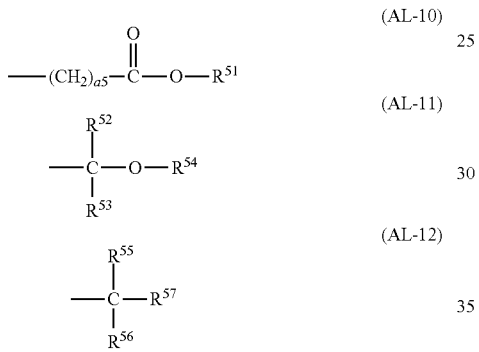

In formulae (AL-10) and (AL-11), $R^{51}$ and $R^{54}$ each are a monovalent hydrocarbon group, typically straight, branched or cyclic alkyl group, of 1 to 40 carbon atoms, more specifically 1 to 20 carbon atoms, which may contain a heteroatom such as oxygen, sulfur, nitrogen or fluorine. $R^{52}$ and $R^{53}$ each are hydrogen or a monovalent hydrocarbon group, typically straight, branched or cyclic alkyl group, of 1 to 20 carbon atoms which may contain a heteroatom such as oxygen, sulfur, nitrogen or fluorine. The subscript "a5" is an integer of 0 to 10, and especially 1 to 5. Alternatively, a pair of $R^{52}$ and $R^{53}$, $R^{52}$ and $R^{54}$, or $R^{53}$ and $R^{54}$ may bond together to form a ring, specifically aliphatic ring, with the carbon atom or the carbon and oxygen atoms to which they are attached, the ring having 3 to 20 carbon atoms, especially 4 to 16 carbon atoms.

In formula (AL-12), $R^{55}$, $R^{56}$ and $R^{57}$ each are a monovalent hydrocarbon group, typically straight, branched or cyclic alkyl group, of 1 to 20 carbon atoms which may contain a heteroatom such as oxygen, sulfur, nitrogen or fluorine. Alternatively, a pair of $R^{55}$ and $R^{56}$, $R^{55}$ and $R^{57}$, or $R^{56}$ and $R^{57}$ may bond together to form a ring, specifically aliphatic ring, with the carbon atom to which they are attached, the ring having 3 to 20 carbon atoms, especially 4 to 16 carbon atoms.

Illustrative examples of the group of formula (AL-10) include tert-butoxycarbonyl, tert-butoxycarbonylmethyl, tert-amyloxycarbonyl, tert-amyloxycarbonylmethyl, 1-ethoxyethoxycarbonylmethyl, 2-tetrahydropyranyloxycarbonylmethyl and 2-tetrahydrofuranyloxycarbonylmethyl as well as substituent groups of the following formulae (AL-10)-1 to (AL-10)-10.

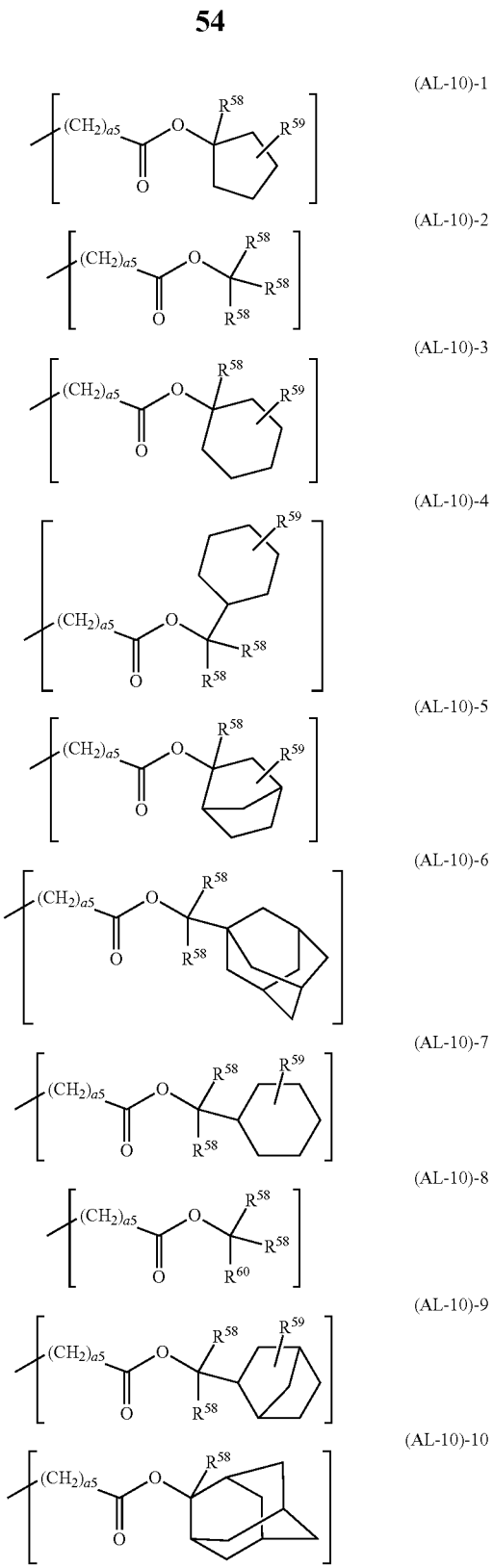

In formulae (AL-10)-1 to (AL-10)-10, $R^{58}$ is each independently a straight, branched or cyclic $C_1$-$C_8$ alkyl group, $C_6$-$C_{20}$ aryl group or $C_7$-$C_{20}$ aralkyl group; $R^{59}$ is hydrogen or a straight, branched or cyclic $C_1$-$C_{20}$ alkyl group; $R^{60}$ is a $C_6$-$C_{20}$ aryl group or $C_7$-$C_{20}$ aralkyl group; and a5 is an integer of 0 to 10, especially 1 to 5.

Illustrative examples of the acetal group of formula (AL-11) include those of the following formulae (AL-11)-1 to (AL-11)-44.
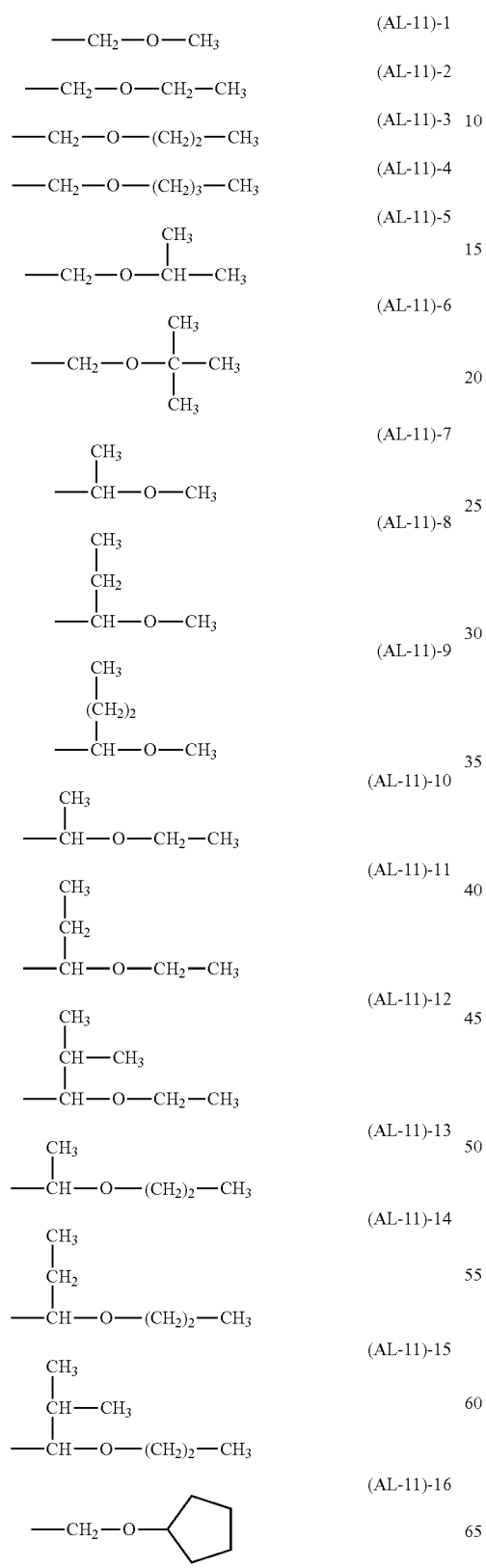
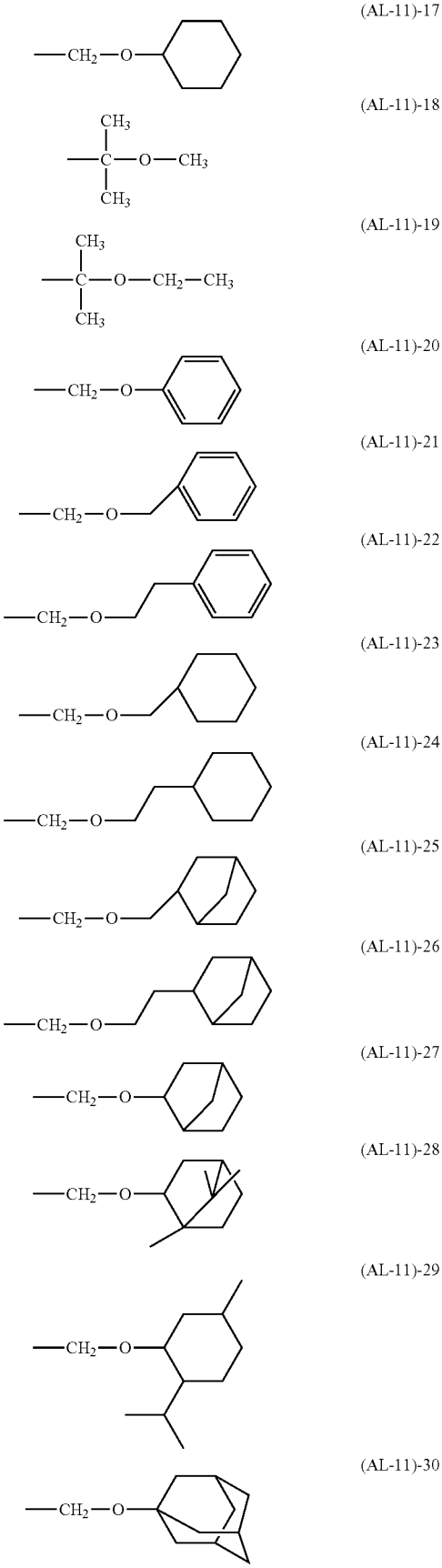

(AL-11)-31 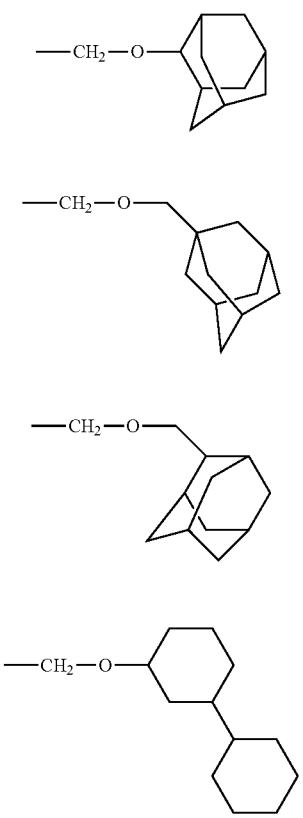

(AL-11)-32

(AL-11)-33

(AL-11)-34

(AL-11)-35 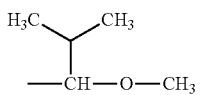

(AL-11)-36 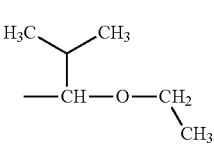

(AL-11)-37 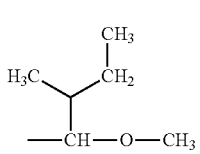

(AL-11)-38 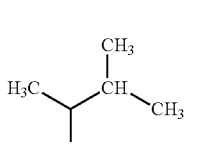

(AL-11)-39 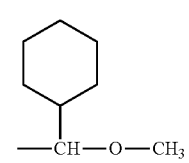

(AL-11)-40 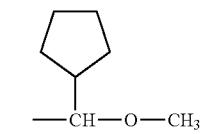

(AL-11)-41 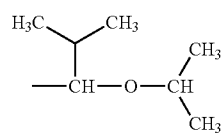

(AL-11)-42 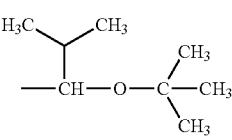

(AL-11)-43 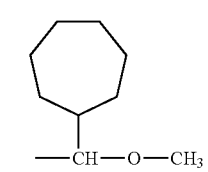

(AL-11)-44 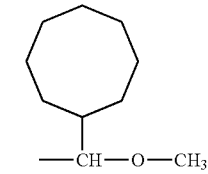

Other examples of acid labile groups include those of the following formula (AL-11a) or (AL-11b) while the polymer may be crosslinked within the molecule or between molecules with these acid labile groups.

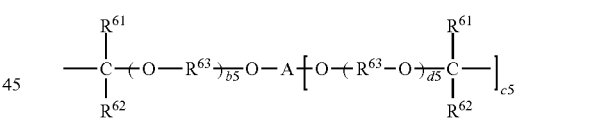
(AL-11a)

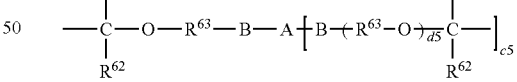
(AL-11b)

Herein $R^{61}$ and $R^{62}$ each are hydrogen or a straight, branched or cyclic $C_1$-$C_8$ alkyl group, or $R^{61}$ and $R^{62}$ may bond together to form a ring with the carbon atom to which they are attached, and $R^{61}$ and $R^{62}$ are straight or branched $C_1$-$C_8$ alkylene groups when they form a ring. $R^{63}$ is a straight, branched or cyclic $C_1$-$C_{10}$ alkylene group. Each of b5 and d5 is 0 or an integer of 1 to 10, preferably 0 or an integer of 1 to 5, and c5 is an integer of 1 to 7. "A" is a (c5+1)-valent aliphatic or alicyclic saturated hydrocarbon group, aromatic hydrocarbon group or heterocyclic group having 1 to 50 carbon atoms, which may be separated by a heteroatom such as oxygen, sulfur or nitrogen or in which some hydrogen atoms attached to carbon atoms may be substituted by hydroxyl, carboxyl, carbonyl radicals or fluorine atoms. "B" is —CO—O—, —NHCO—O— or —NH-CONH—.

Preferably, "A" is selected from divalent to tetravalent, straight, branched or cyclic $C_1$-$C_{20}$ alkylene, alkanetriyl and alkanetetrayl groups, and $C_6$-$C_{30}$ arylene groups, which may be separated by a heteroatom such as oxygen, sulfur or nitrogen or in which some hydrogen atoms attached to carbon atoms may be substituted by hydroxyl, carboxyl, acyl radicals or halogen atoms. The subscript c5 is preferably an integer of 1 to 3.

The crosslinking acetal groups of formulae (AL-11a) and (AL-11b) are exemplified by the following formulae (AL-11)-60 through (AL-11)-67.

Illustrative examples of the tertiary alkyl group of formula (AL-12) include tert-butyl, triethylcarbyl, 1-ethylnorbornyl, 1-methylcyclohexyl, 1-ethylcyclopentyl, and tert-amyl groups as well as those of (AL-12)-1 to (AL-12)-16.

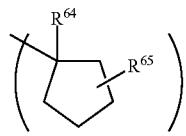

(AL-12)-1

(AL-11)-60

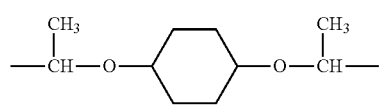

(AL-11)-61

(AL-11)-62

(AL-11)-63

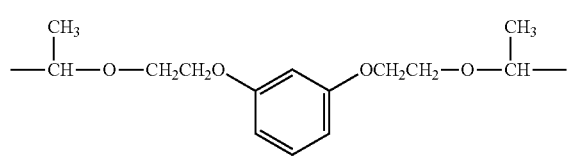

(AL-11)-64

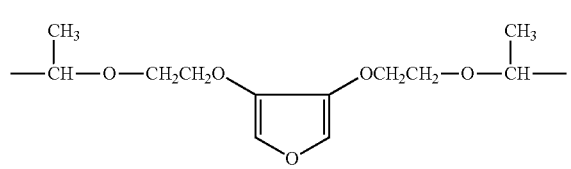

(AL-11)-65

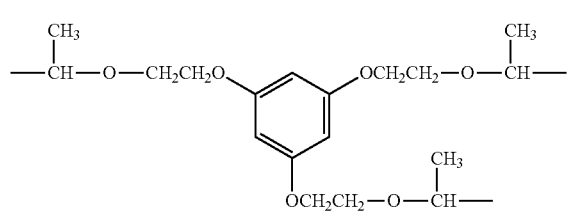

(AL-11)-66

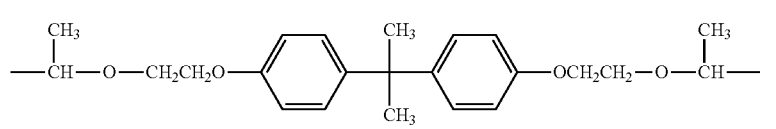

(AL-11)-67

-continued (AL-12)-2
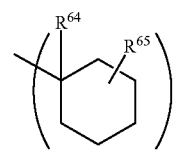

(AL-12)-3
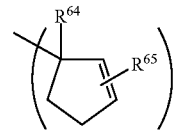

(AL-12)-4
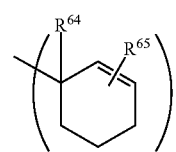

(AL-12)-5
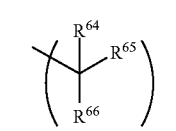

(AL-12)-6
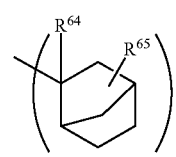

(AL-12)-7
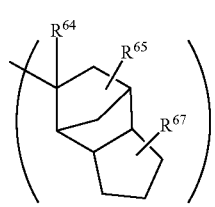

(AL-12)-8
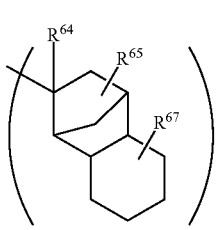

(AL-12)-9
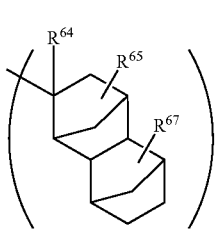

(AL-12)-10
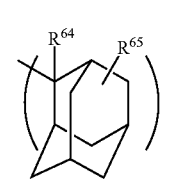

-continued (AL-12)-11
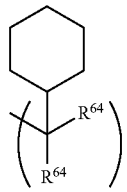

(AL-12)-12
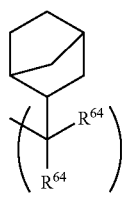

(AL-12)-13
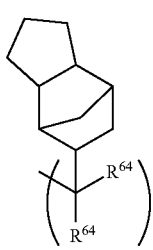

(AL-12)-14
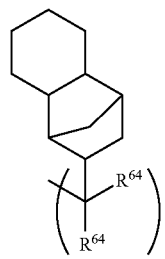

(AL-12)-15
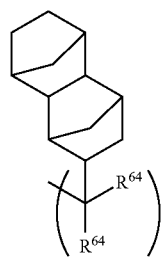

(AL-12)-16
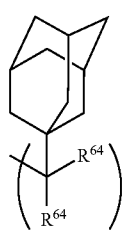

Herein $R^{64}$ is each independently a straight, branched or cyclic $C_1$-$C_8$ alkyl group, $C_6$-$C_{20}$ aryl group or $C_7$-$C_{20}$ aralkyl group, or two $R^{64}$ groups may bond together to form a ring with the carbon atom to which they are attached, the ring being of 3 to 20 carbon atoms, specifically 4 to 16 carbon atoms, typically aliphatic ring; $R^{65}$ and $R^{67}$ each are hydrogen or a straight, branched or cyclic $C_1$-$C_{20}$ alkyl group; and $R^{66}$ is a $C_6$-$C_{20}$ aryl group or $C_7$-$C_{20}$ aralkyl group.

With acid labile groups containing $R^{68}$ representative of a di- or poly-valent alkylene or arylene group as shown by formulae (AL-12)-17 and (AL-12)-18, the polymer may be crosslinked within the molecule or between molecules. In formulae (AL-12)-17 and (AL-12)-18, $R^{64}$ is as defined above, $R^{68}$ is a single bond, a straight, branched or cyclic $C_1$-$C_{20}$ alkylene group or arylene group, which may contain a heteroatom such as oxygen, sulfur or nitrogen, and b6 is an integer of 0 to 3.

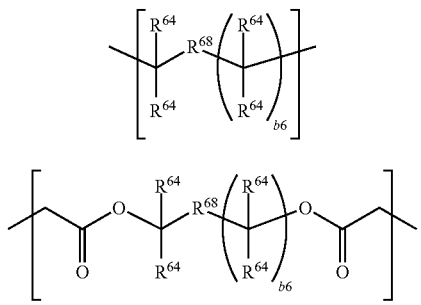

(AL-12)-17

(AL-12)-18

The groups represented by $R^{64}$, $R^{65}$, $R^{66}$ and $R^{67}$ may contain a heteroatom such as oxygen, nitrogen or sulfur. Such groups are exemplified by those of the following formulae (AL-13)-1 to (AL-13)-7.

—(CH$_2$)$_4$OH  (AL-13)-1

—(CH$_2$)$_2$O(CH$_2$)$_3$CH$_3$  (AL-13)-2

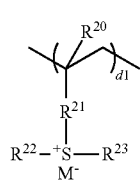  (AL-13)-3

—(CH$_2$)$_2$O(CH$_2$)$_2$OH  (AL-13)-4

—(CH$_2$)$_6$OH  (AL-13)-5

(AL-13)-6

(AL-13)-7

In a further preferred embodiment, the polymer may have further copolymerized therein any of recurring units (d1) to (d3) having a sulfonium salt, as represented by the general formulae below.

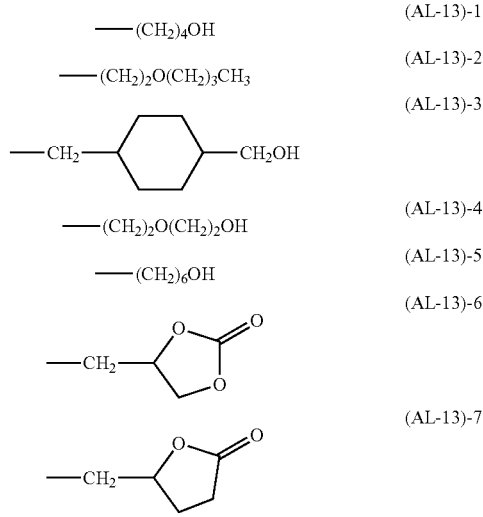

(d1)

(d2)

(d3)

Herein $R^{20}$, $R^{24}$, and $R^{28}$ each are hydrogen or methyl. $R^{21}$ is a single bond, phenylene, —O—$R^{33}$—, or —C(=O)—Y—$R^{33}$— wherein Y is oxygen or NH, and $R^{33}$ is a straight, branched or cyclic $C_1$-$C_6$ alkylene group, alkenylene or phenylene group, which may contain a carbonyl (—CO—), ester (—COO—), ether (—O—) or hydroxyl radical. $R^{22}$, $R^{23}$, $R^{25}$, $R^{26}$, $R^{27}$, $R^{29}$, $R^{30}$, and $R^{31}$ are each independently a straight, branched or cyclic $C_1$-$C_{12}$ alkyl group which may contain a carbonyl, ester or ether radical, or a $C_6$-$C_{12}$ aryl, $C_7$-$C_{20}$ aralkyl, or thiophenyl group. $Z_0$ is a single bond, methylene, ethylene, phenylene, fluorophenylene, —O—$R^{32}$—, or —C(=O)—$Z_1$—$W^{32}$—, wherein $Z_1$ is oxygen or NH, and $R^{32}$ is a straight, branched or cyclic $C_1$-$C_6$ alkylene group, alkenylene or phenylene group, which may contain a carbonyl, ester, ether or hydroxyl radical. $M^-$ is a non-nucleophilic counter ion. The subscripts d1, d2 and d3 are in the range: $0 \le d1 \le 0.3$, $0 \le d2 \le 0.3$, $0 \le d3 \le 0.3$, and $0 \le d1+d2+d3 \le 0.3$.

The subscripts a1, a2, b, c1, c2, d1, d2 and d3 indicative of proportions of corresponding recurring units are in the range: $0 \le a1<1.0$, $0 \le a2<1.0$, $0<a1+a2<1.0$, $0<b<1.0$, $0 \le c1<1.0$, $0 \le c2<1.0$, $0 \le d1 \le 0.3$, $0 \le d2 \le 0.3$, $0 \le d3 \le 0.3$, and $0 \le d1+d2+d3 \le 0.3$; preferably $0 \le a1 \le 0.9$, $0 \le a2 \le 0.9$, $0.1 \le a1+a2 \le 0.9$, $0.1 \le b \le 0.9$, $0 \le c1 \le 0.7$, $0 \le c2 \le 0.7$, $0 \le d1<0.15$, $0 \le d2<0.15$, $0 \le d3<0.15$, and $0 \le d1+d2+d3<0.15$, provided that a1+a2+b+c1+c2+d1+d2+d3=1.

The polymer serving as the base resin in the resist composition used in the pattern forming process of the invention should preferably have a weight average molecular weight (Mw) in the range of 1,000 to 500,000, and more preferably 2,000 to 30,000, as measured by GPC versus polystyrene standards using tetrahydrofuran solvent. With too low a Mw, film thickness loss is likely to occur upon organic solvent development. A polymer with too high a Mw may lose solubility in organic solvent and have a likelihood of footing after pattern formation.

If a polymer has a wide molecular weight distribution or dispersity (Mw/Mn), which indicates the presence of lower and higher molecular weight polymer fractions, there is a possibility that following exposure, foreign matter is left on the pattern or the pattern profile is exacerbated. The influences of molecular weight and dispersity become stronger as the pattern rule becomes finer. Therefore, the multi-component copolymer should preferably have a narrow dispersity (Mw/Mn) of 1.0 to 2.0, especially 1.0 to 1.5, in order to provide a resist composition suitable for micropatterning to a small feature size.

It is acceptable to use a blend of two or more polymers which differ in compositional ratio, molecular weight or dispersity as well as a blend of an inventive polymer and another polymer free of an acid labile group-substituted hydroxyl group, for example, a conventional (co)polymer of methacrylate, norbornene or cycloolefin-maleic anhydride having an acid labile group-substituted carboxyl group. A blend of an inventive polymer and a polymer comprising recurring units (c2) of methacrylate having an acid labile group-substituted hydroxyl group is also acceptable.

The polymer used herein may be synthesized by any desired method, for example, by dissolving unsaturated bond-containing monomers corresponding to the respective units (a1), (a2), (b), (c1), (c2), (d1), (d2), and (d3) in an organic solvent, adding a radical initiator or metal catalyst thereto, and effecting heat polymerization. Examples of the organic solvent which can be used for polymerization include toluene, benzene, tetrahydrofuran, diethyl ether and dioxane. Examples of the polymerization initiator used herein include 2,2'-azobisisobutyronitrile (AIBN), 2,2'-azobis(2,4-dimethyl-valeronitrile), dimethyl 2,2-azobis(2-methylpropionate), benzoyl peroxide, and lauroyl peroxide. Suitable metal catalysts include alkyl lithium, platinum, palladium, ruthenium, titanium, zirconium, chromium, nickel, tungsten, and copper. Preferably the system is heated at 50 to 80° C. for polymerization to take place. The reaction time is 2 to 100 hours, preferably 5 to 20 hours. The acid labile group that has been incorporated in the monomers may be kept as such, or the product may be protected or partially protected after polymerization.

In order to form a negative tone pattern using a polymer, recurring units (a1) or (a2) of cycloolefin having an acid labile group-substituted hydroxyl group are essential, whereas recurring units (c1) of methacrylate having an acid labile group-substituted carboxyl group, recurring units (c2) of methacrylate having an acid labile group-substituted hydroxyl group are not necessarily essential. In the case of a resist composition based on a polymer comprising recurring units (a1) or (a2) of cycloolefin having an acid labile group-substituted hydroxyl group, the exposed region of resist film is not dissolved in alkaline developer or if dissolvable, experiences only a slight loss of film thickness, suggesting impossible formation of positive pattern via alkaline development. Upon organic solvent development, however, the resist film includes the unexposed region having a higher dissolution rate and the exposed region having a lower dissolution rate than the use of polymers of cycloolefin having an acid labile group-substituted carboxyl group. That is, a high dissolution contrast is available upon organic solvent development.

The resist composition used in the pattern forming process of the invention may further comprise an organic solvent, a compound capable of generating an acid in response to high-energy radiation (known as "acid generator"), and optionally, a dissolution regulator, basic compound, surfactant, acetylene alcohol, and other components.

The resist composition used herein may include an acid generator in order for the composition to function as a chemically amplified positive resist composition. Typical of the acid generator used herein is a photoacid generator (PAG) capable of generating an acid in response to actinic light or radiation. The PAG may preferably be compounded in an amount of 0.1 to 30 parts and more preferably 0.5 to 20 parts by weight per 100 parts by weight of the base resin. The PAG is any compound capable of generating an acid upon exposure to high-energy radiation. Suitable PAGs include sulfonium salts, iodonium salts, sulfonyldiazomethane, N-sulfonyloxyimide, and oxime-O-sulfonate acid generators. Any of the PAGs described in JP-A 2008-111103, paragraphs [0122] to [0142] (U.S. Pat. No. 7,537,880) may be used. The PAGs may be used alone or in admixture of two or more. In the embodiment wherein a base polymer having recurring units (d1), (d2) or (d3) of acid generator copolymerized therein is used, the acid generator need not be separately added.

Examples of the organic solvent used herein are described in JP-A 2008-111103, paragraphs [0144] to [0145] (U.S. Pat. No. 7,537,880). Specifically, exemplary solvents include ketones such as cyclohexanone and methyl-2-n-amyl ketone; alcohols such as 3-methoxybutanol, 3-methyl-3-methoxybutanol, 1-methoxy-2-propanol, and 1-ethoxy-2-propanol; ethers such as propylene glycol monomethyl ether, ethylene glycol monomethyl ether, propylene glycol monoethyl ether, ethylene glycol monoethyl ether, propylene glycol dimethyl ether, and diethylene glycol dimethyl ether; esters such as propylene glycol monomethyl ether acetate (PGMEA), propylene glycol monoethyl ether acetate, ethyl lactate, ethyl pyruvate, butyl acetate, methyl 3-methoxypropionate, ethyl 3-ethoxypropionate, tert-butyl acetate, tert-butyl propionate, and propylene glycol mono-tert-butyl ether acetate; and lactones such as γ-butyrolactone, and mixtures thereof. Where the acid labile group used is of acetal type, a high-boiling alcohol solvent may be added for accelerating deprotection reaction of acetal, for example, diethylene glycol, propylene glycol, glycerol, 1,4-butane diol, and 1,3-butane diol.

Exemplary basic compounds include primary, secondary and tertiary amine compounds, specifically amine compounds having a hydroxyl, ether, ester, lactone, cyano or sulfonic acid ester group, as described in JP-A 2008-111103, paragraphs [0146] to [0164], and compounds having a carbamate group, as described in JP 3790649.

Onium salts such as sulfonium salts, iodonium salts and ammonium salts of sulfonic acids which are not fluorinated at α-position as described in US 2008153030 (JP-A 2008-158339) and similar onium salts of carboxylic acid may be used as the quencher. While an α-position fluorinated sulfonic acid, imide acid, and methide acid are necessary to deprotect the acid labile group of carboxylic acid ester, an α-position non-fluorinated sulfonic acid and a carboxylic acid are released by salt exchange with an onium salt which is not fluorinated at α-position. An α-position non-fluorinated sulfonic acid and a carboxylic acid function as a quencher because they do not induce deprotection reaction. In particular, since sulfonium salts and iodonium salts of an α-position non-fluorinated sulfonic acid and a carboxylic acid are photo-decomposable, those portions receiving a high light intensity are reduced in quenching capability and increased in the concentration of a α-position fluorinated sulfonic acid, imide acid, or methide acid. As a result, the exposed portions are improved in contrast. When a negative tone pattern is formed using an organic solvent, the improvement in the contrast of exposed portions leads to an improvement in the rectangularity of negative pattern. Onium salts including sulfonium salts, iodonium salts and ammonium salts of an α-position non-fluorinated sulfonic acid and a carboxylic acid are highly effective in controlling the diffusion of an α-position fluorinated sulfonic acid, imide acid and methide acid. This is because the onium salt resulting from salt exchange is less mobile due to a higher molecular weight. In the event that a hole pattern is formed by negative development, since acid is generated in many regions, it is very important to control the diffusion of acid from the exposed area to the unexposed area. The addition of onium salts including sulfonium salts, iodonium salts and ammonium salts of an α-position non-fluorinated sulfonic acid and a carboxylic acid as well as the carbamate compound capable of generating an amine compound under the action of acid is very important from the aspect of controlling acid diffusion.

Exemplary surfactants are described in JP-A 2008-111103, paragraphs [0165] to [0166]. Exemplary dissolution regulators are described in JP-A 2008-122932 (US 2008090172), paragraphs [0155] to [0178], and exemplary acetylene alcohols in paragraphs [0179] to [0182].

Also a polymeric additive may be added for improving the water repellency on surface of a resist film as spin coated. This additive may be used in the topcoatless immersion lithography. These additives have a specific structure with a 1,1,1,3,3,3-hexafluoro-2-propanol residue and are described in JP-A 2007-297590 and JP-A 2008-111103. The water repellency improver to be added to the resist should be soluble in the organic solvent as the developer. The water repellency improver of specific structure with a 1,1,1,3,3,3-hexafluoro-2-propanol residue is well soluble in the developer. A polymer having an amino group or amine salt copolymerized as recurring units may serve as the water repellent additive and is effective for preventing evaporation of acid during PEB and avoiding any hole pattern opening failure after development. An appropriate amount of the water repellency improver is 0.1 to 20 parts, preferably 0.5 to 10 parts by weight per 100 parts by weight of the base resin.

Notably, an appropriate amount of the organic solvent is 100 to 10,000 parts, preferably 300 to 8,000 parts by weight, and an appropriate amount of the basic compound is 0.0001 to 30 parts, preferably 0.001 to 20 parts by weight, per 100 parts by weight of the base resin.

Process

The pattern forming process of the invention comprises the steps of coating the positive resist composition defined above onto a substrate, prebaking the resist composition to form a resist film, exposing a selected region of the resist film to high-energy radiation, baking (PEB), and developing the exposed resist film in an organic solvent-based developer so that the unexposed region of film is dissolved and the exposed region of film is left, thereby forming a negative tone pattern such as a hole or trench pattern.

Now referring to the drawings, the pattern forming process of the invention is illustrated in FIG. 1. First, the positive resist composition is coated on a substrate to form a resist film thereon. Specifically, a resist film 40 of a positive resist composition is formed on a processable substrate 20 disposed on a substrate 10 directly or via an intermediate intervening layer 30 as shown in FIG. 1A. The resist film preferably has a thickness of 10 to 1,000 nm and more preferably 20 to 500 nm. Prior to exposure, the resist film is heated or prebaked, preferably at a temperature of 60 to 180° C., especially 70 to 150° C. for a time of 10 to 300 seconds, especially 15 to 200 seconds.

The substrate 10 used herein is generally a silicon substrate. The processable substrate (or target film) 20 used herein includes $SiO_2$, SiN, SiON, SiOC, p-Si, α-Si, TiN, WSi, BPSG, SOG, Cr, CrO, CrON, MoSi, low dielectric film, and etch stopper film. The intermediate intervening layer 30 includes hard masks of $SiO_2$, SiN, SiON or p-Si, an undercoat in the form of carbon film, a silicon-containing intermediate film, and an organic antireflective coating.

Figure 1B:
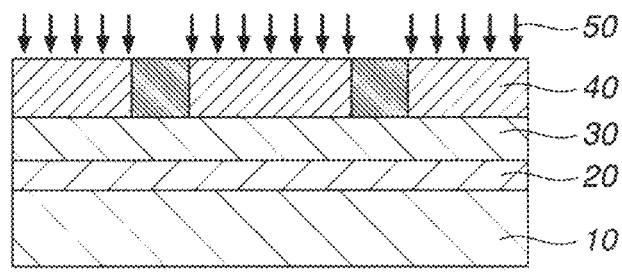
FIG. 1B shows the resist film being exposed.

Next comes exposure depicted at 50 in FIG. 1B. For the exposure, preference is given to high-energy radiation having a wavelength of 140 to 250 nm and EUV having a wavelength of 13.5 nm or electron beam, and especially ArF excimer laser radiation of 193 nm wavelength. The exposure may be done either in a dry atmosphere such as air or nitrogen stream or by immersion lithography in water. The ArF immersion lithography uses deionized water or liquids having a refractive index of at least 1 and highly transparent to the exposure wavelength such as alkanes as the immersion solvent. The immersion lithography involves exposing the prebaked resist film to light through a projection lens, with water introduced between the resist film and the projection lens. Since this allows lenses to be designed to a NA of 1.0 or higher, formation of finer feature size patterns is possible. The immersion lithography is important for the ArF lithography to survive to the 45-nm node. In the case of immersion lithography, deionized water rinsing (or post-soaking) may be carried out after exposure for removing water droplets left on the resist film, or a protective film may be applied onto the resist film after pre-baking for preventing any leach-out from the resist film and improving water slip on the film surface.

The resist protective film used in the immersion lithography is preferably formed from a solution of a polymer having 1,1,1,3,3,3-hexafluoro-2-propanol residues which is insoluble in water, but soluble in an alkaline developer, in a solvent selected from alcohols of at least 4 carbon atoms, ethers of 8 to 12 carbon atoms, and mixtures thereof. The protective film-forming composition used herein may be based on a polymer comprising recurring units derived from a monomer having a 1,1,1,3,3,3-hexafluoro-2-propanol residue. While the protective film must dissolve in the organic solvent developer, the polymer comprising recurring units derived from a monomer having a 1,1,1,3,3,3-hexafluoro-2-propanol residue dissolves in the aforementioned organic solvent developers. In particular, protective film-forming materials having 1,1,1,3,3,3-hexafluoro-2-propanol residues as described in JP-A 2007-025634 and 2008-003569 readily dissolve in the organic solvent-based developer.

In the protective film-forming composition, an amine compound or amine salt may be added, or a polymer comprising recurring units containing an amino group or amine salt copolymerized therein may be used as the base resin. This component is effective for controlling diffusion of the acid generated in the exposed region of the resist film to the unexposed region for thereby preventing any hole opening failure. A useful protective film-forming composition having an amine compound added thereto is described in JP-A 2008-003569. A useful protective film-forming composition containing a polymer having an amino group or amine salt copolymerized therein is described in JP-A 2007-316448. The amine compound or amine salt may be selected from the compounds enumerated as the basic compound to be added to the resist composition. An appropriate amount of the amine compound or amine salt added is 0.01 to 10 parts, preferably 0.02 to 8 parts by weight per 100 parts by weight of the base resin.

After formation of the resist film, deionized water rinsing (or post-soaking) may be carried out for extracting the acid generator and other components from the film surface or washing away particles, or after exposure, rinsing (or post-soaking) may be carried out for removing water droplets left on the resist film. If the acid evaporating from the exposed region during PEB deposits on the unexposed region to deprotect the protective group on the surface of the unexposed region, there is a possibility that the surface edges of holes after development are bridged to close the holes. Particularly in the case of negative development, regions surrounding the holes receive light so that acid is generated therein. There is a possibility that the holes are not opened if the acid outside the holes evaporates and deposits inside the holes during PEB. Provision of a protective film is effective for preventing evaporation of acid and for avoiding any hole opening failure. A protective film having an amine compound or amine salt added thereto is more effective for preventing acid evaporation. On the other hand, a protective film formed of a composition comprising a polymer and an acidic compound having a carboxyl or sulfo group or a composition comprising a polymer having an acidic compound having a carboxyl or sulfo group copolymerized therein is not preferred because a hole opening failure can occur.

The other embodiment is a pattern forming process comprising the steps of applying a resist composition comprising a polymer comprising recurring units having a hydroxyl group substituted with an acid labile group, an acid generator, and an organic solvent onto a substrate, prebaking the composition to form a resist film, forming a protective film on the resist film, exposing the resist film to high-energy radiation, baking, and applying an organic solvent-based developer to dissolve away the protective film and the unexposed region of the resist film for forming a negative pattern wherein the exposed region of film is not dissolved. The protective film is preferably formed from a composition comprising a polymer bearing a 1,1,1,3,3,3-hexafluoro-2-propanol residue and an amino group or amine salt-containing compound, or a composition comprising a polymer comprising recurring units having a 1,1,1,3,3,3-hexafluoro-2-propanol residue and recurring units having an amino group or amine salt copolymerized, the composition further comprising an alcohol solvent of at least 4 carbon atoms, an ether solvent of 8 to 12 carbon atoms, or a mixture thereof.

Examples of suitable recurring units having a 1,1,1,3,3,3-hexafluoro-2-propanol residue include some of the monomers listed on pages 31 to 33, with polymers resulting from monomers having an unsubstituted hydroxyl group being suitable. Examples of the amino group-containing compound include the amine compounds described in JP-A 2008-111103, paragraphs [0146] to [0164] as being added to photoresist compositions. Examples of the amine salt-containing compound include salts of the foregoing amine compounds with carboxylic acids or sulfonic acids.

Suitable alcohols of 4 or more carbon atoms include 1-butyl alcohol, 2-butyl alcohol, isobutyl alcohol, tert-butyl alcohol, 1-pentanol, 2-pentanol, 3-pentanol, tert-amyl alcohol, neopentyl alcohol, 2-methyl-1-butanol, 3-methyl-1-butanol, 3-methyl-3-pentanol, cyclopentanol, 1-hexanol, 2-hexanol, 3-hexanol, 2,3-dimethyl-2-butanol, 3,3-dimethyl-1-butanol, 3,3-dimethyl-2-butanol, 2-ethyl-1-butanol, 2-methyl-1-pentanol, 2-methyl-2-pentanol, 2-methyl-3-pentanol, 3-methyl-1-pentanol, 3-methyl-2-pentanol, 3-methyl-3-pentanol, 4-methyl-1-pentanol, 4-methyl-2-pentanol, 4-methyl-3-pentanol, cyclohexanol, and 1-octanol. Suitable ether solvents of 8 to 12 carbon atoms include di-n-butyl ether, diisobutyl ether, di-sec-butyl ether, di-n-pentyl ether, diisopentyl ether, di-sec-pentyl ether, di-tert-amyl ether, and di-n-hexyl ether.

Exposure is preferably performed in an exposure dose of about 1 to 200 mJ/cm$^2$, more preferably about 10 to 100 mJ/cm$^2$. This is followed by baking (PEB) on a hot plate at 60 to 150° C. for 1 to 5 minutes, preferably at 80 to 120° C. for 1 to 3 minutes.

Figure 1C:
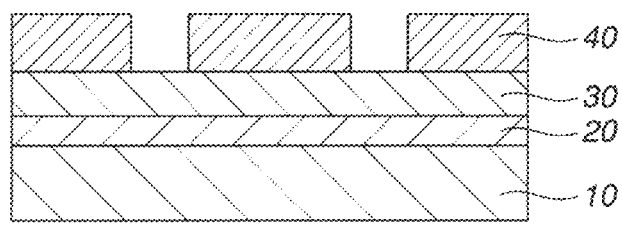
FIG. 1C shows the resist film being developed in an organic solvent.

Thereafter the exposed resist film is developed with an organic solvent-based developer for 0.1 to 3 minutes, preferably 0.5 to 2 minutes by any conventional techniques such as dip, puddle and spray techniques. In this way, the unexposed region of resist film is dissolved away, leaving a negative resist pattern 40 on the substrate 10 as shown in FIG. 1C.

The organic solvent used as the developer is preferably selected from among ketones such as 2-octanone, 2-nonanone, 2-heptanone, 3-heptanone, 4-heptanone, 2-hexanone, 3-hexanone, diisobutyl ketone, methylcyclohexanone, acetophenone, and methylacetophenone; and esters such as propyl acetate, butyl acetate, isobutyl acetate, amyl acetate, isoamyl acetate, butenyl acetate, phenyl acetate, propyl formate, butyl formate, isobutyl formate, amyl formate, isoamyl formate, methyl valerate, methyl pentenoate, methyl crotonate, ethyl crotonate, methyl lactate, ethyl lactate, propyl lactate, butyl lactate, isobutyl lactate, amyl lactate, isoamyl lactate, methyl 2-hydroxyisobutyrate, ethyl 2-hydroxyisobutyrate, methyl benzoate, ethyl benzoate, benzyl acetate, methyl phenylacetate, benzyl formate, phenylethyl formate, methyl 3-phenylpropionate, benzyl propionate, ethyl phenylacetate, and 2-phenylethyl acetate. These organic solvents may be used alone or in admixture of two or more.

At the end of development, the resist film is rinsed. As the rinsing liquid, a solvent which is miscible with the developer and does not dissolve the resist film is preferred. Suitable solvents include alcohols of 3 to 10 carbon atoms, ether compounds of 8 to 12 carbon atoms, alkanes, alkenes, and alkynes of 6 to 12 carbon atoms, and aromatic solvents. Specifically, suitable alkanes of 6 to 12 carbon atoms include hexane, heptane, octane, nonane, decane, undecane, dodecane, methylcyclopentane, dimethylcyclopentane, cyclohexane, methylcyclohexane, dimethylcyclohexane, cycloheptane, cyclooctane, and cyclononane. Suitable alkenes of 6 to 12 carbon atoms include hexene, heptene, octene, cyclohexene, methylcyclohexene, dimethylcyclohexene, cycloheptene, and cyclooctene. Suitable alkynes of 6 to 12 carbon atoms include hexyne, heptyne, and octyne. Suitable alcohols of 3 to 10 carbon atoms include n-propyl alcohol, isopropyl alcohol, 1-butyl alcohol, 2-butyl alcohol, isobutyl alcohol, tert-butyl alcohol, 1-pentanol, 2-pentanol, 3-pentanol, tert-amyl alcohol, neopentyl alcohol, 2-methyl-1-butanol, 3-methyl-1-butanol, 3-methyl-3-pentanol, cyclopentanol, 1-hexanol, 2-hexanol, 3-hexanol, 2,3-dimethyl-2-butanol, 3,3-dimethyl-1-butanol, 3,3-dimethyl-2-butanol, 2-ethyl-1-butanol, 2-methyl-1-pentanol, 2-methyl-2-pentanol, 2-methyl-3-pentanol, 3-methyl-1-pentanol, 3-methyl-2-pentanol, 3-methyl-3-pentanol, 4-methyl-1-pentanol, 4-methyl-2-pentanol, 4-methyl-3-pentanol, cyclohexanol, and 1-octanol. Suitable ether compounds of 8 to 12 carbon atoms include di-n-butyl ether, diisobutyl ether, di-sec-butyl ether, di-n-pentyl ether, diisopentyl ether, di-sec-pentyl ether, di-tert-amyl ether, and di-n-hexyl ether. The solvents may be used alone or in admixture. Besides the foregoing solvents, aromatic solvents may be used, for example, toluene, xylene, ethylbenzene, isopropylbenzene, tert-butylbenzene and mesitylene.

Where a hole pattern is formed by negative tone development, exposure by double dipole illuminations of X- and Y-direction line patterns provides the highest contrast light. The contrast may be further increased by combining dipole illumination with s-polarized illumination.

In a preferred embodiment, the exposure step is carried out by lithography using a halftone phase shift mask bearing a lattice-like shifter pattern, whereby a pattern of holes is formed at the intersections between gratings of the lattice-like shifter pattern after development. In a further preferred embodiment, the halftone phase shift mask bearing a lattice-like shifter pattern has a transmittance of 3 to 15%. In a further preferred embodiment, the phase shift mask used is a phase shift mask including a lattice-like first shifter having a line width equal to or less than a half pitch and a second shifter arrayed on the first shifter and consisting of lines whose on-wafer size is 2 to 30 nm thicker than the line width of the first shifter, whereby a pattern of holes is formed only where the thick shifter is arrayed. In a further preferred embodiment, the phase shift mask used is a phase shift mask including a lattice-like first shifter having a line width equal to or less than a half pitch and a second shifter arrayed on the first shifter and consisting of dots whose on-wafer size is 2 to 100 nm thicker than the line width of the first shifter, whereby a pattern of holes is formed only where the thick shifter is arrayed.

Figure 2:
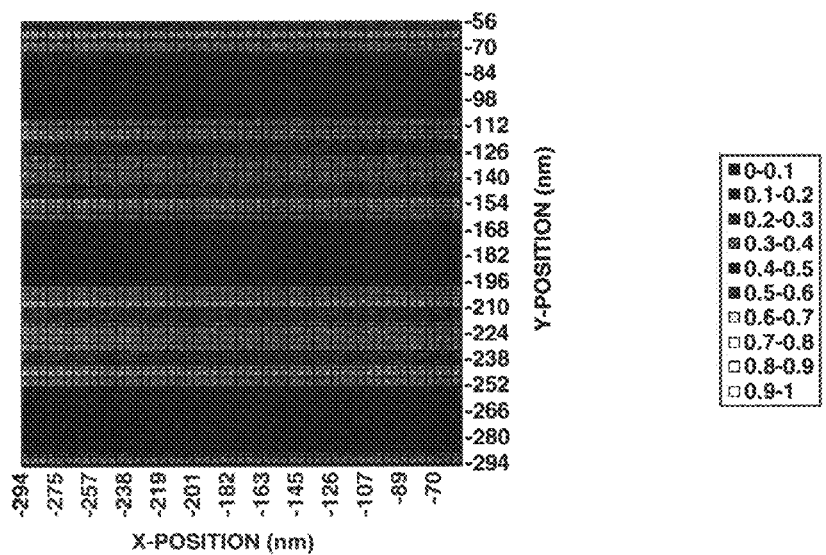
FIG. 2 is an optical image of X-direction lines having a pitch of 90 nm and a line size of 45 nm printed under conditions: ArF excimer laser of wavelength 193 nm, NA 1.3 lens, dipole illumination, 6% halftone phase shift mask, and s-polarization.
Figure 3:
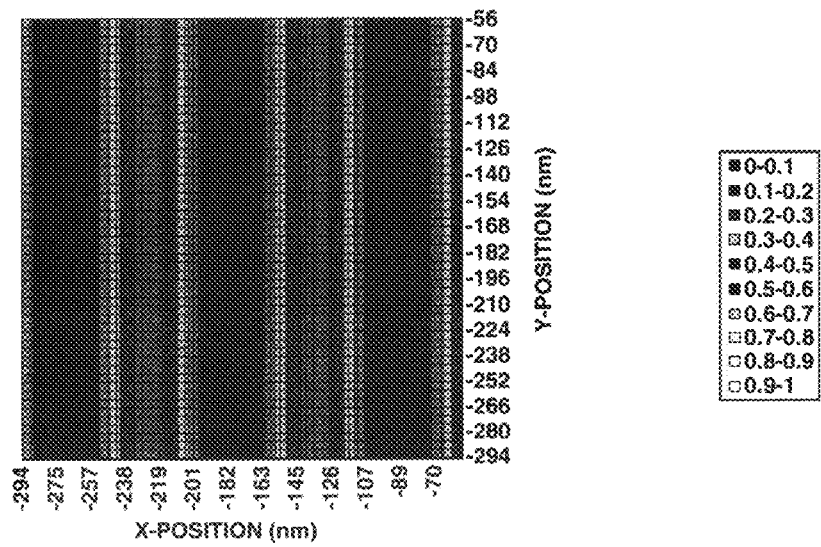
FIG. 3 is an optical image of Y-direction lines like FIG. 2.
Figure 4:
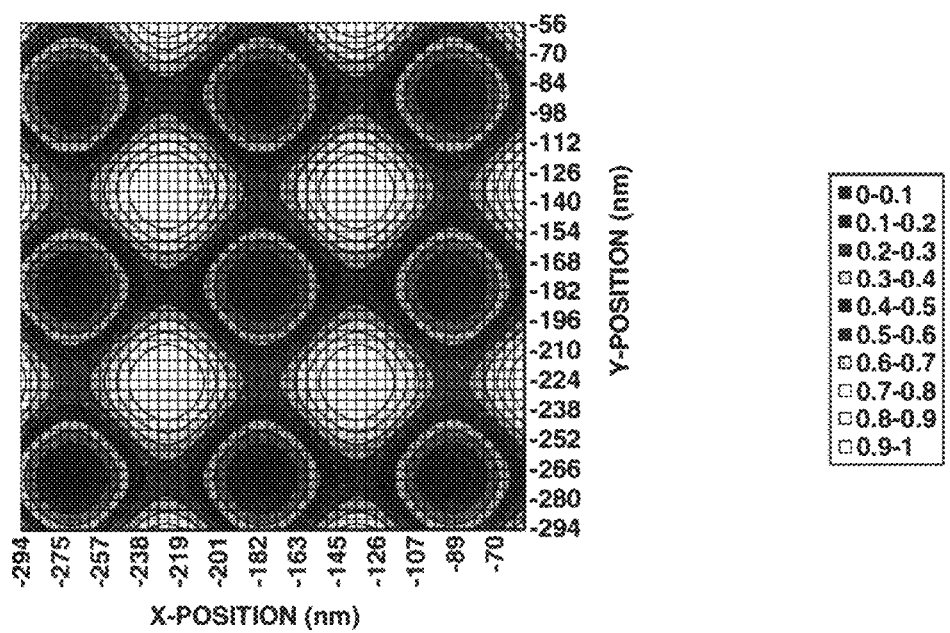
FIG. 4 shows a contrast image obtained by overlaying the optical image of X-direction lines in FIG. 2 with the optical image of Y-direction lines in FIG. 3.

FIG. 2 is an optical image of X-direction lines having a pitch of 90 nm and a line size of 45 nm printed under conditions: ArF excimer laser of wavelength 193 nm, NA 1.3 lens, dipole illumination, 6% halftone phase shift mask, and s-polarization. FIG. 3 is an optical image of Y-direction lines having a pitch of 90 nm and a line size of 45 nm printed under conditions: ArF excimer laser of wavelength 193 nm, NA 1.3 lens, dipole illumination, 6% halftone phase shift mask, and s-polarization. A black area is a light shielded area while a white area is a high light intensity area. A definite contrast difference is recognized between white and black, indicating the presence of a fully light shielded area. FIG. 4 shows a contrast image obtained by overlaying the optical image of X-direction lines in FIG. 2 with that of Y-direction lines in FIG. 3. Against the expectation that a combination of X and Y lines may form a lattice-like image, weak light black areas draw circular shapes. As the pattern (circle) size becomes larger, the circular shape changes to a rhombic shape to merge with adjacent ones. As the circle size becomes smaller, circularity is improved, which is evidenced by the presence of a fully light shielded small circle.

Exposure by double dipole illuminations of X- and Y-direction lines combined with polarized illumination presents a method of forming light of the highest contrast. This method, however, has the drawback that the throughput is substantially reduced by double exposures and mask exchange therebetween. To continuously carry out two exposures while exchanging a mask, the exposure tool must be equipped with two mask stages although the existing exposure tool includes a single mask stage. Higher throughputs may be obtained by carrying out exposure of X direction lines continuously on 25 wafers in a front-opening unified pod (FOUP), exchanging the mask, and carrying out exposure continuously on the same 25 wafers, rather than exchanging a mask on every exposure of a single wafer. However, a problem arises that as the time duration until the first one of 25 wafers is exposed in the second exposure is prolonged, the environment affects the resist such that the resist after development may change its size and shape. To block the environmental impact on wafers in standby until the second exposure, it is effective that the resist film is overlaid with a protective film.

To proceed with a single mask, it is proposed in Non-Patent Document 1 to carry out two exposures by dipole illuminations in X and Y directions using a mask bearing a lattice-like pattern. When this method is compared with the above method using two masks, the optical contrast is somewhat reduced, but the throughput is improved by the use of a single mask. As described in Non-Patent Document 1, the method involves forming X-direction lines in a first photoresist film by X-direction dipole illumination using a mask bearing a lattice-like pattern, insolubilizing the X-direction lines by light irradiation, coating a second photoresist film thereon, and forming Y-direction lines by Y-direction dipole illumination, thereby forming holes at the interstices between X- and Y-direction lines. Although only a single mask is needed, this method includes additional steps of insolubilizing the first photoresist pattern between the two exposures, and coating and developing the second photoresist film. Then the wafer must be removed from the exposure stage between the two exposures, giving rise to the problem of an increased alignment error. To minimize the alignment error between two exposures, two exposures must be continuously carried out without removing the wafer from the exposure stage.

Figure 21:
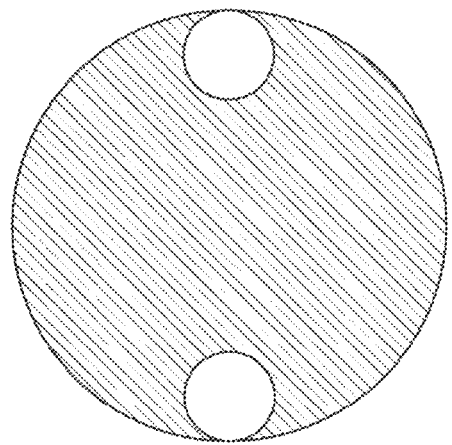
FIG. 21 illustrates an aperture configuration in an exposure tool of dipole illumination for enhancing the contrast of X-direction lines.
Figure 22:
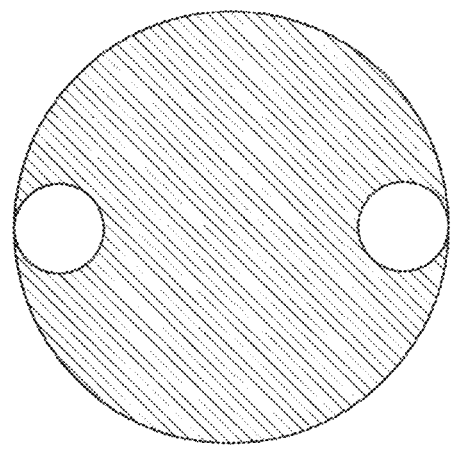
FIG. 22 illustrates an aperture configuration in an exposure tool of dipole illumination for enhancing the contrast of Y-direction lines.

FIG. 21 shows the shape of apertures for dipole illumination for forming X-direction or horizontal lines using a mask bearing a lattice-like pattern, and FIG. 22 shows the shape of apertures for dipole illumination for forming Y-direction or vertical lines. The addition of s-polarized illumination to dipole illumination provides a further improved contrast and is thus preferably employed. After two exposures for forming X- and Y-direction lines using a lattice-like mask are performed in an overlapping manner, negative tone development is performed to form a hole pattern.

Figure 23:
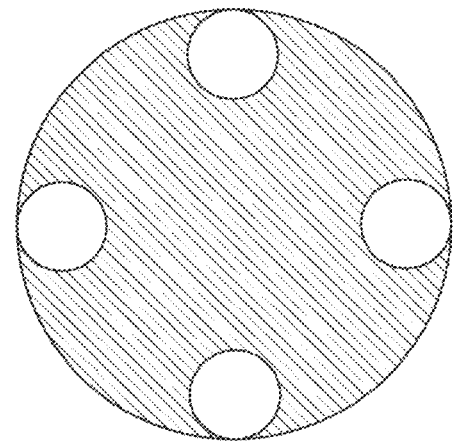
FIG. 23 illustrates an aperture configuration in an exposure tool of cross-pole illumination for enhancing the contrast of both X and Y-direction lines.

When it is desired to form a hole pattern via a single exposure using a lattice-like mask, a quadra-pole illumination or cross-pole illumination in the aperture configuration shown in FIG. 23 is used. The contrast may be improved by combining it with X-Y polarized illumination or azimuthally polarized illumination of circular polarization.

In the hole pattern forming process of the invention, when two exposures are involved, these exposures are carried out by changing the illumination and mask for the second exposure from those for the first exposure, whereby a fine size pattern can be formed at the highest contrast and to dimensional uniformity. The masks used in the first and second exposures bear first and second patterns of intersecting lines whereby a pattern of holes at intersections of lines is formed in the resist film after development. The first and second lines are preferably at right angles although an angle of intersection other than 90° may be employed. The first and second lines may have the same or different size and/or pitch. If a single mask bearing first lines in one area and second lines in a different area is used, it is possible to perform first and second exposures continuously. In this case, however, the maximum area available for exposure is one half. Notably, the continuous exposures lead to a minimized alignment error. Of course, the single exposure provides a smaller alignment error than the two continuous exposures.

Figure 5:
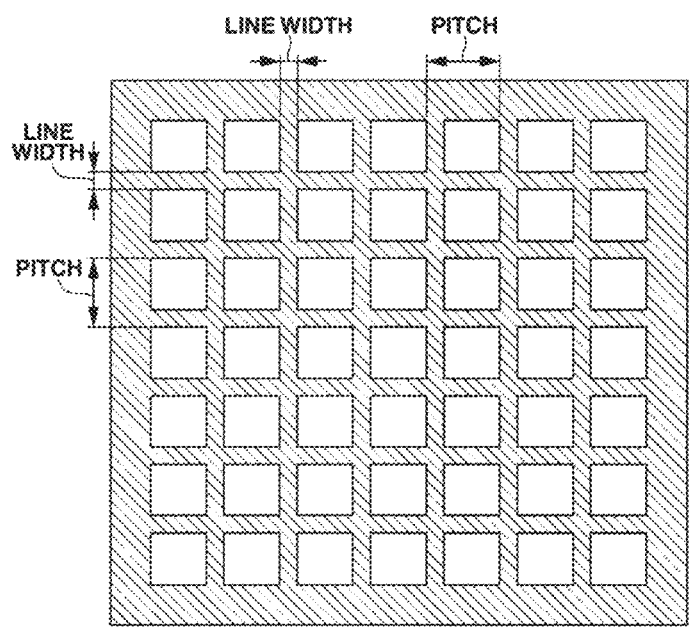
FIG. 5 illustrates a mask bearing a lattice-like pattern.
Figure 7:
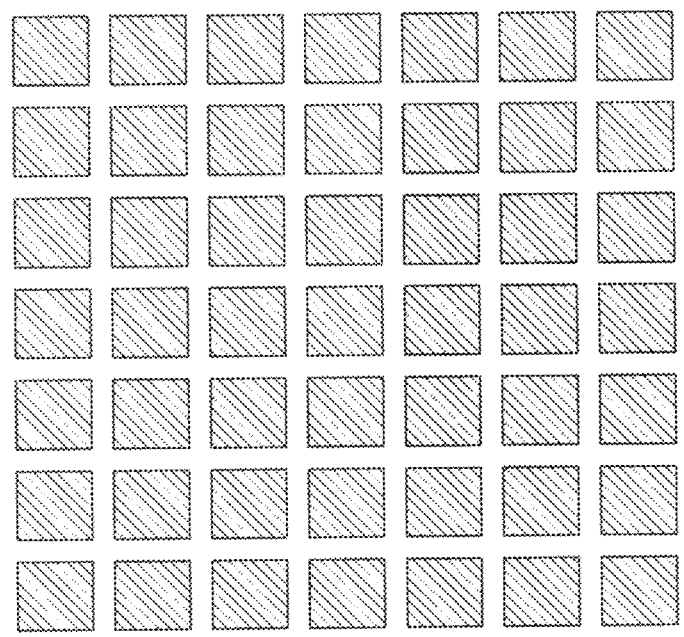
FIG. 7 illustrates a mask bearing a dot pattern of square dots having a pitch of 90 nm and a side width of 60 nm.
Figure 19:
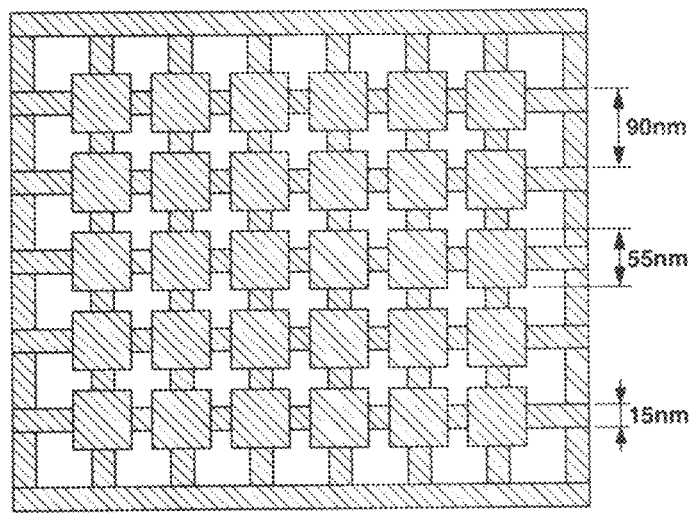
FIG. 19 illustrates a mask having dots arrayed on a lattice-like pattern, used in ArF lithography patterning tests 3 and 6.

When two exposures are performed using a single mask without reducing the exposure area, the mask pattern may be a lattice-like pattern as shown in FIG. 5, a dot pattern as shown in FIG. 7, or a combination of a dot pattern and a lattice-like pattern as shown in FIG. 19. The use of a lattice-like pattern contributes to the most improved light contrast, but has the drawback of a reduced resist sensitivity due to a lowering of light intensity. On the other hand, the use of a dot pattern suffers a lowering of light contrast, but provides the merit of an improved resist sensitivity.

Where holes are arrayed in horizontal and vertical directions, the above-described illumination and mask pattern are used. Where holes are arrayed at a different angle, for example, at an angle of 45°, a mask of a 45° arrayed pattern is combined with dipole illumination or cross-pole illumination.

Where two exposures are performed, a first exposure by a combination of dipole illumination with polarized illumination for enhancing the contrast of X-direction lines is followed by a second exposure by a combination of dipole illumination with polarized illumination for enhancing the contrast of Y-direction lines. Two continuous exposures with the X- and Y-direction contrasts emphasized through a single mask can be performed on a currently commercially available scanner.

The method of combining X and Y polarized illuminations with cross-pole illumination using a mask bearing a lattice-like pattern can form a hole pattern through a single exposure, despite a slight lowering of light contrast as compared with two exposures of dipole illumination. The method is estimated to attain a substantial improvement in throughput and avoids the problem of misalignment between two exposures.

Using such a mask and illumination, a hole pattern of the order of 40 nm can be formed at a practically acceptable cost.

Figure 6:
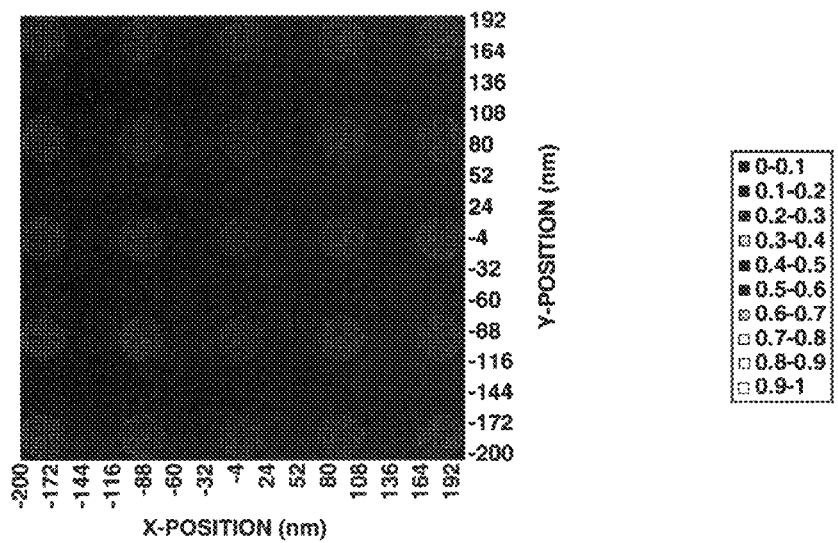
FIG. 6 is an optical image of a lattice-like line pattern having a pitch of 90 nm and a line width of 30 nm printed under conditions: NA 1.3 lens, cross-pole illumination, 6% halftone phase shift mask, and azimuthally polarized illumination.

On use of a mask bearing a lattice-like pattern as shown in FIG. 5 where light is fully shielded at intersections between gratings, black spots having a very high degree of light shielding appear as shown in FIG. 6. FIG. 6 is an optical image of a lattice-like line pattern having a pitch of 90 nm and a line width of 30 nm printed under conditions: NA 1.3 lens, cross-pole illumination, 6% halftone phase shift mask, and azimuthally polarized illumination. A fine hole pattern may be formed by performing exposure through a mask bearing such a pattern and organic solvent development entailing positive/negative reversal.

Figure 8:
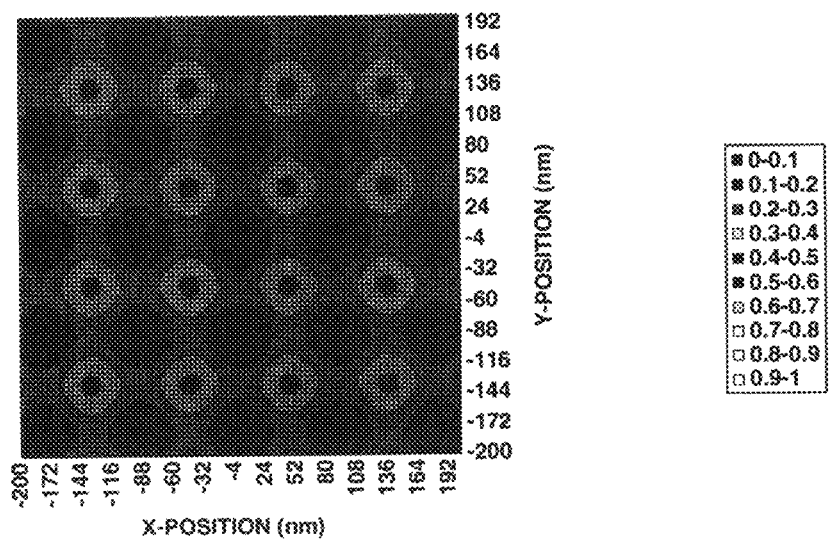
FIG. 8 is an optical image resulting from the mask of FIG. 7, printed under conditions: NA 1.3 lens, cross-pole illumination, 6% halftone phase shift mask, and azimuthally polarized illumination, showing its contrast.

On use of a mask bearing a dot pattern of square dots having a pitch of 90 nm and a side width of 60 nm as shown in FIG. 7, under conditions: NA 1.3 lens, cross-pole illumination, 6% halftone phase shift mask, and azimuthally polarized illumination, an optical image is obtained as shown in FIG. 8 that depicts the contrast thereof. Although the circle of fully light shielded spot in FIG. 8 has a smaller area than in FIG. 6, which indicates a low contrast as compared with the lattice-like pattern mask, the formation of a hole pattern is possible owing to the presence of black or light shielded spots.

It is difficult to form a fine hole pattern that holes are randomly arrayed at varying pitch and position. The super-resolution technology using off-axis illumination (such as dipole or cross-pole illumination) in combination with a phase shift mask and polarization is successful in improving the contrast of dense (or grouped) patterns, but not so the contrast of isolated patterns.

When the super-resolution technology is applied to repeating dense patterns, the pattern density bias between dense and isolated patterns, known as proximity bias, becomes a problem. As the super-resolution technology used becomes stronger, the resolution of a dense pattern is more improved, but the resolution of an isolated pattern remains unchanged. Then the proximity bias is exaggerated. In particular, an increase of proximity bias in a hole pattern resulting from further miniaturization poses a serious problem. One common approach taken to suppress the proximity bias is by biasing the size of a mask pattern. Since the proximity bias varies with properties of a photoresist composition, specifically dissolution contrast and acid diffusion, the proximity bias of a mask varies with the type of photoresist composition. For a particular type of photoresist composition, a mask having a different proximity bias must be used. This adds to the burden of mask manufacturing. Then the pack and unpack (PAU) method is proposed in Proc. SPIE Vol. 5753, p 171 (2005), which involves strong super-resolution illumination of a first positive resist to resolve a dense hole pattern, coating the first positive resist pattern with a negative resist film material in alcohol solvent which does not dissolve the first positive resist pattern, exposure and development of an unnecessary hole portion to close the corresponding holes, thereby forming both a dense pattern and an isolated pattern. One problem of the PAU method is misalignment between first and second exposures, as the authors point out in the report. The hole pattern which is not closed by the second development experiences two developments and thus undergoes a size change, which is another problem.

Figure 9:
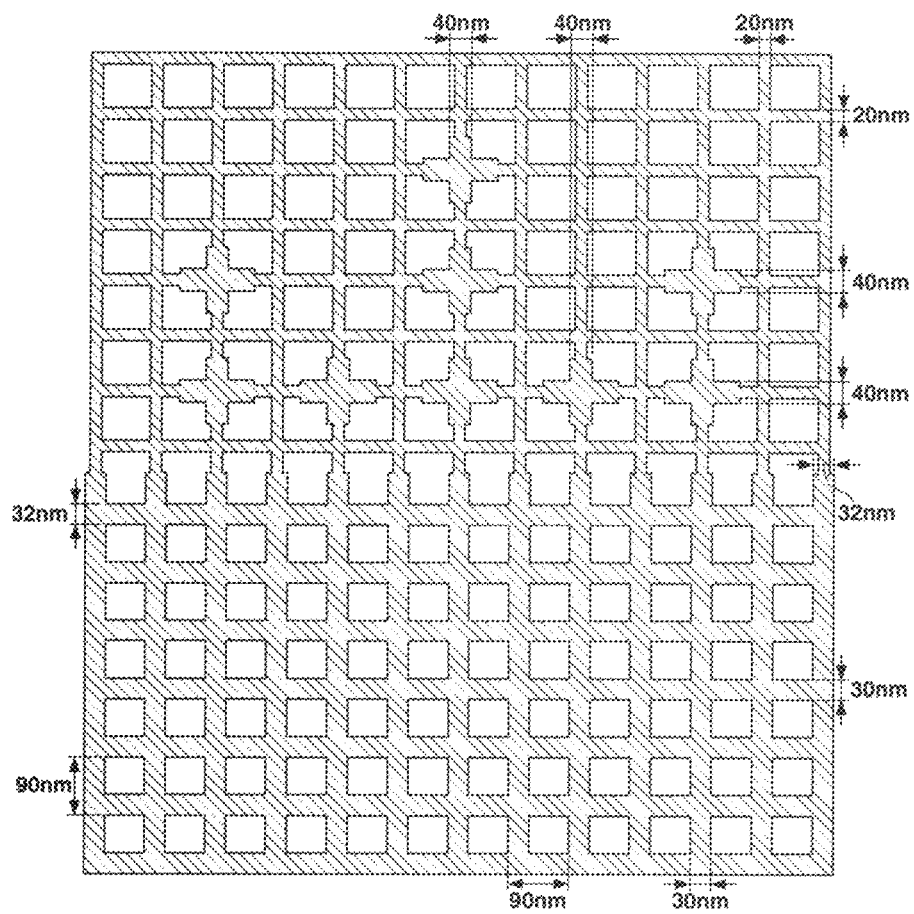
FIG. 9 illustrates a mask bearing a lattice-like pattern having a pitch of 90 nm and a line width of 20 nm on which thick crisscross or intersecting line segments are disposed where dots are to be formed.
Figure 10:
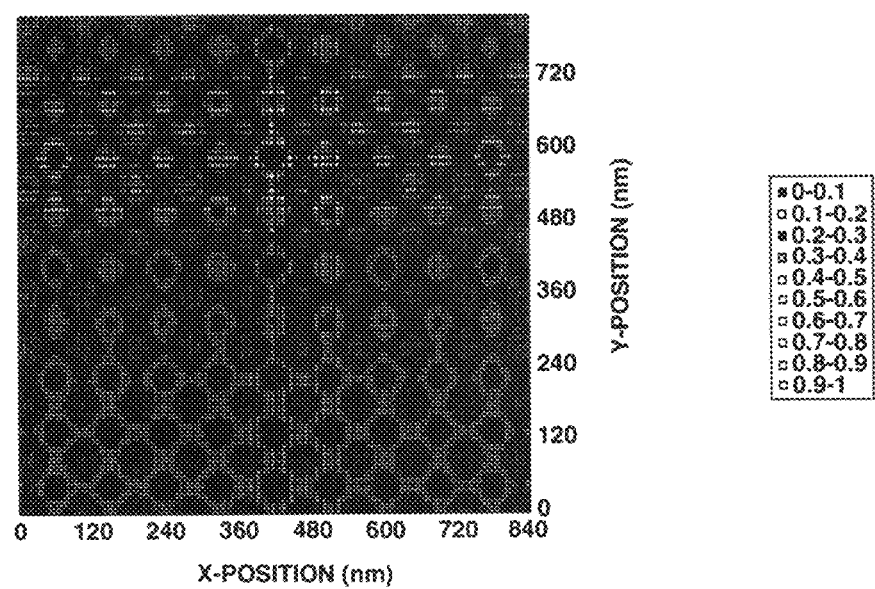
FIG. 10 is an optical image resulting from the mask of FIG. 9, showing its contrast.

To form a random pitch hole pattern by organic solvent development entailing positive/negative reversal, a mask is used in which a lattice-like pattern is arrayed over the entire surface and the width of gratings is thickened only where holes are to be formed. As shown in FIG. 9, on a lattice-like pattern having a pitch of 90 nm and a line width of 20 nm, thick crisscross or intersecting line segments are disposed where dots are to be formed. A black area corresponds to the halftone shifter portion. Line segments with a width of 30 nm are disposed in the dense pattern portion whereas thicker line segments (width 40 nm in FIG. 9) are disposed in more isolated pattern portions. Since the isolated pattern provides light with a lower intensity than the dense pattern, thicker line segments are used. Since the peripheral area of the dense pattern provides light with a relatively low intensity, line segments having a width of 32 nm are assigned to the peripheral area which width is slightly greater than that in the internal area of the dense pattern. FIG. 10 shows an optical image from the mask of FIG. 9, indicating the contrast thereof. Black or light shielded areas are where holes are formed via positive/negative reversal. Black spots are found at positions other than where holes are formed, but few are transferred in practice because they are of small size. Optimization such as reduction of the width of grating lines corresponding to unnecessary holes can inhibit transfer of unnecessary holes.

Figure 11:
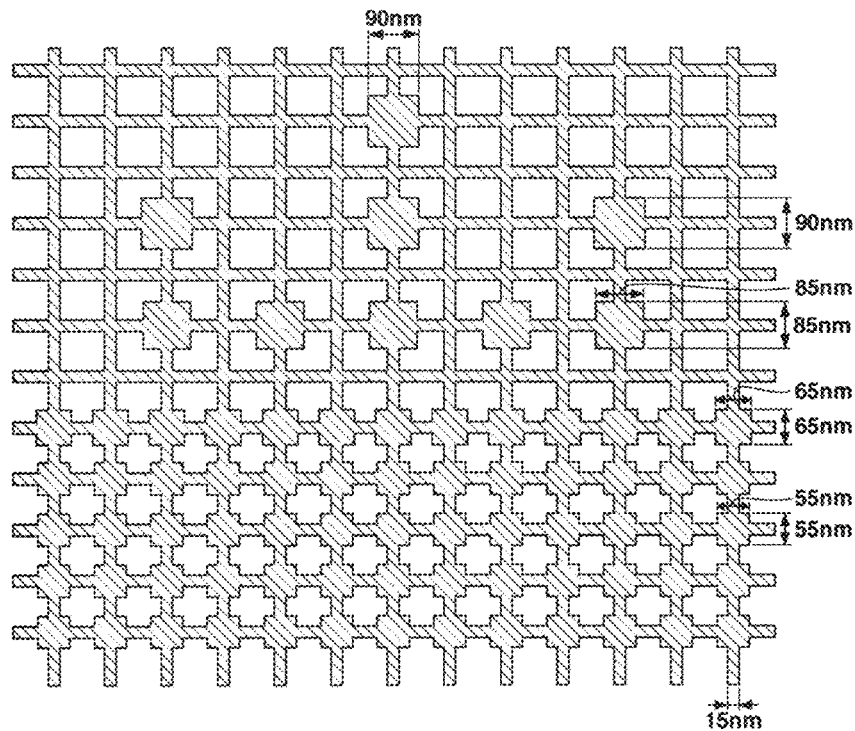
FIG. 11 illustrates a mask bearing a lattice-like pattern having a pitch of 90 nm and a line width of 15 nm on which thick dots are disposed where dots are to be formed.

Also useful is a mask in which a lattice-like pattern is arrayed over the entire surface and thick dots are disposed only where holes are to be formed. As shown in FIG. 11, on a lattice-like pattern having a pitch of 90 nm and a line width of 15 nm, thick dots are disposed where dots are to be formed. A black area corresponds to the halftone shifter portion. Square dots having one side with a size of 55 nm are disposed in the dense pattern portion whereas larger square dots (side size 90 nm in FIG. 11) are disposed in more isolated pattern portions. Although square dots are shown in the figure, the dots may have any shape including rectangular, rhombic, pentagonal, hexagonal, heptagonal, octagonal, and polygonal shapes and even circular shape.

Figure 12:
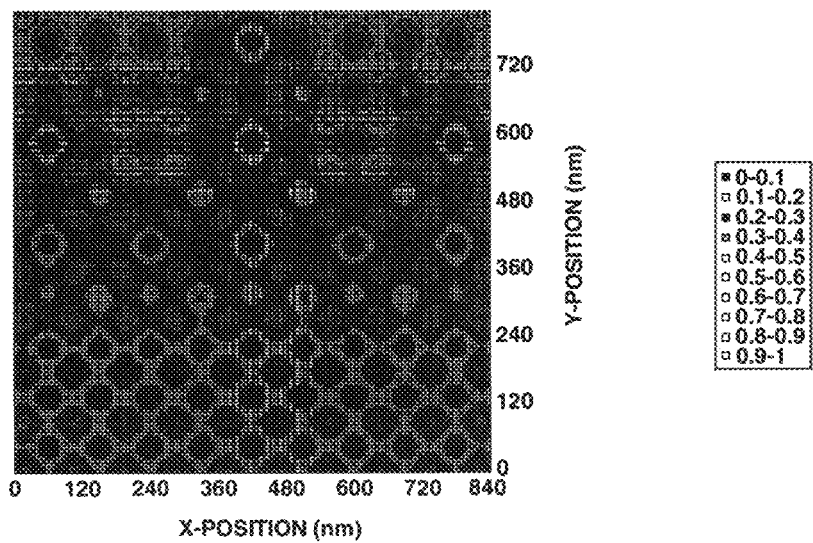
FIG. 12 is an optical image resulting from the mask of FIG. 11, showing its contrast.

FIG. 12 shows an optical image from the mask of FIG. 11, indicating the contrast thereof. The presence of black or light shielded spots substantially equivalent to those of FIG. 10 indicates that holes are formed via positive/negative reversal.

Figure 13:
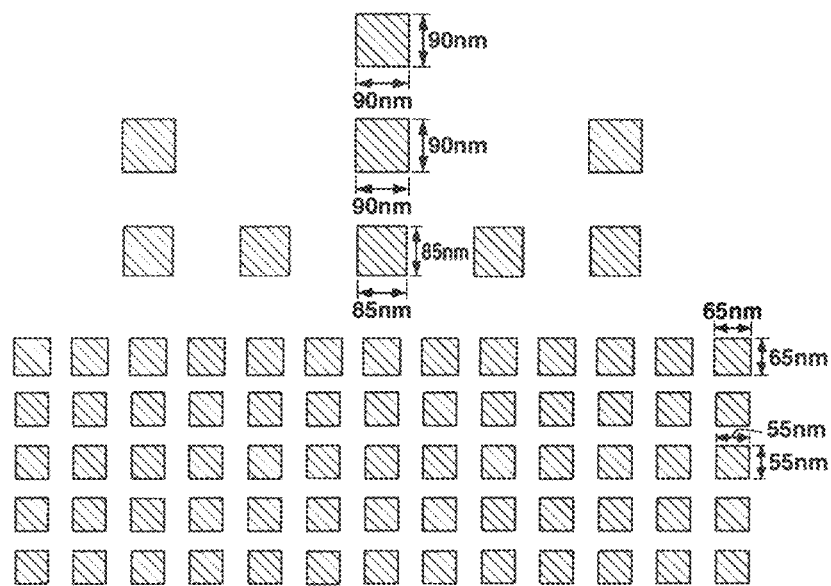
FIG. 13 illustrates a mask without a lattice-like pattern.
Figure 14:
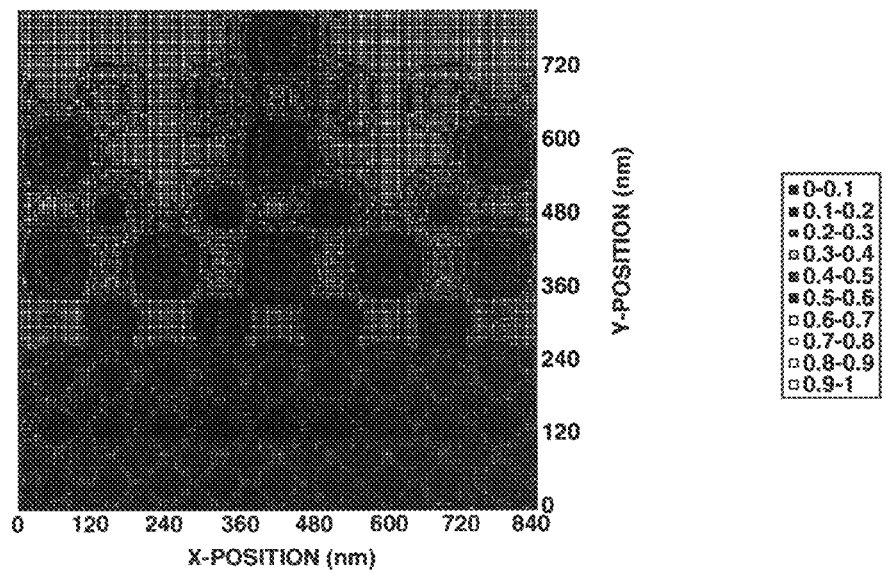
FIG. 14 is an optical image resulting from the mask of FIG. 13, showing its contrast.

On use of a mask bearing no lattice-like pattern arrayed as shown in FIG. 13, black or light shielded spots do not appear as shown in FIG. 14. In this case, holes are difficult to form, or even if holes are formed, a variation of mask size is largely reflected by a variation of hole size because the optical image has a low contrast.

EXAMPLE

Examples of the invention are given below by way of illustration and not by way of limitation. The abbreviation "pbw" is parts by weight. For all polymers, Mw and Mn are determined by GPC versus polystyrene standards using tetrahydrofuran solvent. For pattern profile observation, a top-down scanning electron microscope (TDSEM) S-9380 (Hitachi High Technologies Corp.) was used.

Synthesis Example

Various polymers (Resist Polymers 1 to 13 and Comparative Resist Polymers 1, 2) for use in resist compositions were prepared by combining suitable monomers, effecting copolymerization reaction, pouring into methanol for crystallization, repeatedly washing with hexane, isolation, and drying. Specifically, Resist Polymers 1, 2 and Comparative Resist Polymer 2 were prepared by copolymerization reaction in dichloromethane in the presence of palladium ethylhexanoate and tris(perfluorophenyl)borane as catalyst. For the other resist polymers, copolymerization reaction was performed in tetrahydrofuran solvent in the presence of 2,2'-azobisisobytyronitrile (AIBN) as catalyst. The polymers were analyzed by $^1$H-NMR to determine their composition and by GPC to determine Mw and dispersity Mw/Mn.

Resist Polymer 1
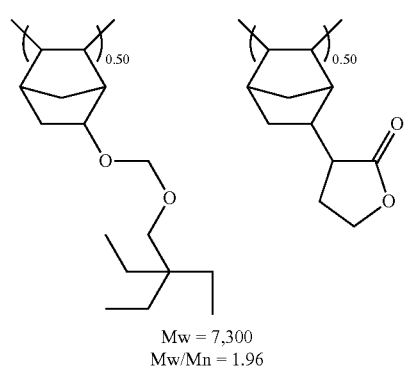
Mw = 7,300
Mw/Mn = 1.96
Resist Polymer 2
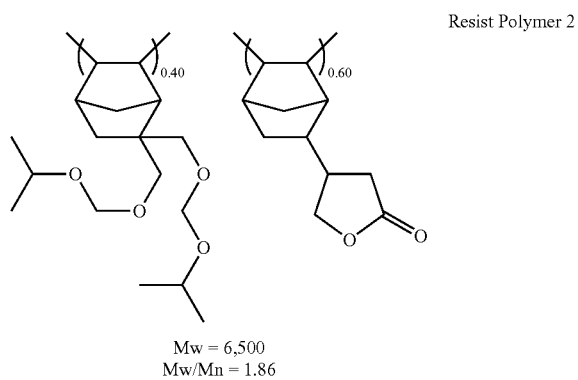
Mw = 6,500
Mw/Mn = 1.86
Resist Polymer 3
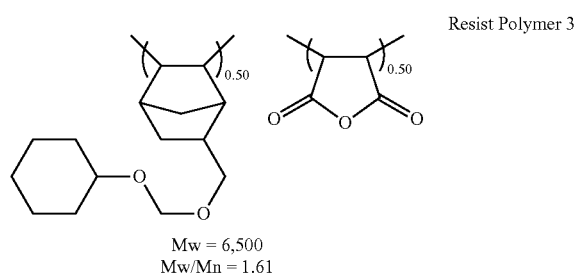
Mw = 6,500
Mw/Mn = 1.61
Resist Polymer 4
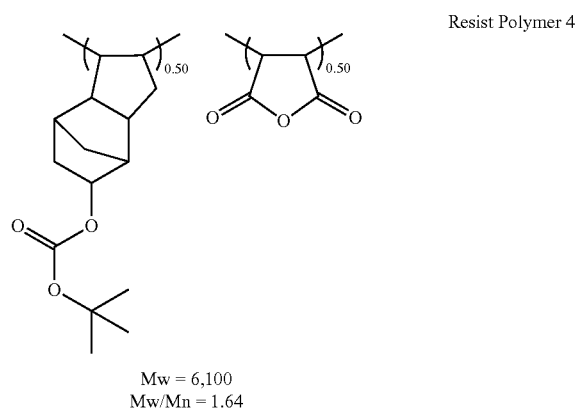
Mw = 6,100
Mw/Mn = 1.64

-continued
Resist Polymer 5
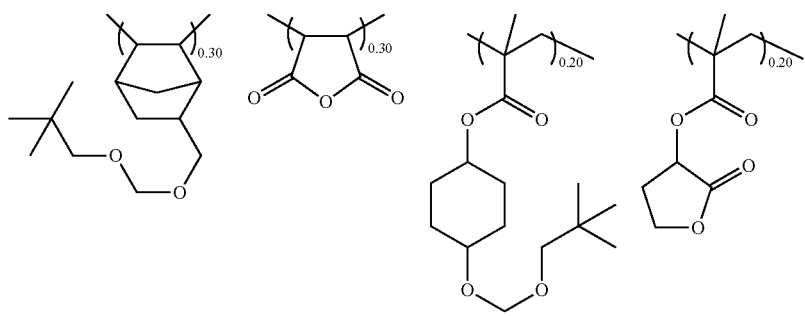
Mw = 8,500
Mw/Mn = 2.21
Resist Polymer 6
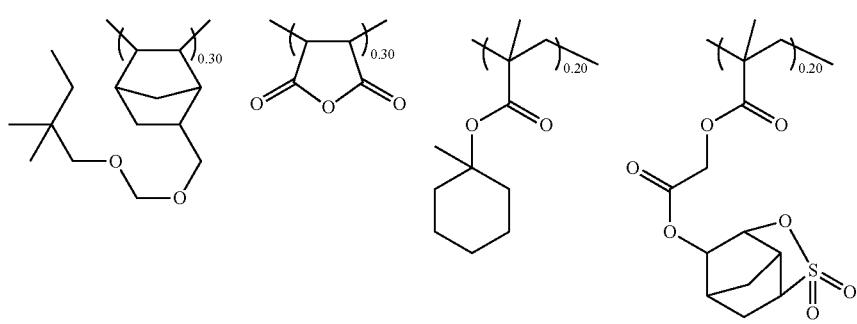
Mw = 8,800
Mw/Mn = 2.28
Resist Polymer 7
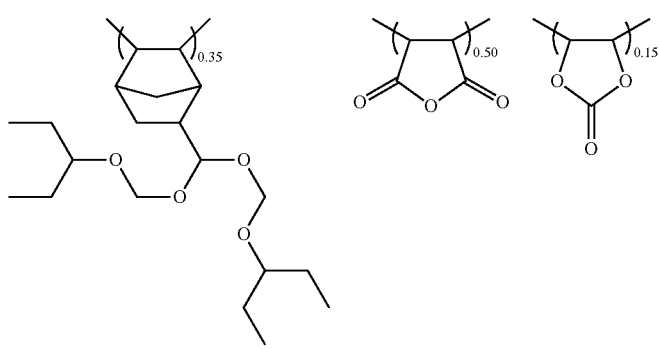
Mw = 6,500
Mw/Mn = 1.89
Resist Polymer 8
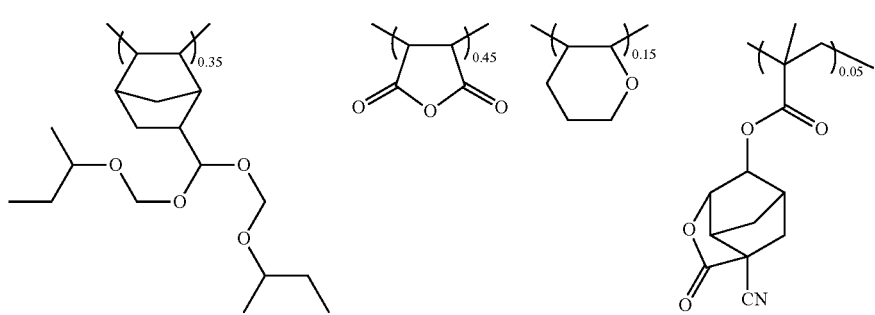
Mw = 6,900
Mw/Mn = 1.98

Resist Polymer 9
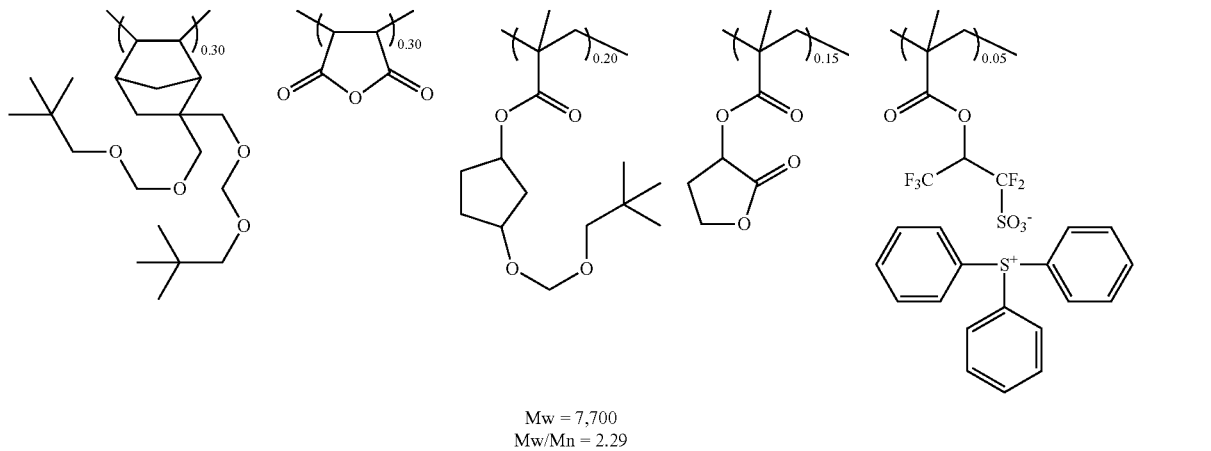
Mw = 7,700
Mw/Mn = 2.29
Resist Polymer 10
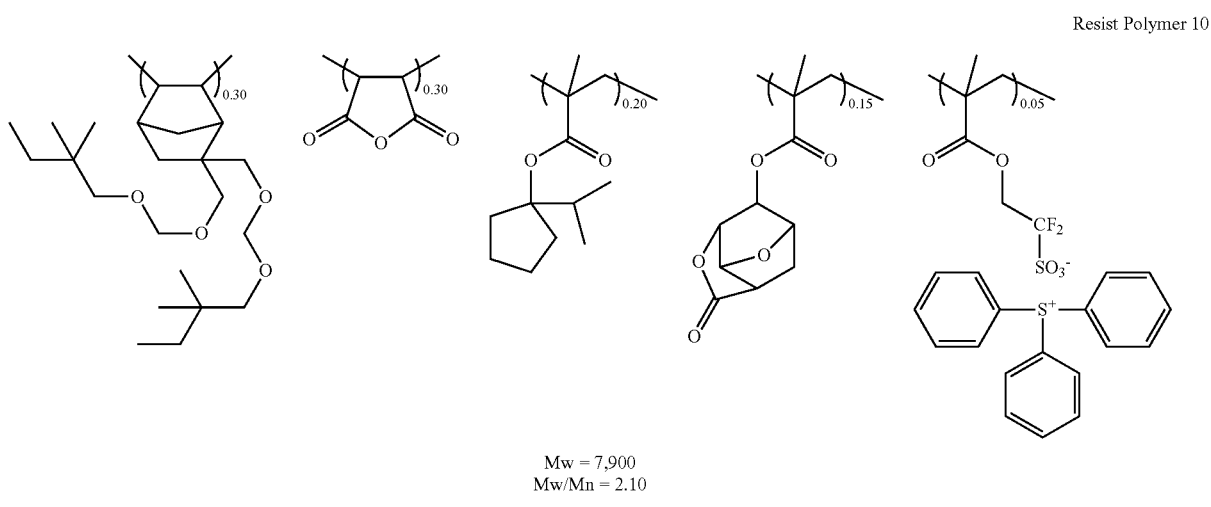
Mw = 7,900
Mw/Mn = 2.10
Resist Polymer 11
Mw = 7,900
Mw/Mn = 2.10

Resist Polymer 12
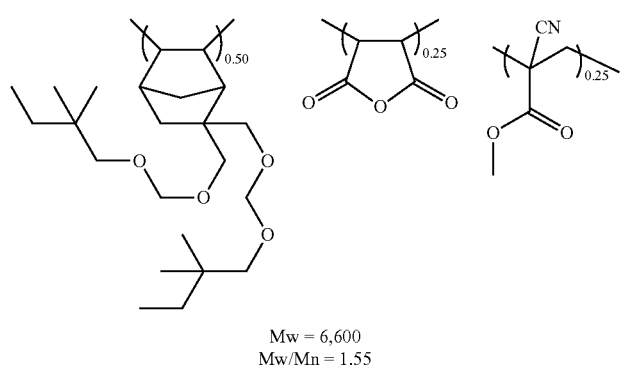
Mw = 6,600
Mw/Mn = 1.55
Resist Polymer 13
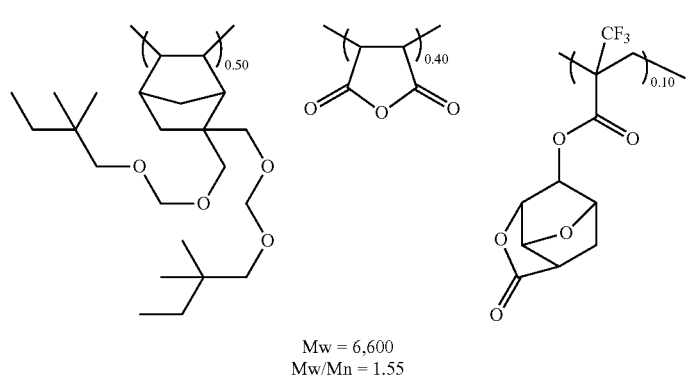
Mw = 6,600
Mw/Mn = 1.55
Comparative Resist Polymer 1
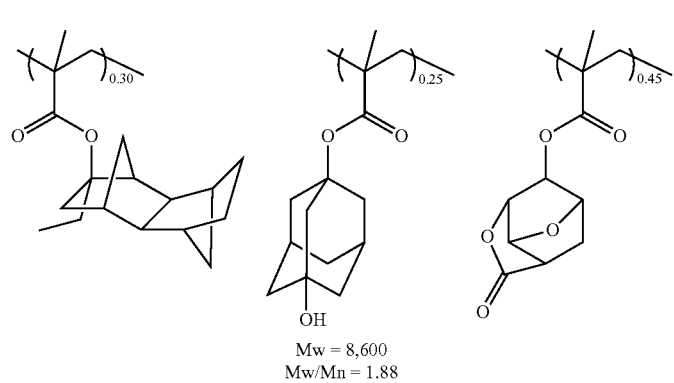
Mw = 8,600
Mw/Mn = 1.88
Comparative Resist Polymer 2
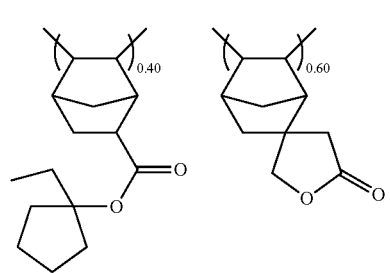
Mw = 6,600
Mw/Mn = 1.91

Blending Resist Polymer 1

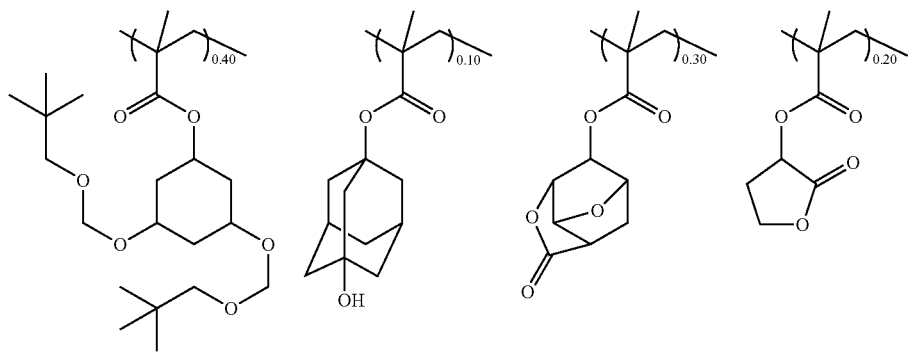

Mw = 8,900
Mw/Mn = 1.93

Blending Resist Polymer 2

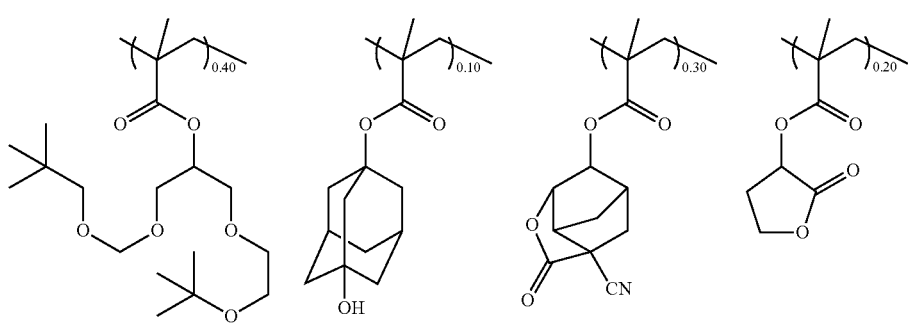

Mw = 9,200
Mw/Mn = 1.79

Examples and Comparative Examples

Preparation of Resist Composition and Alkali-Soluble Protective Film-Forming Composition A resist composition in solution form was prepared by dissolving a polymer (Resist Polymer) and components in solvents in accordance with the formulation of Tables 1 and 2. A protective film-forming composition in solution form was prepared by dissolving a polymer (TC Polymer) in solvent in accordance with the formulation of Table 3. The solutions were filtered through a Teflon® filter with a pore size of 0.2 μm. The components are identified below.

Acid generator: PAG1 to PAG10 of the following structural formulae

PAG1

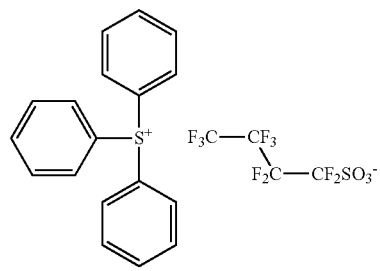

PAG2

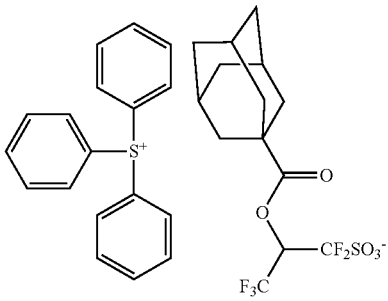

PAG3

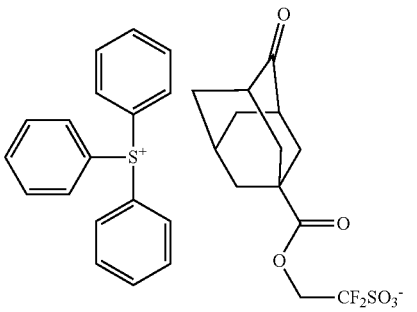

-continued
PAG 4
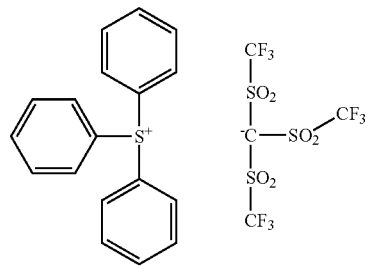
PAG 5
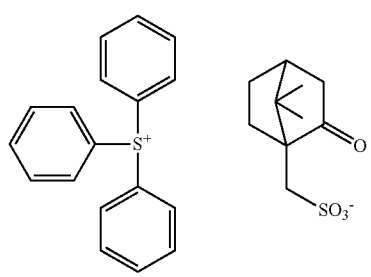
PAG 6
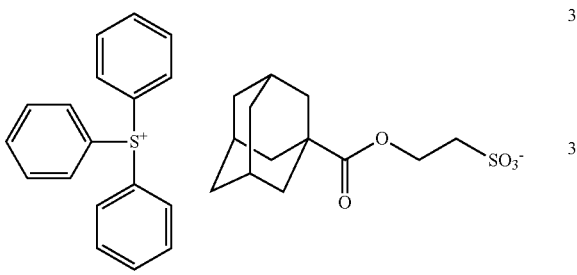
PAG 7
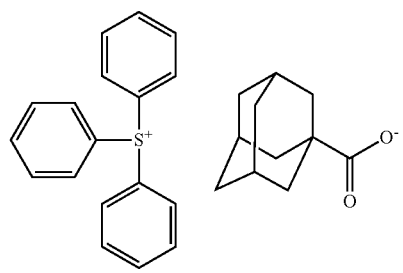
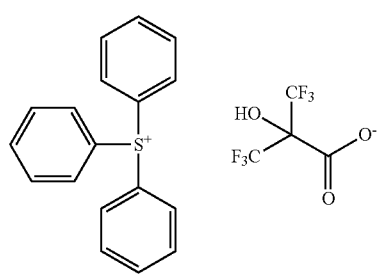
-continued
PAG 9
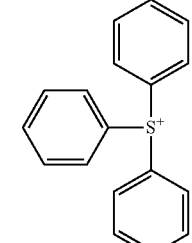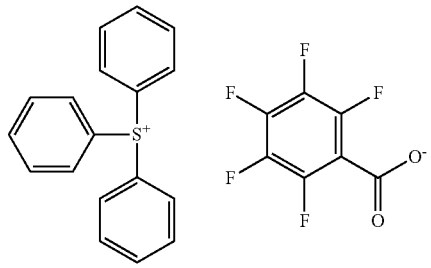
PAG 10
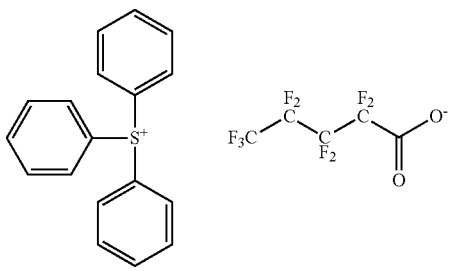
TC Polymer 1/Water-repellent Polymer 1
  Mw=7,700
  Mw/Mn=1.77
TC Polymer 1/Water-repellent Polymer 1
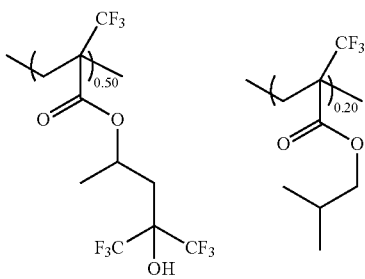
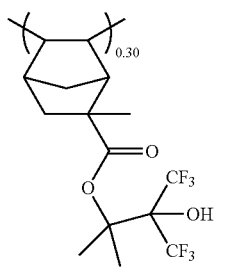
Basic Compound: Quenchers 1 and 2 of the following structural formulae
Quencher 1
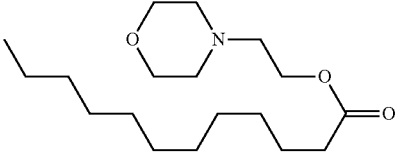

-continued

Quencher 2

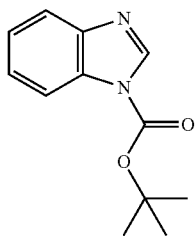

Organic Solvent:
 PGMEA (propylene glycol monomethyl ether acetate)
 CyH (cyclohexanone)

ArF Lithography Patterning Test 1

On a substrate (silicon wafer) having an antireflective coating (Nissan Chemical Industries, Ltd.) of 80 nm thick, the resist composition in Table 1 was spin coated and baked on a hot plate at 100° C. for 60 seconds to form a resist film of 160 nm thick.

Figure 15:
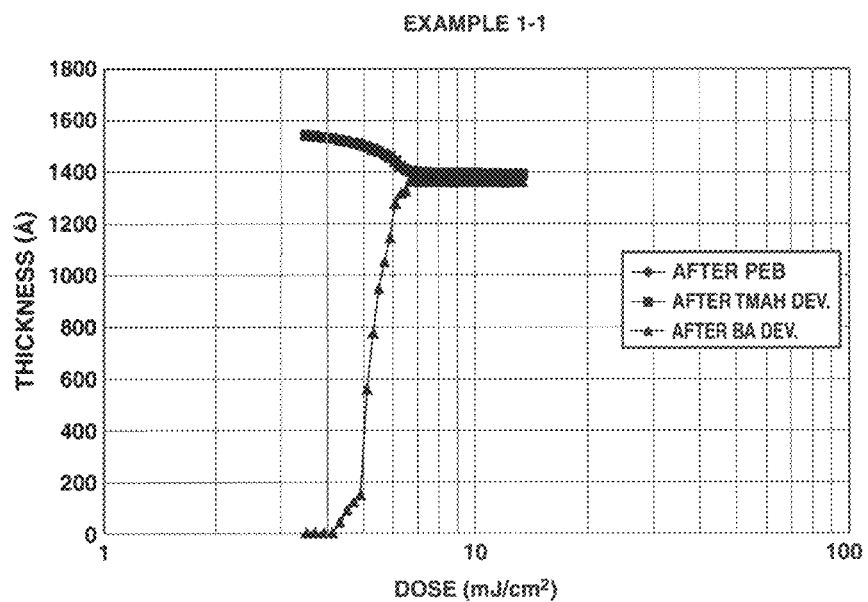
FIG. 15 is a diagram showing film thickness versus exposure dose in Example 1-1.
Figure 16:
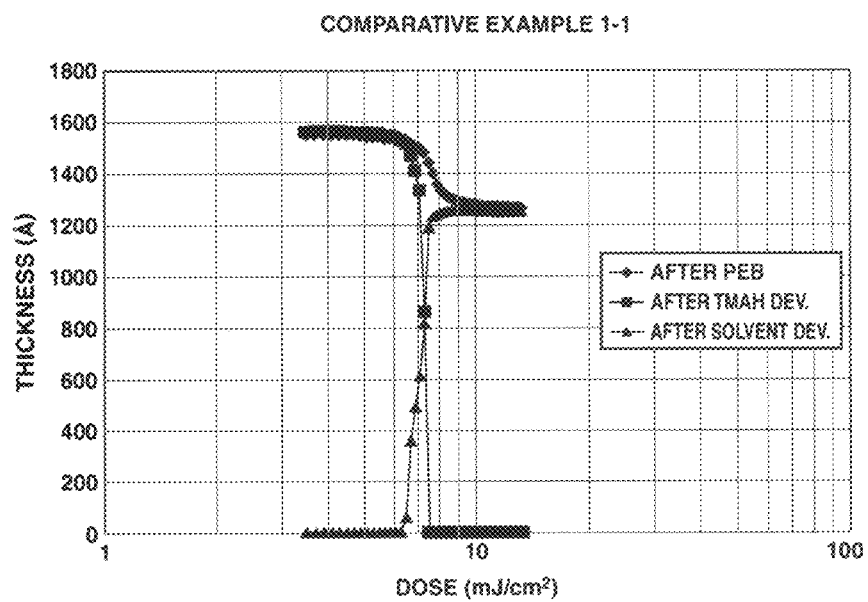
FIG. 16 is a diagram showing film thickness versus exposure dose in Comparative Example 1-1.
Figure 17:
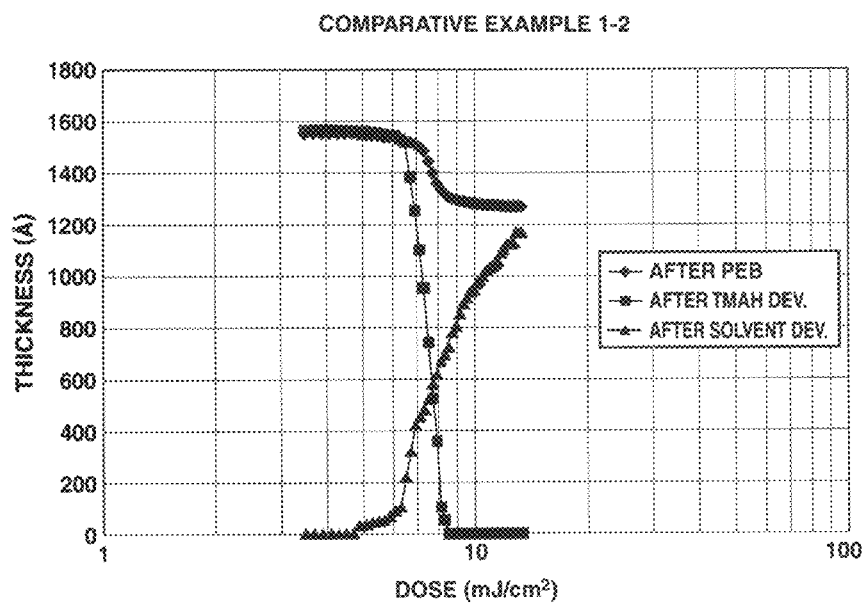
FIG. 17 is a diagram showing film thickness versus exposure dose in Comparative Example 1-2.

Using an ArF excimer laser scanner NSR-305B (Nikon Corp., NA 0.68, σ 0.73), the resist film was open-frame exposed in a dose which varied stepwise by 0.2 mJ/cm². The exposed resist film was baked (PEB) at 110° C. for 60 seconds and puddle developed for 60 seconds in an organic solvent developer as shown in Table 1. The wafer was rinsed at 500 rpm with a rinse liquid (organic solvent) as shown in Table 1, spin dried at 2,000 rpm, and baked at 100° C. for 60 seconds to evaporate off the rinse liquid. Separately, the same process was repeated until the PEB, and followed by development with a 2.38 wt % tetramethylammonium hydroxide (TMAH) aqueous solution. The film thickness after PEB, the film thickness after organic solvent development, and the film thickness after TMAH aqueous solution development were measured. A contrast curve was determined by plotting the film thickness versus the exposure dose. The results are shown in FIGS. 15 to 17.

Although Comparative Example 1 using methacrylate base polymer shows the highest contrast during organic solvent development, the inventive polymer shows a gradient (γ) approximate thereto. A comparison between cycloolefin polymers reveals that Example 1-1 has a higher gradient of dissolution than Comparative Example 1-2.

ArF Lithography Patterning Test 2

On a substrate (silicon wafer), a spin-on carbon film ODL-50 (Shin-Etsu Chemical Co., Ltd.) having a carbon content of 80 wt % was deposited to a thickness of 200 nm and a silicon-containing spin-on hard mask SHB-A940 having a silicon content of 43 wt % was deposited thereon to a thickness of 35 nm. On this substrate for trilayer process, the resist composition in Table 2 was spin coated, then baked on a hot plate at 100° C. for 60 seconds to form a resist film of 100 nm thick. In Examples 2-1 to 2-15, 2-17 to 2-20, Comparative Examples 2-1 and 2-2, no protective film was formed. In Example 2-21, the protective film-forming composition shown in Table 3 was spin coated on the resist film and baked at 90° C. for 60 seconds to form a protective film (or topcoat) of 50 nm thick.

Figure 18:
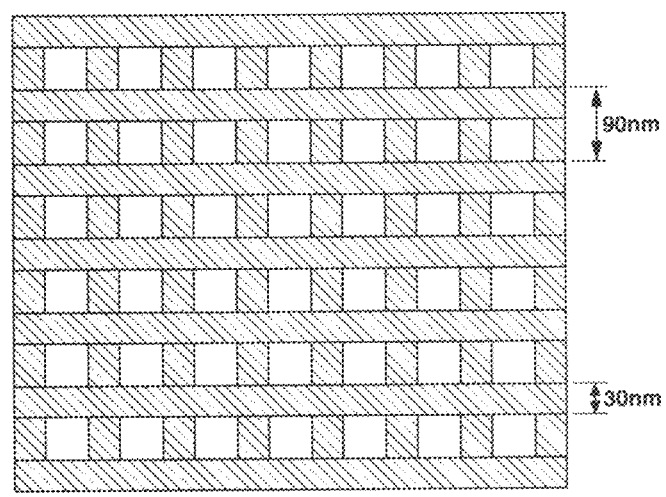
FIG. 18 illustrates a lattice-like mask used in ArF lithography patterning tests 2 and 5.

Using an ArF excimer laser immersion lithography scanner NSR-610C (Nikon Corp., NA 1.30, σ 0.98/0.78, cross-pole opening 20 deg., azimuthally polarized illumination), exposure was performed in a varying dose through a 6% halftone phase shift mask bearing a lattice-like pattern with a pitch of 90 nm and a line width of 30 nm (on-wafer size) whose layout is shown in FIG. 18. After the exposure, the wafer was baked (PEB) at the temperature shown in Table 4 for 60 seconds and developed. Specifically, butyl acetate was injected from a development nozzle while the wafer was spun at 30 rpm for 3 seconds, which was followed by stationary puddle development for 27 seconds. The wafer was rinsed with diisoamyl ether, spin dried, and baked at 100° C. for 20 seconds to evaporate off the rinse liquid.

A hole pattern resulted from image reversal by solvent development. By observation under TDSEM S-9380, the size of 50 holes was measured, from which a size variation 3σ was determined. The results are shown in Table 4.

TABLE 1

|  |  | Polymer (pbw) | Acid generator (pbw) | Basic compound (pbw) | Organic solvent (pbw) | Developer | Rinse liquid |
|---|---|---|---|---|---|---|---|
| Example 1-1 | Resist 1-1 | Resist Polymer 2 (100) | PAG1 (6.5) | Quencher1 (1.50) | PGMEA (800) CyH (400) | butyl acetate | 4-methyl-2-pentanol |
| Comparative Example 1-1 | Comparative resist 1-1 | Comparative Resist Polymer 1 (100) | PAG1 (6.5) | Quencher1 (1.50) | PGMEA (800) CyH (400) | butyl acetate | 4-methyl-2-pentanol |
| Comparative Example 1-2 | Comparative resist 1-2 | Comparative Resist Polymer 2 (100) | PAG1 (6.5) | Quencher1 (1.50) | PGMEA (800) CyH (400) | butyl acetate | 4-methyl-2-pentanol |

TABLE 2

|  | Polymer (pbw) | Acid generator (pbw) | Basic compound (pbw) | Additive (pbw) | Organic solvent (pbw) |
|---|---|---|---|---|---|
| Resist 2-1 | Resist Polymer 1 (100) | PAG2(7.5) | Quencher1 (1.50) | Water-repellent Polymer 1 (5) | PGMEA(2,000) CyH(500) |
| Resist 2-2 | Resist Polymer 2 (100) | PAG2(7.5) | Quencher1 (1.50) | Water-repellent Polymer 1 (5) | PGMEA(2,000) CyH(500) |
| Resist 2-3 | Resist Polymer 3 (100) | PAG2(7.5) | Quencher1 (1.50) | Water-repellent Polymer 1 (5) | PGMEA(2,000) CyH(500) |
| Resist 2-4 | Resist Polymer 4 (100) | PAG2(7.5) | Quencher1 (1.50) | Water-repellent Polymer 1 (5) | PGMEA(2,000) CyH(500) |
| Resist 2-5 | Resist Polymer 5 (100) | PAG2(7.5) | Quencher1 (1.50) | Water-repellent Polymer 1 (5) | PGMEA(2,000) CyH(500) |
| Resist 2-6 | Resist Polymer 6 (100) | PAG2(7.5) | Quencher1 (1.50) | Water-repellent Polymer 1 (5) | PGMEA(2,000) CyH(500) |
| Resist 2-7 | Resist Polymer 7 (100) | PAG2(7.5) | Quencher1 (1.50) | Water-repellent Polymer 1 (5) | PGMEA(2,000) CyH(500) |
| Resist 2-8 | Resist Polymer 8 (100) | PAG2(7.5) | Quencher2 (1.50) | Water-repellent Polymer 1 (5) | PGMEA(2,000) CyH(500) |
| Resist 2-9 | Resist Polymer 9 (100) | PAG5(4.50) | — | Water-repellent Polymer 1 (5) | PGMEA(2,000) CyH(500) |
| Resist 2-10 | Resist Polymer 10 (100) | PAG5(4.50) | — | Water-repellent Polymer 1 (5) | PGMEA(2,000) CyH(500) |
| Resist 2-11 | Resist Polymer 11 (100) | PAG3(4.5) PAG6(4.5) | — | Water-repellent Polymer 1 (5) | PGMEA(2,000) CyH(500) |
| Resist 2-12 | Resist Polymer 12 (100) | PAG4(7.5) | Quencher1 (1.50) | Water-repellent Polymer 1 (5) | PGMEA(2,000) CyH(500) |
| Resist 2-13 | Resist Polymer 13 (100) | PAG2(7.5) | Quencher1 (1.50) | Water-repellent Polymer 1 (5) | PGMEA(2,000) CyH(500) |
| Resist 2-14 | Resist Polymer 5 (50) Comparative Resist Polymer 1 (50) | PAG2(4.5) PAG6(4.5) | — | Water-repellent Polymer 1 (5) | PGMEA(2,000) CyH(500) |
| Resist 2-15 | Resist Polymer 5 (50) Blending Resist Polymer 1 (50) | PAG2(4.5) PAG6(4.5) | — | Water-repellent Polymer 1 (5) | PGMEA(2,000) CyH(500) |
| Resist 2-16 | Resist Polymer 5 (50) Blending Resist Polymer 2 (50) | PAG2(4.5) PAG6(4.5) | — | — | PGMEA(2,000) CyH(500) |
| Resist 2-17 | Resist Polymer 11 (100) | PAG2(4.5) PAG7(4.5) | — | Water-repellent Polymer 1 (5) | PGMEA(2,000) CyH(500) |
| Resist 2-18 | Resist Polymer 11 (100) | PAG2(4.5) PAG8(4.5) | — | Water-repellent Polymer 1 (5) | PGMEA(2,000) CyH(500) |
| Resist 2-19 | Resist Polymer 11 (100) | PAG2(4.5) PAG9(4.5) | — | Water-repellent Polymer 1 (5) | PGMEA(2,000) CyH(500) |
| Resist 2-20 | Resist Polymer 11 (100) | PAG2(4.5) PAG10(4.5) | — | Water-repellent Polymer 1 (5) | PGMEA(2,000) CyH(500) |
| Comparative Resist 2-1 | Comparative Resist Polymer 1(100) | PAG2(7.5) | Quencher1 (1.50) | Water-repellent Polymer 1 (5) | PGMEA(2,000) CyH(500) |
| Comparative Resist 2-2 | Comparative Resist Polymer 2 (100) | PAG2(7.5) | Quencher1 (1.50) | Water-repellent Polymer 1 (5) | PGMEA(2,000) CyH(500) |

TABLE 3

| Protective Film | Polymer (pbw) | Organic solvent (pbw) |
|---|---|---|
| TC-1 | TC Polymer 1 (100) | diisoamyl ether (2,700) 2-methyl-1-butanol (270) |

TABLE 4

| | Resist | Protective film | PEB temperature (° C.) | Dose (mJ/cm$^2$) | Hole size variation 3σ (nm) |
|---|---|---|---|---|---|
| Example 2-1 | Resist 2-1 | — | 90 | 48 | 2.8 |
| Example 2-2 | Resist 2-2 | — | 90 | 45 | 2.4 |
| Example 2-3 | Resist 2-3 | — | 95 | 38 | 2.1 |
| Example 2-4 | Resist 2-4 | — | 95 | 38 | 2.5 |
| Example 2-5 | Resist 2-5 | — | 95 | 39 | 2.0 |
| Example 2-6 | Resist 2-6 | — | 100 | 40 | 2.2 |
| Example 2-7 | Resist 2-7 | — | 100 | 38 | 2.2 |
| Example 2-8 | Resist 2-8 | — | 100 | 39 | 2.4 |
| Example 2-9 | Resist 2-9 | — | 100 | 41 | 1.9 |
| Example 2-10 | Resist 2-10 | — | 100 | 45 | 1.8 |
| Example 2-11 | Resist 2-11 | — | 85 | 44 | 2.2 |
| Example 2-12 | Resist 2-12 | — | 95 | 40 | 2.4 |
| Example 2-13 | Resist 2-13 | — | 95 | 40 | 2.4 |
| Example 2-14 | Resist 2-14 | — | 95 | 41 | 2.1 |
| Example 2-15 | Resist 2-15 | — | 95 | 42 | 2.1 |
| Example 2-16 | Resist 2-16 | — | 85 | 44 | 1.8 |
| Example 2-17 | Resist 2-17 | — | 85 | 44 | 1.6 |
| Example 2-18 | Resist 2-18 | — | 85 | 46 | 1.7 |
| Example 2-19 | Resist 2-19 | — | 85 | 48 | 1.8 |
| Example 2-20 | Resist 2-20 | — | 85 | 49 | 1.7 |
| Example 2-21 | Resist 2-16 | TC-1 | 95 | 41 | 2.3 |
| Comparative Example 2-1 | Comparative Resist 2-1 | — | 100 | 45 | 3.1 |
| Comparative Example 2-2 | Comparative Resist 2-2 | — | 95 | 53 | 4.8 |

ArF Lithography Patterning Test 3

On a substrate (silicon wafer), a spin-on carbon film ODL-50 (Shin-Etsu Chemical Co., Ltd.) having a carbon content of 80 wt % was deposited to a thickness of 200 nm and a silicon-containing spin-on hard mask SHB-A940 having a silicon content of 43 wt % was deposited thereon to a thickness of 35 nm. On this substrate for trilayer process, the resist composition (Resist 2-3, 2-6 and Comparative Resist 2-1, 2-2) in Table 2 was spin coated, then baked on a hot plate at 100° C. for 60 seconds to form a resist film of 100 nm thick.

Using an ArF excimer laser immersion lithography scanner NSR-610C (Nikon Corp., NA 1.30, σ 0.98/0.78, cross-pole opening 20 deg., azimuthally polarized illumination), exposure was performed through a 6% halftone phase shift mask bearing a lattice-like pattern with a pitch of 90 nm and a line width of 15 nm (on-wafer size) having dots arrayed at intersections, whose layout is shown in FIG. 19, while the dose and focus were varied. After the exposure, the wafer was baked (PEB) at the temperature shown in Table 5 for 60 seconds and developed. Specifically, butyl acetate was injected from a development nozzle while the wafer was spun at 30 rpm for 3 seconds, which was followed by stationary puddle development for 27 seconds. The wafer was rinsed with diisoamyl ether, spin dried, and baked at 100° C. for 20 seconds to evaporate off the rinse liquid.

A hole pattern resulted from image reversal by solvent development. By observation under TDSEM S-9380, the size of 50 holes was measured, from which a size variation 3σ was determined. The results are shown in Table 5.

TABLE 5

| | Resist | PEB temperature (° C.) | Dose (mJ/cm$^2$) | Hole size variation 3σ (nm) |
|---|---|---|---|---|
| Example 3-1 | Resist 2-3 | 95 | 52 | 2.5 |
| Example 3-2 | Resist 2-6 | 100 | 41 | 2.4 |
| Comparative Example 3-1 | Comparative Resist 2-1 | 100 | 65 | 3.3 |
| Comparative Example 3-2 | Comparative Resist 2-2 | 95 | 85 | 4.6 |

ArF Lithography Patterning Test 4

On a substrate (silicon wafer), a spin-on carbon film ODL-50 (Shin-Etsu Chemical Co., Ltd.) having a carbon content of 80 wt % was deposited to a thickness of 200 nm and a silicon-containing spin-on hard mask SHB-A940 having a silicon content of 43 wt % was deposited thereon to a thickness of 35 nm. On this substrate for trilayer process, the resist composition (Resist 2-3, 2-6 and Comparative Resist 2-1, 2-2) in Table 2 was spin coated, then baked on a hot plate at 100° C. for 60 seconds to form a resist film of 100 nm thick.

Figure 20:
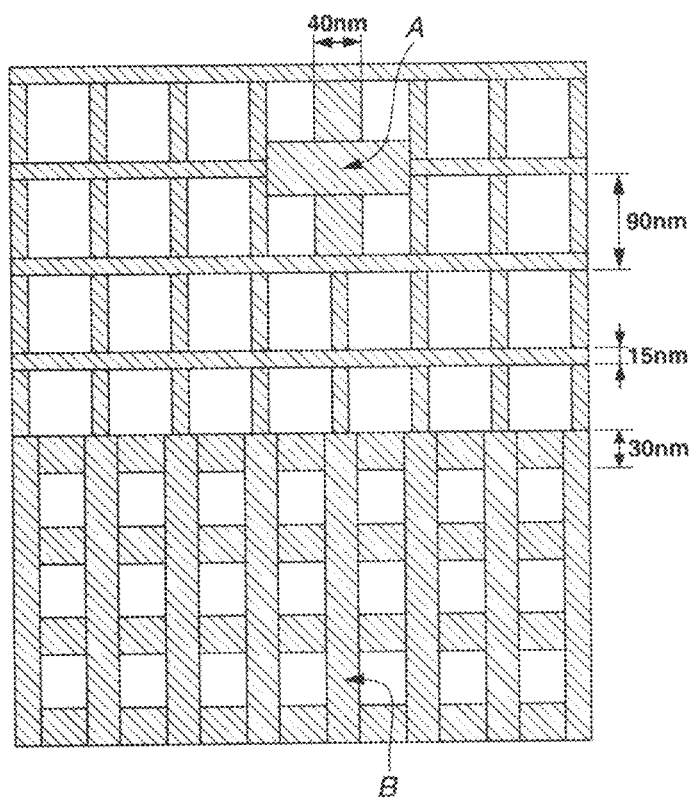
FIG. 20 illustrates a mask having thick gratings arrayed on a lattice-like pattern, used in ArF lithography patterning test 4.

Using an ArF excimer laser immersion lithography scanner NSR-610C (Nikon Corp., NA 1.30, σ 0.98/0.78, cross-pole opening 20 deg., azimuthally polarized illumination), exposure was performed through a 6% halftone phase shift mask bearing a lattice-like pattern with a pitch of 90 nm (on-wafer size) having thick gratings disposed at intersections, whose layout is shown in FIG. 20, while the dose was varied. After the exposure, the wafer was baked (PEB) at the temperature shown in Table 6 for 60 seconds and developed. Specifically, butyl acetate was injected from a development nozzle while the wafer was spun at 30 rpm for 3 seconds, which was followed by stationary puddle development for 27 seconds. The wafer was rinsed with diisoamyl ether, spin dried, and baked at 100° C. for 20 seconds to evaporate off the rinse liquid.

A hole pattern resulted from image reversal by solvent development. By observation under TDSEM S-9380, the size of holes at positions A and B on the mask (FIG. 20) was measured. The results are shown in Table 6.

TABLE 6

| | Resist | PEB temperature (° C.) | Dose (mJ/cm$^2$) | Hole size at A (nm) | Hole size at B (nm) |
|---|---|---|---|---|---|
| Example 4-1 | Resist 2-3 | 95 | 55 | 40 | 41 |
| Example 4-2 | Resist 2-6 | 100 | 56 | 39 | 41 |
| Comparative Example 4-1 | Comparative Resist 2-1 | 100 | 85 | 23 | 51 |
| Comparative Example 4-2 | Comparative Resist 2-2 | 95 | 85 | 20 | 65 |

ArF Lithography Patterning Test 5

On a substrate (silicon wafer), a spin-on carbon film ODL-50 (Shin-Etsu Chemical Co., Ltd.) having a carbon content of 80 wt % was deposited to a thickness of 200 nm and a silicon-containing spin-on hard mask SHB-A940 having a silicon content of 43 wt % was deposited thereon to a thickness of 35 nm. On this substrate for trilayer process, the resist composition (Resist 2-3, 2-6 and Comparative Resist 2-1, 2-2) in Table 2 was spin coated, then baked on a hot plate at 100° C. for 60 seconds to form a resist film of 100 nm thick.

Using an ArF excimer laser immersion lithography scanner NSR-610C (Nikon Corp., NA 1.30, σ 0.98/0.78, dipole opening 20 deg., azimuthally polarized illumination), exposure was performed through a 6% halftone phase shift mask bearing a lattice-like pattern with a pitch of 90 nm and a line width of 30 nm (on-wafer size) whose layout is shown in FIG. 18 while the dose was varied. The same area was subjected to two continuous exposures by X and Y dipole illuminations. After the exposure, the wafer was baked (PEB) at the temperature shown in Table 7 for 60 seconds and developed. Specifically, butyl acetate was injected from a development nozzle while the wafer was spun at 30 rpm for 3 seconds, which was followed by stationary puddle development for 27 seconds. The wafer was rinsed with diisoamyl ether, spin dried, and baked at 100° C. for 20 seconds to evaporate off the rinse liquid.

A hole pattern resulted from image reversal by solvent development. By observation under TDSEM S-9380, the size of 50 holes was measured, from which a size variation 3σ was determined. The results are shown in Table 7.

TABLE 7

| Resist | PEB temperature (° C.) | Dose (mJ/cm$^2$) | Hole size variation 3σ (nm) |
|---|---|---|---|
| Example 5-1 | Resist 2-3 | 95 | 22 | 2.2 |
| Example 5-2 | Resist 2-6 | 100 | 24 | 2.3 |
| Comparative Example 5-1 | Comparative Resist 2-1 | 100 | 26 | 2.6 |
| Comparative Example 5-2 | Comparative Resist 2-2 | 95 | 32 | 4.0 |

ArF Lithography Patterning Test 6

On a substrate (silicon wafer), a spin-on carbon film ODL-50 (Shin-Etsu Chemical Co., Ltd.) having a carbon content of 80 wt % was deposited to a thickness of 200 nm and a silicon-containing spin-on hard mask SHB-A940 having a silicon content of 43 wt % was deposited thereon to a thickness of 35 nm. On this substrate for trilayer process, the resist composition (Resist 2-3, 2-6 and Comparative Resist 2-1, 2-2) in Table 2 was spin coated, then baked on a hot plate at 100° C. for 60 seconds to form a resist film of 100 nm thick.

Using an ArF excimer laser immersion lithography scanner NSR-610C (Nikon Corp., NA 1.30, σ 0.98/0.78, dipole opening 20 deg., azimuthally polarized illumination), exposure was performed through a 6% halftone phase shift mask bearing a lattice-like pattern with a pitch of 90 nm and a line width of 15 nm (on-wafer size) having dots disposed at intersections, whose layout is shown in FIG. 19, while the dose was varied. The same area was subjected to two continuous exposures by X and Y dipole illuminations. After the exposure, the wafer was baked (PEB) at the temperature shown in Table 8 for 60 seconds and developed. Specifically, butyl acetate was injected from a development nozzle while the wafer was spun at 30 rpm for 3 seconds, which was followed by stationary puddle development for 27 seconds. The wafer was rinsed with diisoamyl ether, spin dried, and baked at 100° C. for 20 seconds to evaporate off the rinse liquid.

A hole pattern resulted from image reversal by solvent development. By observation under TDSEM S-9380, the size of holes was measured, from which a focus margin affording a size of 40 nm±5 nm was determined as DOF. The size of 50 holes within a shot of the same dose and the same focus was measured, from which a size variation 3σ was determined. The results are shown in Table 8.

TABLE 8

| Resist | PEB temperature (° C.) | Dose (mJ/cm$^2$) | DOF (nm) | Hole size variation 3σ (nm) |
|---|---|---|---|---|
| Example 6-1 | Resist 2-3 | 95 | 27 | 110 | 2.6 |
| Example 6-2 | Resist 2-6 | 100 | 29 | 100 | 2.5 |
| Comparative Example 6-1 | Comparative Resist 2-1 | 100 | 33 | 90 | 3.0 |
| Comparative Example 6-2 | Comparative Resist 2-2 | 95 | 35 | 20 | 4.8 |

ArF Lithography Patterning Test 7

On a substrate (silicon wafer), a spin-on carbon film ODL-50 (Shin-Etsu Chemical Co., Ltd.) having a carbon content of 80 wt % was deposited to a thickness of 200 nm and a silicon-containing spin-on hard mask SHB-A940 having a silicon content of 43 wt % was deposited thereon to a thickness of 35 nm. On this substrate for trilayer process, the resist composition (Resist 2-3, 2-6 and Comparative Resist 2-1, 2-2) in Table 2 was spin coated, then baked on a hot plate at 100° C. for 60 seconds to form a resist film of 100 nm thick.

Using an ArF excimer laser immersion lithography scanner NSR-610C (Nikon Corp., NA 1.30, σ 0.98/0.78, cross-pole opening 20 deg., azimuthally polarized illumination), exposure was performed through a 6% halftone phase shift mask bearing a dot pattern with a pitch of 90 nm and a width of 55 nm (on-wafer size) whose layout is shown in FIG. 7, while the dose was varied. After the exposure, the wafer was baked (PEB) at the temperature shown in Table 9 for 60 seconds and developed. Specifically, butyl acetate was injected from a development nozzle while the wafer was spun at 30 rpm for 3 seconds, which was followed by stationary puddle development for 27 seconds. The wafer was rinsed with diisoamyl ether, spin dried, and baked at 100° C. for 20 seconds to evaporate off the rinse liquid.

A hole pattern resulted from image reversal by solvent development. By observation under TDSEM S-9380, the size of holes was measured, from which a focus margin affording a size of 40 nm±5 nm was determined as DOF. The size of 50 holes within a shot of the same dose and the same focus was measured, from which a size variation 3σ was determined. The results are shown in Table 9.

TABLE 9

| Resist | PEB temperature (° C.) | Dose (mJ/cm$^2$) | DOF (nm) | Hole size variation 3σ (nm) |
|---|---|---|---|---|
| Example 7-1 | Resist 2-3 | 95 | 41 | 90 | 3.8 |
| Example 7-2 | Resist 2-6 | 100 | 58 | 95 | 3.5 |
| Comparative Example 7-1 | Comparative Resist 2-1 | 100 | 66 | 80 | 4.6 |
| Comparative Example 7-2 | Comparative Resist 2-2 | 95 | 80 | 10 | 6.8 |

ArF Lithography Patterning Test 8

On a substrate (silicon wafer), a spin-on carbon film ODL-50 (Shin-Etsu Chemical Co., Ltd.) having a carbon content of 80 wt % was deposited to a thickness of 200 nm and a silicon-containing spin-on hard mask SHB-A940 having a silicon content of 43 wt % was deposited thereon to a thickness of 35 nm. On this substrate for trilayer process, the resist composition (Resist 2-3, 2-6 and Comparative Resist 2-1, 2-2) in Table 2 was spin coated, then baked on a hot plate at 100° C. for 60 seconds to form a resist film of 100 nm thick.

Using an ArF excimer laser immersion lithography scanner NSR-610C (Nikon Corp., NA 1.30, σ 0.98/0.78, dipole opening 20 deg., azimuthally polarized illumination), exposure was performed through a 6% halftone phase shift mask bearing a dot pattern with a pitch of 90 nm and a width of 55 nm (on-wafer size) whose layout is shown in FIG. 7, while the dose was varied. The same area was subjected to two continuous exposures by X and Y dipole illuminations. After the exposure, the wafer was baked (PEB) at the temperature shown in Table 10 for 60 seconds and developed. Specifically, butyl acetate was injected from a development nozzle while the wafer was spun at 30 rpm for 3 seconds, which was followed by stationary puddle development for 27 seconds. The wafer was rinsed with diisoamyl ether, spin dried, and baked at 100° C. for 20 seconds to evaporate off the rinse liquid.

A hole pattern resulted from image reversal by solvent development. By observation under TDSEM S-9380, the size of holes was measured, from which a focus margin affording a size of 40 nm±5 nm was determined as DOF. The size of 50 holes within a shot of the same dose and the same focus was measured, from which a size variation 3σ was determined. The results are shown in Table 10.

TABLE 10

| | Resist | PEB temperature (° C.) | Dose (mJ/cm$^2$) | DOF (nm) | Hole size variation 3σ (nm) |
|---|---|---|---|---|---|
| Example 8-1 | Resist 2-3 | 95 | 22 | 95 | 2.8 |
| Example 8-2 | Resist 2-6 | 100 | 24 | 100 | 2.6 |
| Comparative Example 8-1 | Comparative Resist 2-1 | 100 | 33 | 90 | 3.0 |
| Comparative Example 8-2 | Comparative Resist 2-2 | 95 | 45 | 20 | 4.5 |

ArF Lithography Patterning Test 9

On a substrate (silicon wafer), a spin-on carbon film ODL-50 (Shin-Etsu Chemical Co., Ltd.) having a carbon content of 80 wt % was deposited to a thickness of 200 nm and a silicon-containing spin-on hard mask SHB-A940 having a silicon content of 43 wt % was deposited thereon to a thickness of 35 nm. On this substrate for trilayer process, the resist composition in Table 2 was spin coated, then baked on a hot plate at 100° C. for 60 seconds to form a resist film of 100 nm thick.

Using an ArF excimer laser immersion lithography scanner NSR-610C (Nikon Corp., NA 1.30, σ 0.98/0.78, dipole opening 20 deg., azimuthally polarized illumination), exposure was performed through a 6% halftone phase shift mask bearing a dot pattern with a pitch of 90 nm and a width of 55 nm (on-wafer size) whose layout is shown in FIG. 7, while the dose was varied. The same area was subjected to two continuous exposures by X and Y dipole illuminations. After the exposure, the wafer was baked (PEB) at the temperature shown in Table 11 for 60 seconds and developed. Specifically, the solvent shown in Table 11 was injected from a development nozzle while the wafer was spun at 30 rpm for 3 seconds, which was followed by stationary puddle development for 27 seconds. The wafer was rinsed with diisoamyl ether, spin dried, and baked at 100° C. for 20 seconds to evaporate off the rinse liquid.

A hole pattern resulted from image reversal by solvent development. By observation under TDSEM S-9380, the size of holes was measured, from which a focus margin affording a size of 40 nm±5 nm was determined as DOF. The size of 50 holes within a shot of the same dose and the same focus was measured, from which a size variation 3σ was determined. The results are shown in Table 11.

TABLE 11

| | Resist | PEB temp. (° C.) | Dose (mJ/cm$^2$) | Developer | DOF (nm) | Hole size variation 3σ (nm) |
|---|---|---|---|---|---|---|
| Example 9-1 | Resist 2-1 | 95 | 24 | 2-heptanone | 105 | 2.2 |
| Example 9-2 | Resist 2-1 | 95 | 23 | methyl benzoate | 110 | 2.4 |
| Example 9-3 | Resist 2-1 | 95 | 25 | ethyl benzoate | 105 | 2.3 |
| Example 9-4 | Resist 2-1 | 95 | 26 | phenyl acetate | 100 | 2.4 |
| Example 9-5 | Resist 2-1 | 95 | 28 | benzyl acetate | 100 | 2.5 |
| Example 9-6 | Resist 2-1 | 95 | 28 | methyl phenylacetate | 100 | 2.6 |
| Example 9-7 | Resist 2-1 | 95 | 27 | methyl benzoate:butyl acetate = 6:4 | 100 | 2.6 |
| Example 9-8 | Resist 2-1 | 95 | 26 | methyl benzoate:2-heptanone = 5:5 | 100 | 2.6 |

ArF Lithography Patterning Test 10

On a substrate (silicon wafer), a spin-on carbon film ODL-50 (Shin-Etsu Chemical Co., Ltd.) having a carbon content of 80 wt % was deposited to a thickness of 200 nm and a silicon-containing spin-on hard mask SHB-A940 having a silicon content of 43 wt % was deposited thereon to a thickness of 35 nm. On this substrate for trilayer process, the resist composition (Resist 2-3, 2-6 and Comparative Resist 2-1, 2-2) in Table 2 was spin coated, then baked on a hot plate at 100° C. for 60 seconds to form a resist film of 100 nm thick.

Using an ArF excimer laser immersion lithography scanner NSR-610C (Nikon Corp., NA 1.30, σ 0.98/0.78, dipole opening 20 deg., azimuthally polarized illumination), first exposure was performed through a 6% halftone phase shift mask bearing an array of X-direction lines with a pitch of 80 nm and a line width of 40 nm (on-wafer size) by compliant dipole illumination. Next, second exposure was performed through a 6% halftone phase shift mask bearing an array of Y-direction lines with a pitch of 80 nm and a line width of 40 nm (on-wafer size) by compliant dipole illumination. After the exposure, the wafer was baked (PEB) at the temperature shown in Table 12 for 60 seconds and developed. Specifically, butyl acetate was injected from a development nozzle while the wafer was spun at 30 rpm for 3 seconds, which was followed by stationary puddle development for 27 seconds. The wafer was rinsed with diisoamyl ether, spin dried, and baked at 100° C. for 20 seconds to evaporate off the rinse liquid.

A hole pattern resulted from image reversal by solvent development. By observation under TDSEM S-9380, the size of 50 holes was measured, from which a size variation 3σ was determined. The results are shown in Table 12.

TABLE 12

| Resist | | PEB temperature (° C.) | Dose (mJ/cm²) | Hole size variation 3σ (nm) |
|---|---|---|---|---|
| Example 10-1 | Resist 2-3 | 95 | 18 | 1.9 |
| Example 10-2 | Resist 2-6 | 100 | 20 | 2.0 |
| Comparative Example 10-1 | Comparative Resist 2-1 | 100 | 115 | 2.7 |
| Comparative Example 10-2 | Comparative Resist 2-2 | 95 | 115 | 4.0 |

Dry Etching Test

On a substrate (silicon wafer), a spin-on carbon film ODL-50 (Shin-Etsu Chemical Co., Ltd.) having a carbon content of 80 wt % was deposited to a thickness of 200 nm and a silicon-containing spin-on hard mask SHB-A940 having a silicon content of 43 wt % was deposited thereon to a thickness of 35 nm. On this substrate for trilayer process, the resist composition in Table 2 was spin coated, then baked on a hot plate at 100° C. for 60 seconds to form a resist film of 100 nm thick.

Using an ArF excimer laser scanner NSR-305B (Nikon Corp., NA 0.68, σ 0.85, normal illumination), the coated wafer was flood exposed at a dose of 30 mJ/cm² and baked (PEB) at 100° C. for 60 seconds whereby the acid labile group was deprotected.

Using a dry etching instrument TE-8500P (Tokyo Electron Ltd.), the resist film was etched with $CHF_3/CF_4$ gas under the following conditions.

| | |
|---|---|
| Chamber pressure | 40.0 Pa |
| RF power | 1000 W |
| Gap | 9 mm |
| $CHF_3$ gas flow rate | 30 ml/min |
| $CF_4$ gas flow rate | 30 ml/min |
| Ar gas flow rate | 100 ml/min |
| Time | 20 sec |

The difference in resist film thickness before and after etching was determined. The results are shown in Table 13. A smaller value of film thickness difference, i.e., a smaller film loss indicates better etch resistance.

TABLE 13

| | Resist | Film loss by $CHF_3/CF_4$ gas etching (nm) |
|---|---|---|
| Example 11-1 | Resist 2-1 | 35 |
| Example 11-2 | Resist 2-2 | 36 |
| Example 11-3 | Resist 2-3 | 45 |
| Example 11-4 | Resist 2-4 | 40 |
| Example 11-5 | Resist 2-5 | 44 |
| Example 11-6 | Resist 2-6 | 42 |
| Example 11-7 | Resist 2-7 | 40 |
| Example 11-8 | Resist 2-8 | 40 |
| Example 11-9 | Resist 2-9 | 45 |
| Example 11-10 | Resist 2-10 | 44 |
| Example 11-11 | Resist 2-11 | 41 |
| Example 11-12 | Resist 2-12 | 43 |
| Example 11-13 | Resist 2-13 | 44 |
| Example 11-14 | Resist 2-14 | 46 |
| Example 11-15 | Resist 2-15 | 48 |

TABLE 13-continued

| | Resist | Film loss by $CHF_3/CF_4$ gas etching (nm) |
|---|---|---|
| Example 11-16 | Resist 2-16 | 47 |
| Comparative Example 11-1 | Comparative Resist 2-1 | 53 |
| Comparative Example 11-2 | Comparative Resist 2-2 | 38 |

While the invention has been described with reference to a preferred embodiment, it will be understood by those skilled in the art that various changes may be made and equivalents may be substituted for elements thereof without departing from the scope of the invention. Therefore, it is intended that the invention not be limited to the particular embodiment disclosed as the best mode contemplated for carrying out this invention, but that the invention will include all embodiments falling within the scope of the appended claims.

Japanese Patent Application No. 2011-138344 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

What is claimed is:

1. A negative pattern-forming resist composition comprising a polymer, an acid generator, and an organic solvent,
said polymer consisting of recurring units (a1) and/or (a2) having a hydroxyl group substituted with an acid labile group, represented by the general formula (1) and recurring units (b) derived from a monomer having an adhesive group selected from the class consisting of hydroxyl, cyano, carbonyl, ester, ether, sulfonic acid ester, lactone ring, carboxyl, carboxylic anhydride, carbonate, and maleimide, (1)

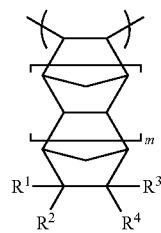
(a1)

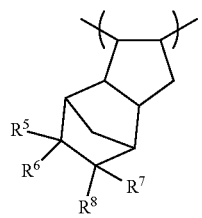
(a2)

wherein $R^1$ to $R^4$ and $R^5$ to $R^8$ are each independently hydrogen, cyano group, straight, branched or cyclic $C_1$-$C_6$ alkyl group, alkoxycarbonyl group, or ether or lactone ring-bearing group, at least one of $R^1$ to $R^4$ and $R^5$ to $R^8$ has an acid labile group-substituted hydroxyl group, m is 0 or 1, the subscripts a1 and a2 are numbers in the range: 0≤a1<1.0, 0≤a2<1.0, and 0<a1+a2<1.0, said polymer being dissolvable in a developer selected from the group consisting of 2-octanone, 2-nonanone, 2-heptanone, 3-heptanone, 4-heptanone, 2-hexanone, 3-hexanone, diisobutyl ketone, methylcyclohexanone, acetophenone, methylacetophenone, propyl acetate, butyl acetate, isobutyl acetate, amyl acetate, isoamyl acetate, butenyl acetate, phenyl acetate, propyl formate, butyl formate, isobutyl formate, amyl formate, isoamyl formate, methyl valerate, methyl pentenoate, methyl crotonate, ethyl crotonate, methyl lactate, ethyl lactate, propyl lactate, butyl lactate, isobutyl lactate, amyl lactate, isoamyl lactate, methyl 2-hydroxyisobutyrate, ethyl 2-hydroxyisobutyrate, methyl benzoate, ethyl benzoate, benzyl acetate, methyl phenylacetate, benzyl formate, phenylethyl formate, methyl 3-phenylpropionate, benzyl propionate, ethyl phenylacetate, and 2-phenylethyl acetate.

2. The resist composition of claim 1 wherein the acid generator comprises an acid generator capable of generating a sulfonic acid fluorinated at alpha-position, imide acid or methide acid, and a sulfonate of a sulfonic acid non-fluorinated at alpha-position or an optionally fluorinated carboxylic acid.

3. A negative pattern-forming resist composition comprising a polymer, an acid generator, and an organic solvent,
said polymer consisting of recurring units (a1) and/or (a2) having a hydroxyl group substituted with an acid labile group, represented by the general formula (1), recurring units (b) derived from a monomer having an adhesive group selected from the class consisting of hydroxyl, cyano, carbonyl, ester, ether, sulfonic acid ester, lactone ring, carboxyl, carboxylic anhydride, carbonate, and maleimide, and recurring units (c1) having a carboxyl group substituted with an acid labile group, represented by the following general formula, and/or recurring units (c2) having a hydroxyl group substituted with an acid labile group, other than the recurring units (a1) and (a2), (1)

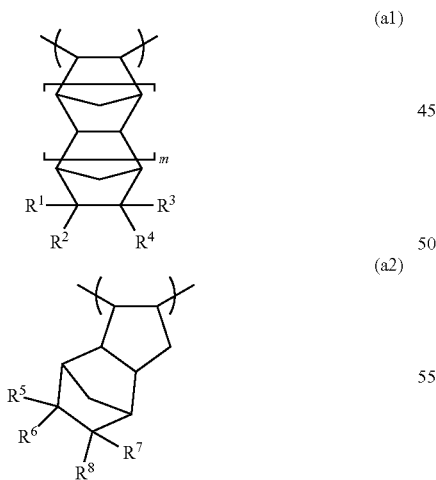

(a1)

(a2)

wherein $R^1$ to $R^4$ and $R^5$ to $R^8$ are each Independently hydrogen, cyano group, straight, branched or cyclic $C_1$-$C_6$ alkyl group, alkoxycarbonyl group, or ether or lactone ring-bearing group, at least one of $R^1$ to $R^4$ and $R^5$ to $R^8$ has an acid labile group-substituted hydroxyl group, m is 0 or 1, the subscripts a1 and a2 are numbers in the range: $0 \leq a1 < 1.0$, $0 \leq a2 < 1.0$, and $0 < a1+a2 < 1.0$,

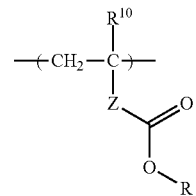

(c1)

wherein $R^{10}$ is hydrogen or methyl, R is an acid labile group, Z is a single bond or —C(=O)—O—$R^{11}$—, and $R^{11}$ is a straight, branched or cyclic $C_1$-$C_{10}$ alkylene group which may have an ether, ester, lactone ring, or hydroxyl radical, or naphthylene group,
said polymer being dissolvable in a developer selected from the group consisting of 2-octanone, 2-nonanone, 2-heptanone, 3-heptanone, 4-heptanone, 2-hexanone, 3-hexanone, diisobutyl ketone, methylcyclohexanone, acetophenone, methylacetophenone, propyl acetate, butyl acetate, isobutyl acetate, amyl acetate, isoamyl acetate butenyl acetate, phenyl acetate, propyl formate, butyl formate, isobutyl formate, amyl formate, isoamyl formate, methyl valerate, methyl pentenoate, methyl crotonate, ethyl crotonate, methyl lactate, ethyl lactate, propyl lactate, butyl lactate, isobutyl lactate, amyl lactate, isoamyl lactate, methyl 2-hydroxyisobutyrate, ethyl 2-hydroxyisobutyrate, methyl benzoate, ethyl benzoate, benzyl acetate, methyl phenylacetate, benzyl formate, phenylethyl formate, methyl 3-phenylpropionate, benzyl propionate, ethyl phenylacetate, and 2-phenylethyl acetate.

4. The resist composition of claim 3 wherein the acid generator comprises an acid generator capable of generating a sulfonic acid fluorinated at alpha-position, imide acid or methide acid, and a sulfonate of a sulfonic acid non-fluorinated at alpha-position or an optionally fluorinated carboxylic acid.

5. A negative pattern-forming resist composition comprising a polymer, and an organic solvent,
said polymer consisting of recurring units (a1) and/or (a2) having a hydroxyl group substituted with an acid labile group, represented by the general formula (1), recurring units (b) derived from a monomer having an adhesive group selected from the class consisting of hydroxyl, cyano, carbonyl, ester, ether, sulfonic acid ester, lactone ring, carboxyl, carboxylic anhydride, carbonate, and malelmide, recurring units (c1) having a carboxyl group substituted with an acid labile group, represented by the following general formula, and/or recurring units (c2) having a hydroxyl group substituted with an acid labile group, other than the recurring units (a1) and (a2), and any of recurring units (d1) to (d3) having a sulfonium salt, as represented by the general formulae, (1)

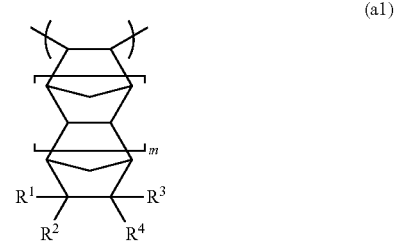

(a1)

-continued (a2)
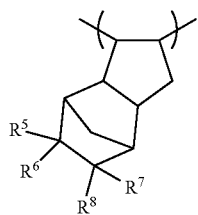

wherein $R^1$ to $R^4$ and $R^5$ to $R^8$ are each independently hydrogen, cyano group, straight, branched or cyclic $C_1$-$C_6$ alkyl group, alkoxycarbonyl group, or ether or lactone ring-bearing group, at least one of $R^1$ to $R^4$ and $R^5$ to $R^8$ has an acid labile group-substituted hydroxyl group, m is 0 or 1, the subscripts a1 and a2 are numbers in the range $0 \leq a1 < 1.0$, $0 \leq a2 < 1.0$, and $0 < a1+a2 < 1.0$, (c1)
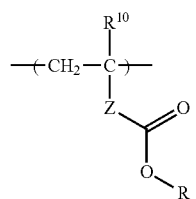

wherein $R^{10}$ is hydrogen or methyl, R is an acid labile group, Z is a single bond or —C(=O)—O—$R^{11}$—, and $R^{11}$ is a straight, branched or cyclic $C_1$-$C_{10}$ alkylene group which may have an ether, ester, lactone ring, or hydroxyl radical, or naphthylene group, (d1)(d2)
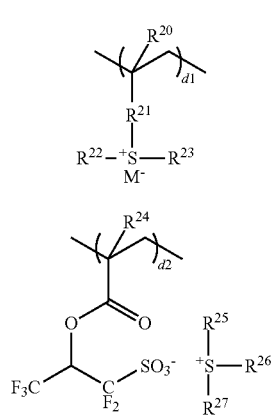

(d3)
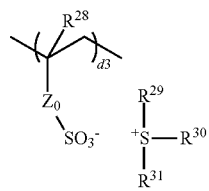

wherein $R^{20}$, $R^{24}$, and $R^{28}$ each are hydrogen or methyl, $R^{21}$ is a single bond, phenylene, —O—$R^{33}$—, or —C(=O)—Y—$R^{33}$— wherein Y is oxygen or NH, and $R^{33}$ is a straight, branched or cyclic $C_1$-$C_6$ alkylene group, alkenylene or phenylene group, which may contain a carbonyl (—CO—), ester (—COO—), ether (—O—) or hydroxyl radical, $R^{22}$, $R^{23}$, $R^{25}$, $R^{26}$, $R^{27}$, $R^{29}$, $R^{30}$, and $R^{31}$ are each independently a straight, branched or cyclic $C_1$-$C_{12}$ alkyl group which may contain a carbonyl, ester or ether radical, or a $C_6$-$C_{12}$ aryl, $C_7$-$C_{20}$, aralkyl, or thiophenyl group, $Z_0$ is a single bond, methylene, ethylene, phenylene, fluorophenylene, —O—$R^{32}$—, or —C(=O)—Z—$R^{32}$—, wherein $Z_1$ is oxygen or NH, and $R^{32}$ is a straight, branched or cyclic $C_1$-$C_6$ alkylene group, alkenylene or phenylene group, which may contain a carbonyl, ester, ether or hydroxyl radical, $M^-$ is a non-nucleophilic counter ion, the subscripts d1, d2 and d3 are in the range: $0 \leq d1 \leq 0.3$, $0 \leq d2 \leq 0.3$, $0 \leq d3 \leq 0.3$, and $0 < d1+d2+d3 < 0.3$, said polymer being dissolvable in a developer selected from the group consisting of 2-octanone, 2-nonanone, 2-heptanone, 3-heptanone, 4-heptanone, 2-hexanone, 3-hexanone, diisobutyl ketone, methylcyclohexanone, acetophenone, methylacetophenone, propyl acetate, butyl acetate, isobutyl acetate, amyl acetate, isoamyl acetate butenyl acetate, phenyl acetate, propyl formate, butyl foxmate, isobutyl formate, amyl formate, isoamyl formate, methyl valerate, methyl pentenoate, methyl crotonate, ethyl crotonate, methyl lactate, ethyl lactate, propyl lactate, butyl lactate, isobutyl lactate, amyl lactate, isoamyl lactate, methyl 2-hydroxyisobutyrate, ethyl 2-hydroxyisobutyrate, methyl benzoate, ethyl benzoate, benzyl acetate, methyl phenylacetate, benzyl formate, phenylethyl formate, methyl 3-phenylpropionate, benzyl propionate, ethyl phenylacetate, and 2-phenylethyl acetate.

* * * * *